US010911038B1

(12) United States Patent
Stark et al.

(10) Patent No.: US 10,911,038 B1
(45) Date of Patent: Feb. 2, 2021

(54) CONFIGURATION MESH DATA BUS AND TRANSACTIONAL MEMORIES IN A MULTI-PROCESSOR INTEGRATED CIRCUIT

(71) Applicant: Netronome Systems, Inc., Santa Clara, CA (US)

(72) Inventors: Gavin J. Stark, Cambridge (GB); Steven W. Zagorianakos, Merrimack, NH (US); Ronald N. Fortino, North Andover, MA (US)

(73) Assignee: Netronome Systems, Inc., Santa Clara, CA (US)

( * ) Notice: Subject to any disclaimer, the term of this patent is extended or adjusted under 35 U.S.C. 154(b) by 0 days.

(21) Appl. No.: 16/247,566

(22) Filed: Jan. 15, 2019

Related U.S. Application Data

(63) Continuation of application No. 15/874,860, filed on Jan. 18, 2018, now Pat. No. 10,659,030, which is a continuation of application No. 14/556,135, filed on Nov. 29, 2014, now Pat. No. 9,899,996, which is a continuation of application No. 13/552,555, filed on Jul. 18, 2012, now Pat. No. 8,902,902.

(51) Int. Cl.
*H03K 17/00* (2006.01)
*G06F 13/40* (2006.01)
*G06F 9/46* (2006.01)

(52) U.S. Cl.
CPC ............. *H03K 17/00* (2013.01); *G06F 9/467* (2013.01); *G06F 13/40* (2013.01)

(58) Field of Classification Search
CPC .......... H03K 17/00; G06F 9/467; G06F 13/40
See application file for complete search history.

(56) References Cited

U.S. PATENT DOCUMENTS

| 4,162,535 A | 7/1979 | Anderson ..................... 340/2.26 |
| 4,198,546 A | 4/1980 | Schlichte ...................... 370/380 |
| 4,794,590 A | 12/1988 | Yano ............................. 370/400 |

(Continued)

OTHER PUBLICATIONS

NFP-3200 Network Flow Processor, Netronome Systems Inc., 3 pages (Dec. 2010).

(Continued)

*Primary Examiner* — Nimesh G Patel
(74) *Attorney, Agent, or Firm* — Imperium Patent Works LLP; T. Lester Wallace; Mark D. Marrello

(57) ABSTRACT

A network flow processor integrated circuit includes a plurality of processors, a plurality of multi-threaded transactional memories (MTMs), and a configurable mesh posted transaction data bus. The configurable mesh posted transaction data bus includes a configurable command mesh and a configurable data mesh. Each of these configurable meshes includes crossbar switches and interconnecting links. A command bus transaction value issued by a processor can pass across the command mesh to an MTM. The command bus transaction bus value includes a reference value. The MTM uses the reference value to pull data across the configurable data mesh into the MTM. The MTM then uses the data to carry out the commanded transactional memory operation. Multiple such commands can pass across the posted transaction bus across different parts of the integrated circuit at the same time, and a single MTM can be carrying out multiple such operations at the same time.

20 Claims, 52 Drawing Sheets

(56) References Cited

U.S. PATENT DOCUMENTS

| | | | |
|---|---|---|---|
| 4,864,560 A | 9/1989 | Quinquis | 370/413 |
| 4,914,429 A | 4/1990 | Upp | 340/2.22 |
| 4,922,485 A | 5/1990 | Quinquis et al. | 370/418 |
| 4,965,792 A | 10/1990 | Yano | 370/445 |
| 4,967,405 A | 10/1990 | Upp et al. | 398/50 |
| 5,031,094 A | 7/1991 | Toegel et al. | 710/316 |
| 5,128,871 A | 7/1992 | Schmitz | 716/102 |
| 5,299,190 A | 3/1994 | LaMaire et al. | 370/413 |
| 5,377,182 A | 12/1994 | Monacos | 370/219 |
| 5,420,811 A | 5/1995 | Ohki | 708/402 |
| 5,493,573 A | 2/1996 | Kobayashi | 370/236 |
| 5,577,262 A | 11/1996 | Pechanek | 712/11 |
| 5,586,111 A | 12/1996 | Wise | 370/241 |
| 5,630,154 A | 5/1997 | Bolstad et al. | 712/19 |
| 5,682,491 A | 10/1997 | Pechanek et al. | 712/209 |
| 5,842,034 A | 11/1998 | Bolstad et al. | 712/11 |
| 5,894,565 A | 4/1999 | Furtek et al. | 326/38 |
| 5,974,487 A | 10/1999 | Hartmann | 710/100 |
| 5,986,572 A | 11/1999 | Parker et al. | 370/220 |
| 6,144,983 A | 11/2000 | Klots et al. | 718/104 |
| 6,578,131 B1 | 6/2003 | Larson et al. | 711/216 |
| 6,675,171 B2 | 1/2004 | Tikkanen et al. | 707/101 |
| 6,691,171 B1 | 2/2004 | Liao | 709/245 |
| 6,772,269 B1 | 8/2004 | Kaganoi | 710/310 |
| 6,804,200 B1 | 10/2004 | Jennings et al. | 370/388 |
| 6,804,230 B1 | 10/2004 | Jennings et al. | 370/388 |
| 6,691,131 B2 | 11/2004 | Tikkanen et al. | |
| 6,859,455 B1 | 2/2005 | Yazdani et al. | 370/392 |
| 7,000,070 B2 | 2/2006 | Moriwaki et al. | 711/114 |
| 7,042,884 B2 | 5/2006 | Huang et al. | 370/395.54 |
| 7,212,531 B1 | 5/2007 | Kopelman et al. | 370/392 |
| 7,263,097 B1 | 8/2007 | Ornes et al. | 370/386 |
| 7,443,794 B2 | 10/2008 | George et al. | 370/231 |
| 7,446,681 B2 | 11/2008 | Gunther | 341/106 |
| 7,461,236 B1 | 12/2008 | Wentzlaff | 712/10 |
| 7,539,153 B1 | 5/2009 | Liang et al. | 370/255 |
| 7,539,845 B1 | 5/2009 | Wentzlaff et al. | 712/10 |
| 7,577,816 B2 | 8/2009 | Sheets et al. | 711/206 |
| 7,577,820 B1 | 8/2009 | Wentzlaff et al. | 712/10 |
| 7,613,189 B1 | 11/2009 | Kopelman et al. | 370/392 |
| 7,620,736 B2 | 11/2009 | Westfall | 709/249 |
| 7,782,853 B2 | 8/2010 | Huang et al. | 370/392 |
| 7,793,032 B2 | 9/2010 | Engle et al. | 710/316 |
| 7,793,074 B1 | 9/2010 | Wentzlaff et al. | 712/10 |
| 7,809,916 B1 | 10/2010 | Shavit et al. | 711/170 |
| 7,865,695 B2 | 1/2011 | Yancey et al. | 712/11 |
| 7,958,341 B1 | 6/2011 | Cismas et al. | 712/225 |
| 7,991,983 B2 | 8/2011 | Wolrich et al. | 712/228 |
| 8,018,944 B1 | 9/2011 | Kopelman et al. | 370/392 |
| 8,045,546 B1 | 10/2011 | Bao et al. | 370/386 |
| 8,051,238 B2 | 11/2011 | Rhee | 710/316 |
| 8,150,891 B2 | 4/2012 | Luk et al. | 707/802 |
| 8,295,381 B2 | 10/2012 | Mohammed et al. | 375/267 |
| 8,538,999 B2 | 9/2013 | Luk et al. | 707/802 |
| 8,549,249 B1 | 10/2013 | Metcalf et al. | 711/166 |
| 8,631,043 B2 | 1/2014 | Hao et al. | 707/797 |
| 8,762,920 B2 | 6/2014 | Darnell et al. | 716/126 |
| 8,775,727 B2 | 7/2014 | Baryudin et al. | 711/108 |
| 9,208,081 B1* | 12/2015 | Dice | G06F 12/0269 |
| 9,208,281 B2 | 12/2015 | Vujkovic et al. | |
| 2002/0194444 A1 | 12/2002 | Goodrich et al. | 711/167 |
| 2003/0058845 A1 | 3/2003 | Tierling | 370/357 |
| 2004/0054880 A1 | 3/2004 | Bernstein et al. | 712/245 |
| 2004/0095948 A1 | 5/2004 | Lin | 370/412 |
| 2004/0103218 A1 | 5/2004 | Blumrich et al. | 709/249 |
| 2004/0111395 A1 | 6/2004 | Rajgopal | |
| 2004/0184448 A1 | 9/2004 | Beshai | 370/360 |
| 2005/0041342 A1 | 2/2005 | Robinson | 370/352 |
| 2005/0041654 A1 | 2/2005 | Lee | 370/386 |
| 2005/0174271 A1 | 8/2005 | Carley | 341/100 |
| 2006/0067218 A1 | 3/2006 | Clermidy et al. | 370/230 |
| 2006/0077914 A1 | 4/2006 | Rhee | 370/293 |
| 2006/0101159 A1 | 5/2006 | Yeh et al. | 709/246 |
| 2006/0112206 A1 | 5/2006 | Lakshmanamurthy | 710/110 |
| 2006/0253606 A1 | 11/2006 | Okuno | 709/238 |
| 2007/0011223 A1 | 1/2007 | Calvignac et al. | 709/200 |
| 2007/0147362 A1 | 6/2007 | Beshai et al. | 370/388 |
| 2007/0240091 A1 | 10/2007 | Vujkovic et al. | 716/113 |
| 2007/0290333 A1 | 12/2007 | Saini et al. | 257/723 |
| 2008/0250225 A1 | 10/2008 | Chester | 712/15 |
| 2008/0270748 A1 | 10/2008 | Crouse et al. | 712/20 |
| 2008/0288726 A1* | 11/2008 | Heller, Jr. | G06F 9/3004 711/147 |
| 2008/0288819 A1* | 11/2008 | Heller, Jr. | G06F 9/30087 714/19 |
| 2008/0317025 A1 | 12/2008 | Manula et al. | 370/389 |
| 2009/0193384 A1 | 7/2009 | Sima et al. | 716/128 |
| 2009/0276599 A1 | 11/2009 | Kulkarni et al. | 711/170 |
| 2010/0128734 A1 | 5/2010 | Beshai | 370/401 |
| 2010/0131953 A1* | 5/2010 | Dice | G06F 9/467 718/101 |
| 2010/0332471 A1 | 12/2010 | Cypher | 707/736 |
| 2011/0090905 A1 | 4/2011 | Mueller et al. | 370/360 |
| 2011/0128960 A1 | 6/2011 | Bando et al. | 370/392 |
| 2011/0137930 A1 | 6/2011 | Hao et al. | 707/769 |
| 2011/0219208 A1 | 9/2011 | Asaad et al. | 712/12 |
| 2011/0289253 A1 | 11/2011 | Mangano et al. | 710/310 |
| 2011/0320725 A1 | 12/2011 | Berger et al. | 711/127 |
| 2012/0078990 A1 | 3/2012 | Lee et al. | 708/402 |
| 2012/0239702 A1 | 9/2012 | Luk et al. | 707/797 |
| 2012/0275463 A1 | 11/2012 | Beshai | 370/401 |
| 2013/0215792 A1 | 8/2013 | Stark | 370/257 |
| 2013/0215899 A1 | 8/2013 | Stark et al. | 370/394 |
| 2013/0219102 A1 | 8/2013 | Stark et al. | 710/316 |
| 2013/0219103 A1* | 8/2013 | Stark | G06F 13/36 710/317 |
| 2013/0326153 A1* | 12/2013 | Rozas | G06F 9/3009 711/141 |
| 2014/0025918 A1 | 1/2014 | Stark et al. | 711/206 |
| 2014/0025919 A1 | 1/2014 | Stark | 711/206 |
| 2014/0025920 A1 | 1/2014 | Stark et al. | 711/206 |
| 2014/0068109 A1 | 3/2014 | Stark | 710/5 |
| 2014/0068174 A1 | 3/2014 | Stark | 711/108 |

OTHER PUBLICATIONS

Tilera (RAW) Processor, Powerpoint Presentation, by Mars et al., 24 pages (Mar. 2011).
IP-Address Lookup Using LC-Tries, by Nilsson et al., IEEE Journal on Selected Areas in Communications, vol. 17, No. 6, pp. 1083-1092 (Jun. 1999).
Pipelined Architecture for Fast IP Lookup, by Zhao et al., High Performance Switching and Routing 2005, HPSR, 2005 Workshop, pp. 118-122 (May 2005).
Next Hop Storage and Retrieval for Coded and Scalar IP Prefix Trees, by Alaei et al., 2011 International Symposium on Computer Networks and Distributed Systems (CNDS), pp. 90, 95 (Feb. 23-24, 2011).
Priority Tries for IP Address Lookup, by Lim et al., IEEE Transactions on Computers, vol. 59, No. 6, pp. 784-794 (Jun. 2010).
Multiprefix Trie: A New Data Structure for Designing Dynamic Router-Tables, by Hsieh et al., IEEE Transactions on Computers, vol. 60, No. 5 (May 2011).
Intel IXP2800 Hardware Reference Manual, by Intel Corporation, pp. 1-430 (Aug. 2004).
Netronome Network Flow Processor 3200 Preliminary Datasheet, pp. 1-151 (Jul. 2008).
Intel Architecture Software Developer's Manual vol. 2: Instruction Set Reference, Intel Corporation, pp. 3-3 to 3-4 and 3-23 to 3-29 (1999).
2010 Dictionary.com, Definition of "Register", pp. 1-7, downloaded Dec. 19, 2015 (Copyright 2015).
U.S. Appl. No. 13/399,324, Stark, filed Feb. 17, 2012.
U.S. Appl. No. 15/463,857, Stark, filed Mar. 20, 2017.
U.S. Appl. No. 13/399,433, Stark, filed Feb. 17, 2012.
U.S. Appl. No. 14/556,147, Stark, filed Nov. 29, 2014.
U.S. Appl. No. 13/399,846, Stark, et al., filed Feb. 17, 2012.
U.S. Appl. No. 14/724,820, Stark, et al., filed May 15, 2018.
U.S. Appl. No. 13/399,888, Stark, et al., filed Feb. 17, 2012.
U.S. Appl. No. 13/399,915, Stark, et al., filed Feb. 17, 2012.

(56) References Cited

OTHER PUBLICATIONS

U.S. Appl. No. 13/399,958, Stark, et al., filed Feb. 17, 2012.
U.S. Appl. No. 13/399,613, Stark, filed Feb. 17, 2012.
U.S. Appl. No. 13/399,678, Stark, filed Feb. 17, 2012.
U.S. Appl. No. 13/399,983, Stark, et al., filed Feb. 17, 2012.
U.S. Appl. No. 13/400,008, Stark, et al., filed Feb. 17, 2012.
U.S. Appl. No. 14/588,084, Stark, et al., filed Dec. 31, 2014.
U.S. Appl. No. 13/609,039, Stark. et al., filed Sep. 10, 2012.
U.S. Appl. No. 14/841,300, Stark, et al., filed Aug. 31, 2015.
U.S. Appl. No. 13/522,537, Stark, et al., filed Jul. 18, 2012.
U.S. Appl. No. 13/522,555, Stark, et al., filed Jul. 18, 2012.
U.S. Appl. No. 14/556,135, Stark, et al., filed Nov. 29, 2014.
U.S. Appl. No. 15/874,860, Stark, et al., filed Jan. 18, 2018.
U.S. Appl. No. 13/552,605, Stark, et al., filed Jul. 18, 2012.
U.S. Appl. No. 13/552,619, Stark, filed Jul. 18, 2012.
U.S. Appl. No. 14/724,824, Stark, filed May 29, 2015.
U.S. Appl. No. 13/552,627, Stark, et al., filed Jul. 18, 2012.
U.S. Appl. No. 13/598,448, Stark, filed Aug. 29, 2012.
U.S. Appl. No. 13/598,533, Stark, filed Aug. 29, 2012.
U.S. Appl. No. 14/287,012, Stark, filed May 27, 2014.
U.S. Appl. No. 14/724,826, Stark, filed May 29, 2015.
U.S. Appl. No. 13/675,259, Stark, filed Nov. 13, 2012.
U.S. Appl. No. 13/675,309, Stark, filed Nov. 13, 2012.
U.S. Appl. No. 14/631,748, Stark, filed Feb. 25, 2015.
U.S. Appl. No. 13/675,353, Stark, filed Nov. 13, 2012.
U.S. Appl. No. 14/588,280, Stark, filed Dec. 31, 2014.
U.S. Appl. No. 13/675,394, Stark, filed Nov. 13, 2012.
U.S. Appl. No. 14/588,342, Stark, filed Dec. 31, 2014.
U.S. Appl. No. 13/675,453, Stark, et al., filed Nov. 13, 2012.
U.S. Appl. No. 13/675,620, Stark, et al., filed Nov. 13, 2012.
U.S. Appl. No. 14/690,362, Stark, et al., filed Apr. 17, 2015.
U.S. Appl. No. 13/668,251, Stark, et al., filed Nov. 31, 2012.
U.S. Appl. No. 13/690,195, Neugebauer, et al., filed Nov. 30, 2012.
U.S. Appl. No. 14/537,514, Neugebauer, et al., filed Nov. 10, 2014.

* cited by examiner

MPLS ROUTER

IBNFP INTEGRATED CIRCUIT

MANHATTAN-PATTERN ISLANDS

MANHATTAN-PATTERN ISLAND

STAGGERED-PATTERN ISLANDS WITH
STAR-SHAPED HALF-LINK STRUCTURE

STAGGERED-PATTERN ISLAND

DATA BUS (COMMAND MESH, PULL-ID MESH, DATA0 MESH, DATA1 MESH)

CONTROL BUS

EVENT BUS

ISLAND HAVING 8-WAY CB AND 8 PORTS

LOOK UP TABLE (LUT)

LINK BETWEEN TWO CROSSBAR SWITCHES

THE FOUR MESHES OF THE
CONFIGURABLE MESH DATA BUS

WRITE OPERATION

READ OPERATION

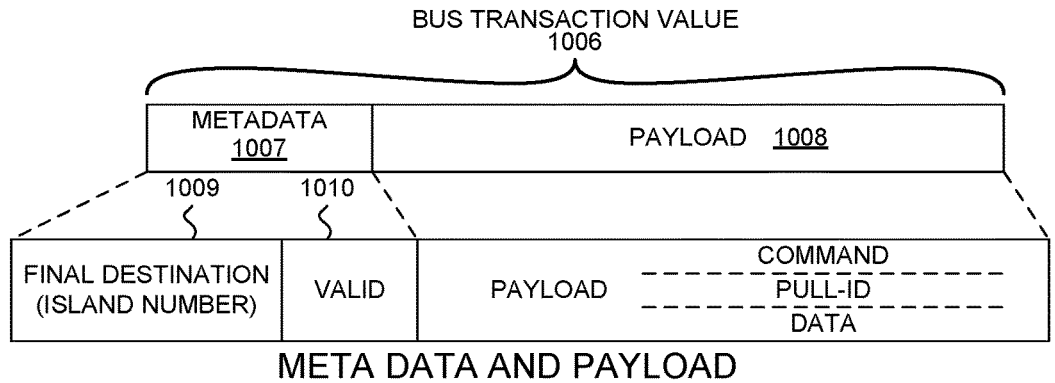

META DATA AND PAYLOAD

FIG. 18

| FIELD | WIDTH | DESCRIPTION |
|---|---|---|
| TARGET | 4 | CPP TARGET FOR THE COMMAND. |
| ACTION | 5 | ACTION RECOGNIZED BY THE CPP TARGET INDICATING WHAT SHOULD BE PERFORMED. |
| TOKEN | 2 | SUBTYPE OF ACTION RECOGNIZED BY THE CPP TARGET, INDICATING THE FLAVOR OF THE COMMAND. |
| LENGTH | 5 | LENGTH OF THE COMMAND, DEPENDENT ON THE ACTION/TOKEN, INTERPRETED BY THE CPP TARGET. |
| ADDRESS | 40 | ADDRESS THAT THE COMMAND SHOULD OPERATE ON. |
| BYTE_MASK | 8 | FURTHER OPTIONS OF A COMMAND (A BYTE MASK). |
| DATA_MASTER_ISLAND | 6 | ISLAND OF DATA MASTER TO PULL/PUSH DATA FROM/TO. |
| DATA_MASTER | 4 | PUSH/PULL-ID WITHIN THE ISLAND OF DATA MASTER TO PULL/PUSH DATA FROM/TO. |
| DATA_REF | 14 | REFERENCE INDICATING TO THE DATA MASTER WHERE TO PUSH/PULL FROM. |
| SIGNAL_MASTER | 10 | EXTENSION FOR DATA_REF AS A DATA MASTER ONLY; FOR OTHER MASTERS INDICATING WHICH MASTER WITHIN THE DATA MASTER'S ISLAND SHOULD BE SIGNALED FOR THE COMMAND. |
| SIGNAL_REF | 7 | REFERENCE WITHIN THE SIGNAL MASTER AS TO WHEN SIGNAL SHOULD BE INDICATED WITH THE COMMANDS PULL OR PUSH. |

COMMAND PAYLOAD

FIG. 19

| FIELD | WIDTH | DESCRIPTION |
|---|---|---|
| TARGET_ISLAND | 6 | ISLAND TO RETURN PULL DATA TO. |
| TARGET_PORT | 2 | IDENTIFIES THE SUB-CIRCUIT IN THE FINAL DESTINATION ISLAND THAT IS THE TARGET (OF A MULTI-TARGET ISLAND). |
| TARGET_REF | 14 | TARGET SPECIFIC REFERENCE; RETURNED WITH PULL DATA. |
| DATA_MASTER | 4 | PULL-ID WITHIN THE ISLAND OF DATA MASTER TO PULL DATA FROM. |
| DATA_REF | 14 | REFERENCE WITHIN THE DATA MASTER AS TO WHERE TO PULL FROM; NORMALLY COPIED FROM THE INVOKING COMMAND. |
| SIGNAL_MASTER | 8 | EXTENSION FOR DATA_REF AS A DATA MASTER ONLY; FOR OTHER MASTERS INDICATING WHICH MASTER WITHIN THE DATA MASTER'S ISLAND SHOULD BE SIGNALED WHEN THE LAST DATA IS PULLED. |
| SIGNAL_REF | 7 | REFERENCE USABLE BY THE MASTER TO DETERMINE WHICH SIGNAL SHOULD BE INDICATED WITH THE LAST PULL DATA. |
| LENGTH | 5 | NUMBER OF 64-BIT DATA WORDS TO PULL FROM THE DATA MASTER, STARTING AT THE SPECIFIED DATA_REF. |

PULL-ID PAYLOAD

FIG. 20

| FIELD | WIDTH | DESCRIPTION |
|---|---|---|
| DATA_IS_PULL | 1 | ASSERTED FOR PULL DATA. |
| DATA_MASTER_OR_TARGET_PORT | 4 | DATA MASTER FOR PUSH DATA OR TARGET PORT FOR PULL DATA. |
| DATA_OR_TARGET_REF | 14 | DATA REF FOR PUSH DATA OR TARGET REF FOR PULL DATA. |
| SIGNAL_MASTER | 8 | ONLY USED FOR PUSH DATA; MASTER IN ISLAND TO SIGNAL IF DATA_MASTER IS NOT CTM; EXTENSION OF DATA_REF FOR DATA_MASTER OF CTM. |
| SIGNAL_REF_OR_CYCLE | 7 | SIGNAL_REF FOR PUSH DATA OR CYCLE FOR PULL DATA. |
| LAST | 1 | ASSERTED WITH THE LAST WORD OF DATA FOR PULL OR PUSH DATA. |
| DATA | 64 | 64-BITS OF PULL/PUSH DATA. |
| DATA_ERROR | 2 | ONE BIT PER 32-BITS OF DATA TO INDICATE AN UNCORRECTABLE ERROR. |
| DATA_VALID | 2 | ONE BIT PER 32-BITS OF DATA TO INDICATE, ON PUSH, THAT THE DATA IS TO BE WRITTEN TO THE DATA_MASTER. |
| NO_SPLIT | 1 | FOR PUSH DATA ONLY, ASSERTED FOR SIGNALING TO INDICATE THAT BOTH SIGNAL_REF AND SIGNAL_REF1 ARE TO BE INDICATED TO THE SIGNALED MASTER. |

DATA PAYLOAD

FIG. 21

| FIELD | WIDTH | DESCRIPTION |
|---|---|---|
| DATA_IS_PULL | 1 | ASSERTED FOR PULL DATA. |
| TARGET_PORT | 2 | IDENTIFIES THE SUB-CIRCUIT IN THE FINAL DESTINATION ISLAND THAT IS THE TARGET (OF A MULTI-TARGET ISLAND). |
| TARGET_REF | 14 | TARGET SPECIFIC REFERENCE, RETURNED WITH PULL DATA. |
| CYCLE-OF_PULL | 7 | CYCLE OF PULL DATA. |
| LAST | 1 | ASSERTED WITH THE LAST WORD OF PULL DATA. |
| DATA | 64 | 64-BITS OF PULLED DATA FROM THE DATA MASTER. |
| DATA_ERROR | 2 | ONE BIT PER 32-BITS OF PULLED DATA TO INDICATE AN UNCORRECTABLE ERROR FROM THE DATA_MASTER DATA SOURCE. |

DATA PAYLOAD (FOR A PULL)

FIG. 22

| FIELD | WIDTH | DESCRIPTION |
|---|---|---|
| DATA_IS_PULL | 1 | DEASSERTED FOR PUSH DATA. |
| DATA_MASTER | 4 | PUSH ID WITHIN THE ISLAND OF DATA MASTER THE DATA IS DESTINED FOR. |
| DATA_REF | 14 | REFERENCE WITHIN DATA MASTER AS TO WHERE TO PUSH FROM. |
| SIGNAL_MASTER | 8 | FOR CTM AS A DATA MASTER ONLY THIS IS AN EXTENSION FOR DATA_REF; FOR OTHER MASTERS INDICATING WHICH MASTER WITHIN THE DATA MASTER'S ISLAND SHOULD BE SIGNALED WHEN THE LAST DATA IS PUSHED. |
| SIGNAL_REF | 7 | REFERENCE WITHIN THE SIGNAL MASTER AS TO WHICH SIGNAL SHOULD BE INDICATED WITH THE LAST PUSH DATA. |
| LAST | 1 | ASSERTED WITH THE LAST WORD OF PUSH DATA. |
| DATA | 64 | 64-BITS OF PUSH DATA FROM THE DATA MASTER. |
| DATA_ERROR | 2 | ONE BIT PER 32-BITS OF PUSHED DATA TO INDICATE AN UNCORRECTABLE ERROR FROM THE DATA_MASTER DATA SOURCE. |
| DATA_VALID | 2 | ONE BIT PER 32-BITS OF DATA TO INDICATE THAT THE DATA IS TO BE WRITTEN TO THE DATA_MASTER. |
| NO_SPLIT | 1 | ASSERTED FOR SIGNALING TO INDICATE THAT BOTH SIGNAL_REF AND SIGNAL_REF1 ARE TO BE INDICATED TO THE SIGNALED MASTER. |

DATA PAYLOAD (FOR A PUSH)

FIG. 23

CONFIGURABLE MESH
CONTROL BUS STRUCTURE

CONFIGURABLE
MESH DATA BUS

CONFIGURABLE
MESH CONTROL BUS

CONFIGURABLE MESH
EVENT BUS

CONFIGURED CONFIGURABLE MESH CONTROL BUS

CONFIGURABLE MESH EVENT BUS

PERSPECTIVE VIEW OF LOCAL EVENT RING
WITHIN NBI ISLAND

RUN TIME CONFIGURABLE
SWITCH CIRCUIT

EVENT RING CIRCUIT

EVENT RING CIRCUIT WITH GLOBAL EVENT FILTER

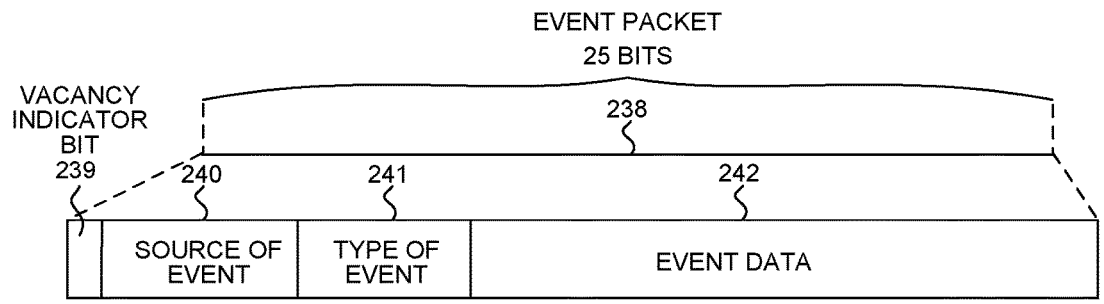

EVENT PACKET BIT SEQUENCE
FIG. 38A

| FIELD | WIDTH | DESCRIPTION |
|---|---|---|
| VACANCY INDICATOR | 1 | REFERENCE BIT THAT INDICATES WHETHER THE SEGMENT ON THE LOCAL EVENT RING IS VACANT OR OCCUPIED. (0 = EVENT PACKET PRESENT, 1 = VACANT) |
| SOURCE OF EVENT | 8 | ADDRESS OF THE EVENT RING CIRCUIT THAT INSERTED THE EVENT PACKET INTO THE LOCAL EVENT RING. |
| TYPE OF EVENT | 4 | A FIELD THAT MAY INDICATE IF THE EVENT PACKET SHOULD BE INSERTED IN THE GLOBAL EVENT CHAIN. |
| EVENT DATA | 12 | INFORMATION REGARDING THE EVENT. |

EVENT PACKET TABLE
FIG. 38B

CONFIGURED CONFIGURABLE
MESH EVENT BUS

SOURCE-RELEASE RING

LOCAL EVENT RING AND GLOBAL
EVENT CHAIN SYSTEM

EVENT MANAGER

MAC ISLAND
(INGRESS)

TRANSFERRED OVER MINIPACKET BUS

NBI ISLAND
(INGRESS)

| WIDTH | DESCRIPTION |
|---|---|
| 6-BITS | BUFFER POOL NUMBER TO USE |
| 32-BITS | SEQUENCE NUMBER IN A FLOW (USABLE TO ORDER PACKETS TO BE SENT OUT IB-NFP) |
| ~100-BITS | USER METADATA (A CODE INDICATIVE OF PACKET TYPE)<br>- ONE BIT INDICATES WHETHER THE PACKET IS AN EXCEPTION PACKET OR A FAST PATH PACKET |

PRECLASSIFICATION RESULTS

| WIDTH | DESCRIPTION |
|---|---|
| 32-BITS | ADDRESS INFO INDICATING WHERE THE HEADER PORTION IS STORED. |
| 32-BITS | ADDRESS INFO INDICATING WHERE THE PAYLOAD PORTION IS STORED. |
| 16-BITS | PACKET LENGTH. |
| 32-BITS | SEQUENCE NUMBER OF THE PACKET IN THE FLOW. |
| ~100-BITS | USER METADATA (A CODE INDICATIVE OF PACKET TYPE)<br>- ONE BIT INDICATES WHETHER THE PACKET IS AN EXCEPTION PACKET OR A FAST PATH PACKET |

INGRESS PACKET DESCRIPTOR

FIG. 48

| WIDTH | DESCRIPTION |
|---|---|
| 32-BITS | ADDRESS INFO INDICATING WHERE THE HEADER PORTION IS STORED. |
| 32-BITS | ADDRESS INFO INDICATING WHERE THE PAYLOAD PORTION IS STORED. |
| 16-BITS | PACKET LENGTH. |
| 32-BITS | SEQUENCE NUMBER OF THE PACKET IN THE FLOW. |
| 16-BITS | QUEUE TO WHICH THE PACKET BELONGS. |
| 8-BITS | I/O DESTINATION TO WHICH THE PACKET IS TO BE SENT. |

EGRESS PACKET DESCRIPTOR

FIG. 49

MU ISLAND

MAC ISLAND
(EGRESS)

PACKET FLOW WHEN LOCAL MEMORY
RESOURCES ARE AVAILABLE

PACKET FLOW WHEN LOCAL MEMORY
RESOURCES ARE SCARCE

FLOW CONTROL USING LOCAL EVENT RING
AND CONFIGURABLE MESH DATA BUS

MU ISLAND SHOWING ATOMIC ENGINE IN DETAIL

DCACHE EXPANDED DIAGRAM

DATA STRUCTURE DIAGRAM

ETHERNET PACKET

STATE MACHINE STATE DIAGRAM

REGISTER POOL

DETAILED PIPELINE DIAGRAM

HASH BUCKET

LOOK-UP STAGE

| FIELD | WIDTH | DESCRIPTION |
|---|---|---|
| ADDED | 1 | "1" IF HASH KEY WAS ADDED |
| LOCKED | 1 | "1" IF DATASTRUCTURE IS CURRENTLY LOCKED |
| FOUND | 1 | "1" IF HASH KEY WAS FOUND |
| HASH BUCKET LOCATION IDENTIFICATION (ID) | 2 | IDENTIFICATION OF WHICH HASH BUCKET LOCATION IN THE HASH BUCKET CONTAINED THE MATCHING HASH KEY |

RESULTS PACKET

FIG. 68

TRANSACTIONAL MEMORY FLOWCHART

TRANSACTIONAL MEMORY FLOWCHART

TRANSACTIONAL MEMORY OPERATIONAL FLOW

PIPELINE OPERATIONAL FLOW

U.S. 10,911,038 B1

CONFIGURATION MESH DATA BUS AND TRANSACTIONAL MEMORIES IN A MULTI-PROCESSOR INTEGRATED CIRCUIT

CROSS REFERENCE TO RELATED APPLICATIONS

This application is a continuation of, and claims priority under 35 U.S.C. § 120 from, nonprovisional U.S. patent application Ser. No. 15/874,860 entitled "TRANSACTIONAL MEMORY THAT PERFORMS A STATISTICS ADD-AND-UPDATE OPERATION," filed on Jan. 18, 2018, which in turn is a continuation of, and claims priority under 35 U.S.C. § 120 from, nonprovisional U.S. patent application Ser. No. 14/556,135 entitled "RECURSIVE LOOKUP WITH A HARDWARE TRIE STRUCTURE THAT HAS NO SEQUENTIAL LOGIC ELEMENTS," filed on Nov. 29, 2014, now U.S. Pat. No. 9,899,996, which in turn is a continuation of, and claims priority under 35 U.S.C. § 120 from, nonprovisional U.S. patent application Ser. No. 13/552,555 entitled "RECURSIVE LOOKUP WITH A HARDWARE TRIE STRUCTURE THAT HAS NO SEQUENTIAL LOGIC ELEMENTS," filed on Jul. 18, 2012, now U.S. Pat. No. 8,902,902. The disclosures of the foregoing three documents are incorporated herein by reference.

TECHNICAL FIELD

The described embodiments relate generally to island-based integrated circuits and related methods.

BACKGROUND INFORMATION

A network processor is a device that executes programs to handle packet traffic in a data network. Examples include network processors on router line cards and in other network equipment. The Intel IXP2800 is a multi-threaded multiprocessor integrated circuit that is capable of receiving packets, classifying and performing atomic operations on the packets and packet data, and transmitting packets. Within the IXP2800 integrated circuit, microengines operate on packet data stored in a memory. The memory is accessible to the microengines via a DRAM command/push/pull bus. The IXP2800 architecture is therefore flexible and expandable in that more processing power can be added and coupled to the bus so that the added processors will have access to the memory. A family of network processors of this architecture can be made by providing network processor integrated circuits with different amounts of processing power and with different amounts of memory.

SUMMARY

In a first novel aspect, an island-based network flow processor (IB-NFP) integrated circuit has a configurable mesh data bus. The IB-NFP integrated circuit has functional circuitry including ingress packet classification circuits, processors, memories, and egress scheduling circuitry. The functional circuitry is partitioned into rectangular islands. In addition to the functional circuitry, each island has a part of a mesh data bus. The part of the mesh data bus includes a crossbar switch located centrally in the island, and a set of half links. The mesh data bus may for a sort of overlay over the functional circuitry of the islands. The islands are organized such that half links of adjacent islands are substantially collinear and join together to form links that extend in substantially straight lines between crossbar switches of adjacent islands.

In one specific example, there are four substantially identical mesh buses that together form a configurable command/push/pull data bus. A first mesh bus is a command mesh bus of the configurable mesh data bus, a second mesh bus is a pull-id mesh bus of the configurable mesh data bus, a third mesh bus is a data1 mesh bus of the configurable mesh data bus, and a fourth mesh bus is a data0 mesh bus of the configurable mesh data bus. Each crossbar switch of such a mesh data bus includes a plurality of Look Up Table (LUT) memories, the contents of which configure the configurable mesh bus. In one example, a plurality of commands can be communicated simultaneously across different parts of the configurable mesh data bus. The configurable mesh data bus can be configured such that multiple different functional circuits in multiple different islands can be performing multiple reads or writes across the configurable mesh data bus at the same time.

In a second novel aspect, the islands of an island-based network flow processor (IB-NFP) integrated circuit are organized in a staggered fashion. The islands are rectangular and are organized in rows. The left and rights side edges of the islands of one row are offset laterally and are laterally staggered with respect to the left and right side edges of the islands of the next row. This lateral staggering, back and forth, from row to row, is such that the half links of the islands meet at the port locations and form a mesh bus structure. The left and right edges of islands in a row align with left and right edges of islands two rows down in the row structure. In one specific example, two of the half links extend from the crossbar switch up to port locations on an top edge of the island, another of the half links extends from the crossbar switch to the right to the right side edge of the island, two others of the half links extend down from the crossbar switch to port locations on a bottom edge of the island, another of the half links extends from the central location to the left to the left edge of the island. Two other links extend from the crossbar switch to functional circuitry in the island. In this way, six of the half links radiate outwardly from the central location of the crossbar switch and have a star-shape when the island structure is considered from a top-down perspective. The half links and islands are oriented such that half links of adjacent islands join together to form a mesh bus structure. There are four such mesh bus structures. One for the command bus of a command/push/pull data bus, another for the pull-id bus of the command/push/pull data bus, and two for data buses of the command/push/pull data bus.

In a third novel aspect, each link of an island-based network flow processor (IB-NFP) integrated circuit is realized as a distributed credit First-In-First-Out (FIFO) structure. The distributed credit FIFO structure communicates information from the center part of a first island, through an output port of the first island, through an input port of a second island, and to a center part of the second island. The distributed credit FIFO structure includes a first FIFO associated with an output port of a first island, a chain of registers, a second FIFO associated with an input port of a second island, a second chain of registers, and a credit count circuit. A data path extends from the first FIFO in the first island, through the chain of registers, and to the second FIFO in the second island. The data path extends is a substantially straight line from the center part of the first island to the center part of the second island. When a bus transaction value passes through the distributed credit FIFO and then through a crossbar switch of the second island, an arbiter in the crossbar switch returns a taken signal. The taken signal passes back through the second chain of registers to the credit count circuit in the first island. The credit count circuit maintains a credit count value for the distributed credit FIFO. The credit count circuit decreases a credit value when a data value is pushed into the first FIFO, and is increased when the taken signal reaches the credit count circuit. There is one such distributed credit FIFO for the link portion from the first island to the second island, and there is another such distributed credit FIFO for the link portion from the second island to the first island.

In a fourth novel aspect, an island-based network flow processor (IB-NFP) integrated circuit comprises six islands: 1) a first island (a MAC island) that converts incoming symbols into a packet; 2) a second island (first NBI island) that analyzes at least part of the packet and generates therefrom first information indicative of whether the packet is a first type of packet or a second type of packet, 3) a third island (ME island) that receives the first information and the header portion from the second island via a configurable mesh data bus, and that generates second information indicating where the header portion is stored and where the payload portion is stored; a fourth island (MU island) that receives a payload portion from the second island via the configurable mesh data bus; a fifth island (second NBI island) that receives second information from the third island via the configurable mesh data bus, that receives the header portion from the third island via the configurable mesh data bus, and that receives the payload portion from the fourth island via the configurable mesh data bus, and that performs egress scheduling; and a sixth island (second MAC island) that receives the header portion and the payload portion from the fifth island and converts the header portion and the payload portion into outgoing symbols. The first, second, third, fourth, fifth, and sixth islands all have the same rectangular size and shape. The first, second, third, fourth, fifth, and sixth islands all have the same configurable mesh data bus structure, configurable mesh control bus structure, and configurable mesh event bus structure.

In a fifth novel aspect, memories of an island-based network flow processor (IB-NFP) integrated circuit have a common interface structure. The island-based network flow processor integrated circuit has a first island and a second island. The first island comprises a first memory and first data bus interface circuitry. The second island comprises a processor, a second memory, and second data bus interface circuitry. The second memory is tightly coupled to the processor. The first data bus interface circuitry is substantially identical to the second data bus interface circuitry. The processor in the second island can issue a command for a target memory to do an action. If a target field in the command has a first value then the target memory is the first memory in the first island whereas if the target field in the command has a second value then the target memory is the second memory in the second island. In one example, the command is a command on a configurable mesh data bus. The command format is the same, regardless of whether the target memory is local or remote. If the target memory is remote, then a data bus bridge in the first island adds destination information before putting the command onto the global configurable mesh data bus.

In a sixth novel aspect, a first packet is received onto a first island of an island-based network flow processor (IB-NFP) integrated circuit. The header portion of the first packet is communicated to and is stored in a second island (for example, in a tightly coupled memory of a processor island). The payload portion of the first packet is communicated to and is stored in a third island (for example, a memory island). When the first packet is to be transmitted, the header portion is communicated from the second island to a fourth island, and the payload portion is communicated from the third island to the fourth island. The first packet is then output from the integrated circuit. A second packet is received onto the first island. The header portion of the second packet is communicated to and is stored in the second island. The payload portion of the second packet is communicated to and is stored in the third island. The header portion is communicated from the second island to the third island. When the second packet is to be transmitted, both the header portion and the payload portion of the second packet are communicated from the third island to the fourth island, whereafter the second packet is output from the integrated circuit. In one example, the header portion is not moved into the third island unless memory resources in the second island are scarce, but if memory resources in the second island are scarce then the header portion is moved to be stored in the third island along with the payload portion, thereby freeing up memory resources in the second island.

In a seventh novel aspect, an island-based network flow processor (IB-NFP) integrated circuit comprises a plurality of islands. Each island comprises a switch and four half links. The islands are coupled together such that the half links and the switches form a configurable mesh control bus. The configurable mesh control bus is configured to have a tree structure such that configuration information passes from the switch of a root island to the switch of each of the other islands, and such that circuitry in each of the plurality of islands is configured by configuration information received via the configurable mesh control bus from the root island. In one example, the configurable control mesh bus portion of each island includes a statically configured switch and multiple half links that radiate from the switch. The static configuration is determined by hardwired tie off connections associated with the island. Configuration information communicated across the tree structure is used to configure a configurable mesh data bus of the island-based network flow processor integrated circuit.

In an eighth novel aspect, an island-based network flow processor (IB-NFP) integrated circuit is configured to have a local event ring. The integrated circuit comprises a plurality of rectangular islands disposed in rows. Each rectangular island comprises a Run Time Configurable Switch (RTCS) and a plurality of half links. The rectangular islands are coupled together such that the half links and the RTCSs together form a configurable mesh event bus. The configurable mesh event bus is configured to form the local event ring. The local event ring provides a communication path along which an event packet is communicated to each rectangular island along the local event ring. The local event ring involves event ring circuits and event ring segments. Upon each transition of a clock signal, an event packet moves through the ring from event ring segment to event ring segment. Event information and not packet data travels through the ring. The local event ring functions as a source-release ring in that only the event ring circuit that inserted the event packet onto the ring can delete the event packet from the ring. An event ring circuit on the local event ring can only insert an event packet onto an event ring segment if there is no event packet present on the event ring segment. A bit of the value on an event ring segment indicates whether the remainder of the value on the segment is an event packet or not.

In a ninth novel aspect, an island-based network flow processor (IB-NFP) integrated circuit is configured to have a global event chain. The integrated circuit comprises a plurality of rectangular islands disposed in rows. Each rectangular island comprises a Run Time Configurable Switch (RTCS) and a plurality of half links. The rectangular islands are coupled together such that the half links and the RTCSs together form a configurable mesh event bus. The configurable mesh event bus is configured to form a local event ring and the global event chain. The local event ring provides a communication path along which an event packet is communicated to each rectangular island along the local event ring. The event packet can pass from the local event ring and onto the global event chain such that the event packet is then communicated along the global event chain. The global event chain is not a ring, but rather extends in one example to one of islands and terminates in that island. In one example, the local event ring comprises a plurality of event ring circuits and a plurality of event ring segments. One of the event ring segments receives an event packet that is circulating in the local event ring, and determines if the event packet meets a criterion, and only if the packet meets the criterion does the event ring circuit pass the event packet onto the global event chain. The criterion is determined by configuration information stored in the event ring circuit. The configuration information can be changed via the configurable mesh control bus. A configurable event manager at the end of the global event chain receives global event packets from the global event chain, analyzes the global event packets, and collects and logs information about the global event packets. How the event manager analyzes the global event packets is determined by configuration information stored in the event manager. The configuration information can be changed via the configurable mesh control bus.

In a tenth novel aspect, an island-based network flow processor (IB-NFP) integrated circuit includes islands organized in rows. A configurable mesh event bus extends through the islands and is configured to form a local event ring. The configurable mesh event bus is configured with configuration information received via a configurable mesh control bus. The local event ring involves event ring circuits and event ring segments. In one example, a packet is received onto a first island. If an amount of a processing resource available to the first island is below a predetermined threshold, then an event packet is communicated from the first island to a second island via the local event ring. In response, the second island sends a first communication from the second island to a third island across a configurable mesh data bus. The third island receives the first communication and in response sends a second communication from the third island to the first island across the configurable mesh data bus. As a result of the first and second communications, the amount of the processing resource available to the first island for handling incoming packet information is increased. In one specific example, the processing resource is an amount of buffer memory that is available to the first island for storing incoming packet information. A buffer list identifies a plurality of memory buffers that are available to the first island for storing incoming packet information. As a result of the first and second communications, an indication of an additional buffer or buffers is added to the buffer list so that the first island has more buffer space available for storing incoming packet information.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 18 is a diagram of the formal of a bus transaction value that passes over the configurable mesh data bus.

FIG. 19 is a table describing the payload of a bus transaction value in the situation in which the bus transaction value is a command.

FIG. 20 is a table describing the payload of a bus transaction value in the situation in which the bus transaction value is a pull-id.

FIG. 21 is a table describing the payload of a bus transaction value in the situation in which the bus transaction value is data pull or push.

FIG. 22 is a table describing the payload of a bus transaction value in the situation in which the bus transaction value is data pull.

FIG. 23 is a table describing the payload of a bus transaction value in the situation in which the bus transaction value is data push.

FIG. 38A is a diagram of an event packet bit sequence.

FIG. 38B is a signal table that identifies and explains the various parts of an event packet.

FIG. 48 is a table that sets forth the parts of an ingress packet descriptor.

FIG. 49 is a table that sets forth the parts of an egress packet descriptor.

FIG. 68 is a table listing the width and description of each field within a results packet.

DETAILED DESCRIPTION

Reference will now be made in detail to background examples and some embodiments of the invention, examples of which are illustrated in the accompanying drawings. In the description and claims below, relational terms such as "horizontal", "vertical", "lateral", "top", "upper", "bottom", "lower", "right", "left", "over" and "under" may be used to describe relative orientations between different parts of a structure being described, and it is to be understood that the overall structure being described can actually be oriented in any way in three-dimensional space.

Figure 1:
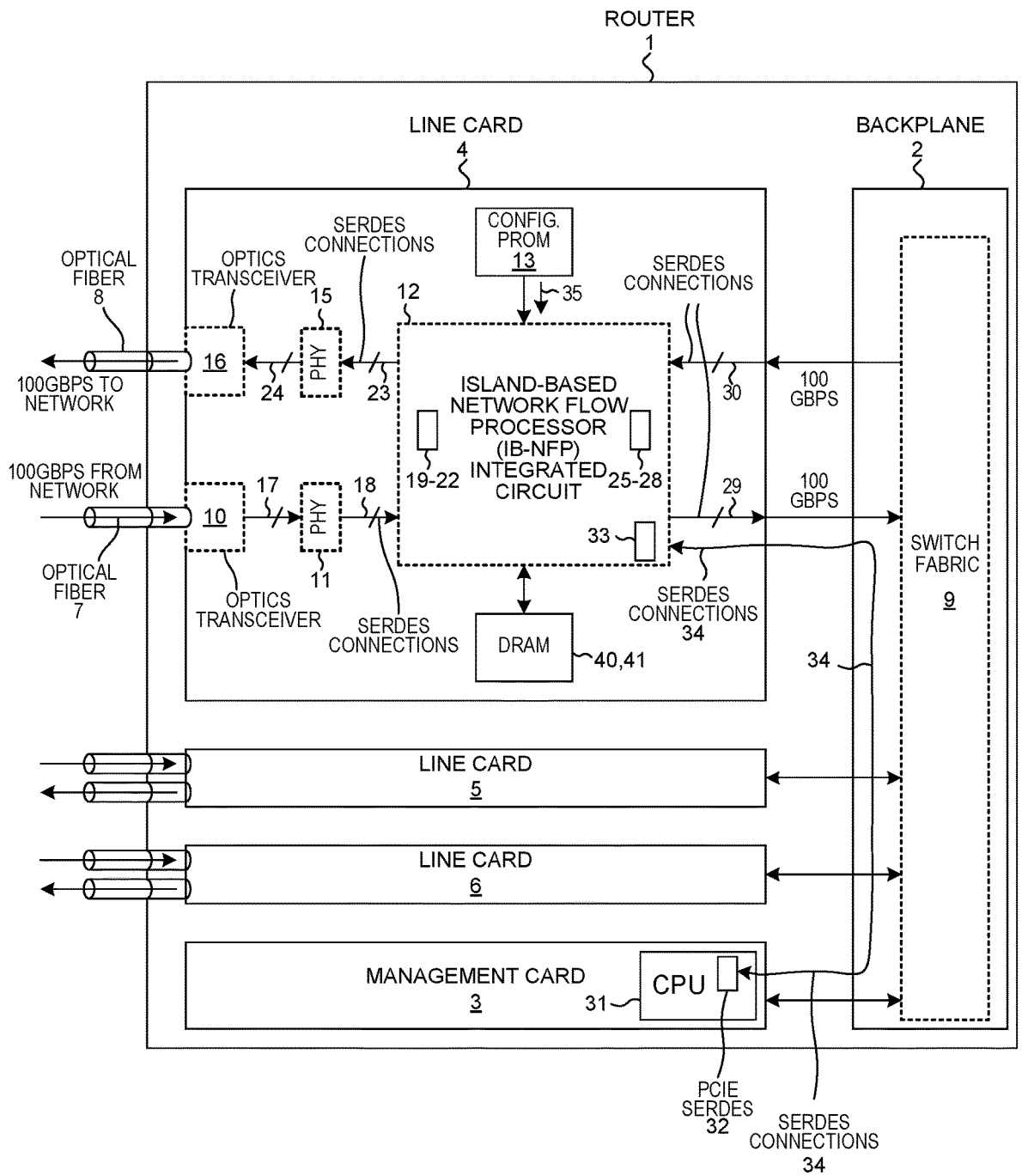
FIG. 1 is a diagram of an MPLS (MultiProtocol Label Switching) router 1.

FIG. 1 is a simplified diagram of an MPLS (MultiProtocol Label Switching) router 1. Router 1 includes a backplane 2, a management card 3, and line cards 4-6. Each of the line cards can receive 100 Gbps (gigabits per second) packet traffic from another network via a fiber optic cable 7 and also can transmit 100 Gbps packet traffic to another network via another fiber optic cable 8. In addition, each line card can receive 100 Gbps packet traffic from the switch fabric 9 of the backplane and can also transmit 100 Gbps packet traffic to the switch fabric. Line cards 4-6 are of identical construction. In this example, flows of packets are received into line card 4 from a network via the fiber optic cable 7 or from the switch fabric 9. Certain functions then need to be performed on the line card including looking up MPLS labels, determining destinations for incoming flows of packets, and scheduling the transmitting of flows of packets. Packets of the flows pass from the line card 4 and out either to the network via optical cable 8 or to the switch fabric 9.

Line card 4 includes a first optical transceiver 10, a first PHY integrated circuit 11, an Island-Based Network Flow Processor (IB-NFP) integrated circuit 12, a configuration Programmable Read Only Memory (PROM) 13, an external memory such as Dynamic Random Access Memory (DRAM) 40-41, a second PHY integrated circuit 15, and a second optical transceiver 16. Packet data received from the network via optical cable 7 is converted into electrical signals by optical transceiver 10. PHY integrated circuit 11 receives the packet data in electrical form from optical transceiver 10 via connections 17 and forwards the packet data to the IB-NFP integrated circuit 12 via SerDes connections 18. In one example, the flows of packets into the IB-NFP integrated circuit from optical cable 7 is 100 Gbps traffic. A set of four SerDes circuits 19-22 within the IB-NFP integrated circuit 12 receives the packet data in serialized form from SerDes connections 18, deserializes the packet data, and outputs packet data in deserialized form to digital circuitry within IB-NFP integrated circuit 12.

Similarly, IB-NFP integrated circuit 12 may output 100 Gbps packet traffic to optical cable 8. The set of four SerDes circuits 19-22 within the IB-NFP integrated circuit 12 receives the packet data in deserialized form from digital circuitry within integrated circuit 12. The four SerDes circuits 19-22 output the packet data in serialized form onto SerDes connections 23. PHY 15 receives the serialized form packet data from SerDes connections 23 and supplies the packet data via connections 24 to optical transceiver 16. Optical transceiver 16 converts the packet data into optical form and drives the optical signals through optical cable 8. Accordingly, the same set of four duplex SerDes circuits 19-22 within the IB-NFP integrated circuit 12 communicates packet data both into and out of the IB-NFP integrated circuit 12.

IB-NFP integrated circuit 12 can also output packet data to switch fabric 9. Another set of four duplex SerDes circuits 25-28 within IB-NFP integrated circuit 12 receives the packet data in deserialized form, and serializes the packet data, and supplies the packet data in serialized form to switch fabric 9 via SerDes connections 29. Packet data from switch fabric 9 in serialized form can pass from the switch fabric via SerDes connections 30 into the IB-NFP integrated circuit 12 and to the set of four SerDes circuits 25-28. SerDes circuits 25-28 convert the packet data from serialized form into deserialized form for subsequent processing by digital circuitry within the IB-NFP integrated circuit 12.

Management card 3 includes a CPU (Central Processing Unit) 31. CPU 31 handles router management functions including the configuring of the IB-NFP integrated circuits on the various line cards 4-6. CPU 31 communicates with the IB-NFP integrated circuits via dedicated PCIE connections. CPU 31 includes a PCIE SerDes circuit 32. IB-NFP integrated circuit 12 also includes a PCIE SerDes 33. The configuration information passes from CPU 31 to IB-NFP integrated circuit 12 via SerDes circuit 32, SerDes connections 34 on the backplane, and the PCIE SerDes circuit 33 within the IB-NFP integrated circuit 12.

External configuration PROM (Programmable Read Only Memory) integrated circuit 13 stores other types of configuration information such as information that configures various lookup tables on the IB-NFP integrated circuit. This configuration information 35 is loaded into the IB-NFP integrated circuit 12 upon power up. As is explained in further detail below, IB-NFP integrated circuit 12 can store various types of information including buffered packet data in external DRAM integrated circuits 40-41.

Figure 2:
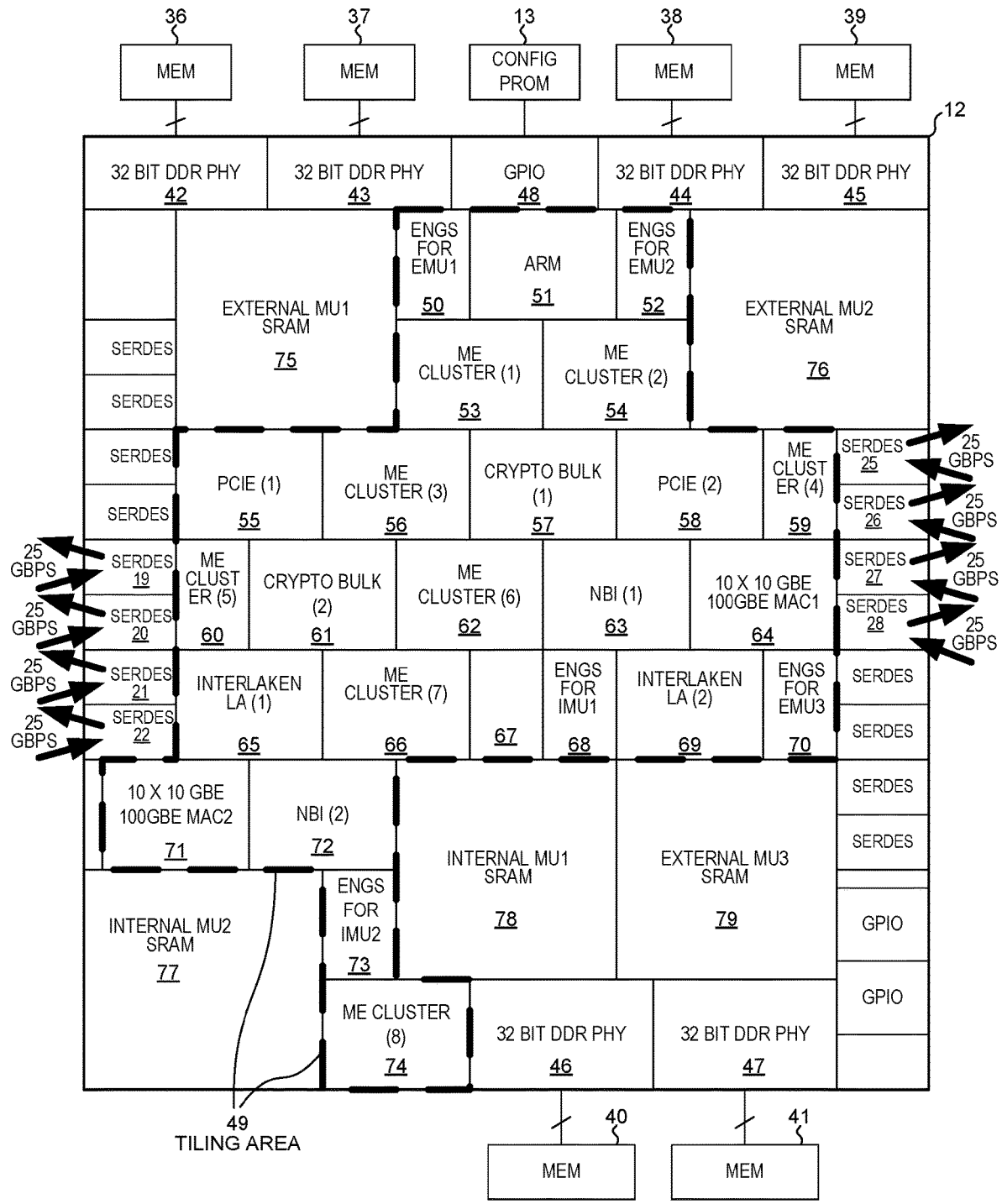
FIG. 2 is a more detailed top-down diagram of IB-NFP integrated circuit 12.

FIG. 2 is a more detailed top-down diagram of IB-NFP integrated circuit 12. IB-NFP integrated circuit 12 includes many I/O (input/output) terminals (not shown). Each of these terminals couples to an associated terminal of the integrated circuit package (not shown) that houses the IB-NFP integrated circuit. The integrated circuit terminals may be flip-chip microbumps and are not illustrated. Alternatively, the integrated circuit terminals may be wire bond pads.

SerDes circuits 19-22 are the first set of four SerDes circuits that are used to communicate with the external network via the optical cables 7 and 8. SerDes circuits 25-28 are the second set of four SerDes circuits that are used to communicate with the switch fabric 9. Each of these SerDes circuits is duplex in that it has a SerDes connection for receiving information and it also has a SerDes connection for transmitting information. Each of these SerDes circuits can communicate packet data in both directions simultaneously at a sustained rate of 25 Gbps. IB-NFP integrated circuit 12 accesses external memory integrated circuits 36-41 via corresponding 32-bit DDR physical interfaces 42-47, respectively. IB-NFP integrated circuit 12 also has several general purpose input/output (GPIO) interfaces. One of these GPIO interfaces 48 is used to access external PROM 13.

In addition to the area of the input/output circuits outlined above, the IB-NFP integrated circuit 12 also includes two additional areas. The first additional area is a tiling area 49 of islands 50-74. Each of the islands is either of a full rectangular shape, or is half the size of the full rectangular shape. For example, the island 55 labeled "PCIE (1)" is a full island. The island 60 below it labeled "ME CLUSTER (5)" is a half island. The functional circuits in the various islands of this tiling area 49 are interconnected by: 1) a configurable mesh CPP data bus, 2) a configurable mesh control bus, and 3) a configurable mesh event bus. Each such mesh bus extends over the two-dimensional space of islands with a regular grid or "mesh" pattern. These mesh buses are described in further detail below.

In addition to tiling area 49, there is a second additional area of larger sized blocks 75-79. The functional circuitry of each of these blocks is not laid out to consist of islands and half-islands in the way that the circuitry of tiling area 49 is laid out. The mesh bus structures do not extend into or over any of these larger blocks. The mesh bus structures do not extend outside of tiling area 49. The functional circuitry of a larger sized block outside the tiling area 49 may connect by direct dedicated connections to an interface island within tiling area 49 and through the interface island achieve connectivity to the mesh buses and other islands.

Figure 3:
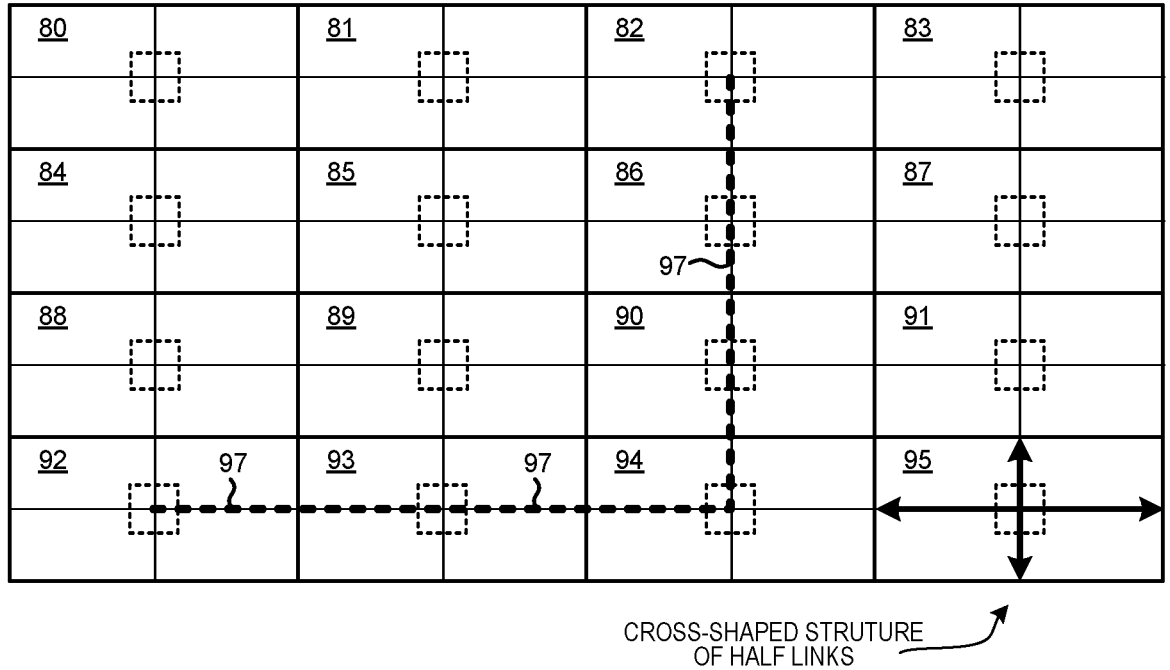
FIG. 3 shows a way of laying out and interconnecting circuitry in the design of an integrated circuit.
Figure 4:
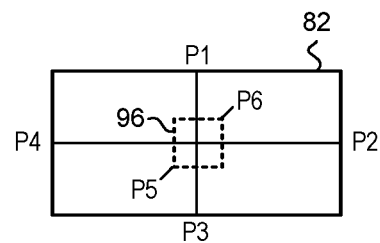
FIG. 4 is a diagram of one of the islands 82 of the pattern of FIG. 3.

FIG. 3 shows a way of laying out and interconnecting circuitry in the design of an integrated circuit. The functional circuitry is partitioned into blocks 80-95 referred to as tiles or islands. To provide interconnectivity between any selected two of the islands, a configurable mesh bus of horizontal links, vertical links, links down to functional circuitry in each island, and crossbar switches is provided. FIG. 4 is a diagram of one of the islands 82. Its crossbar switch 96 is centrally located. A first link is provided from the functional circuit at port location P5 to the crossbar switch 96. Information can be communicated from the functional circuitry of the island to the crossbar switch via this link. A second link is provided from the crossbar switch to the functional circuitry at port location P6. Information can be communicated from the crossbar switch to the functional circuitry via this second link. A half link extends vertically from the crossbar switch to a first port location P1 in the center of the top edge of the island. A second half link extends horizontally from the crossbar switch to a second port location P2 at the right edge of the island. A third half link extends vertically from the crossbar switch to a third port location P3 in the center of the bottom edge of the island. A fourth half link extends horizontally from the crossbar switch to a fourth port location P4 at the right edge of the island. Information coming into the island on one of the half links can be switched by the crossbar switch so that the information then passes out of the island on a selected one of the other half links of the island or so that the information is supplied to the functional circuitry of the island. As illustrated in FIG. 3, the islands are laid out in regular rows and columns so that the half links align with one another and form links between crossbar switches. This tiling pattern may be referred to as a Manhattan pattern. If a connection is to be provided from functional circuitry in the lower left island 93 to functional circuitry in island 82 in the top row, then the connection would pass through a minimum of four intervening islands before reaching island 82. The path of such a connection is indicated by dashed line 97.

Figure 5:
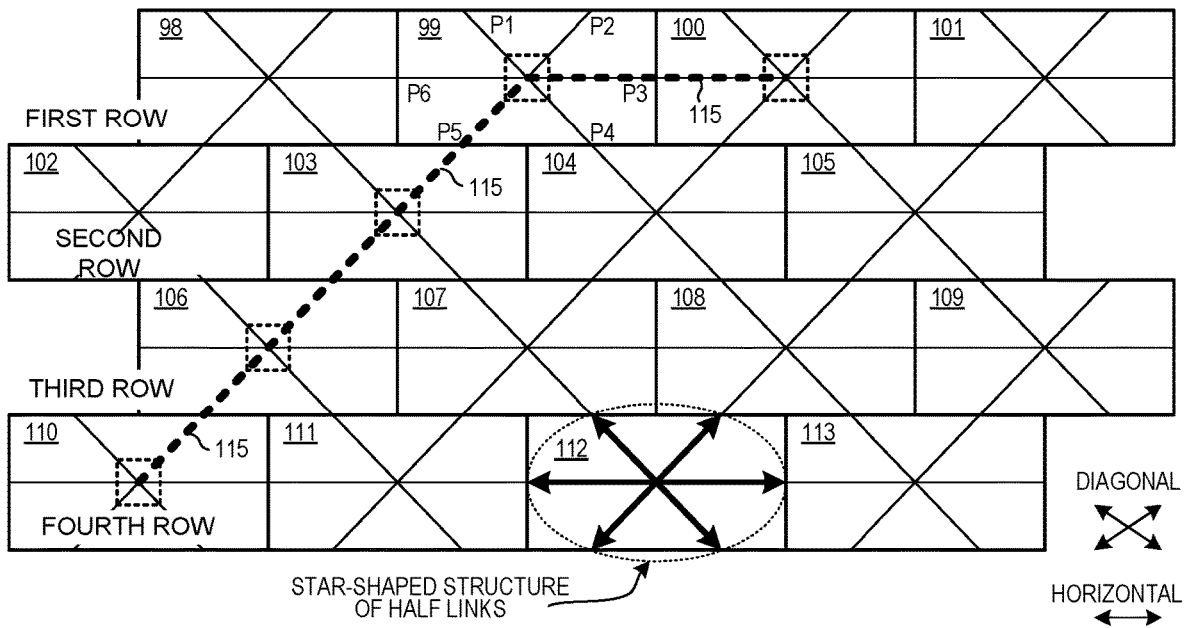
FIG. 5 shows a way of laying out and interconnecting circuitry in the design of an integrated circuit in accordance with one novel aspect.
Figure 6:
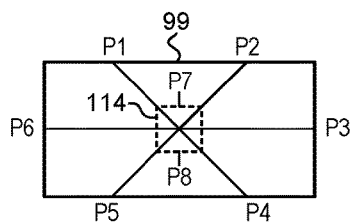
FIG. 6 is a diagram of one of the islands 99 of the pattern of FIG. 5.

FIG. 5 shows a way of laying out and interconnecting circuitry in the design of an integrated circuit in accordance with one novel aspect. The functional circuitry is partitioned into rectangular islands 98-113 as illustrated. FIG. 6 is a diagram of one of the islands 99. A crossbar switch 114 is centrally located. Four half links are not, however, oriented to form a cross-shape as in FIG. 4, but rather six half links are oriented to form a star-shape as illustrated as in FIG. 6. A first link is provided from the functional circuitry at port location P7 to the crossbar switch 114. A signal can be supplied from the functional circuitry to the crossbar switch via this link. A second link is provided from the crossbar switch 114 to the functional circuitry at port location P8. A signal can be supplied from the crossbar switch to the functional circuitry via this second link. A first half link extends diagonally from the crossbar switch 114 up and to the left to a first port location P1. A second half link extends diagonally from the crossbar switch 114 up and to the right to a second portion location P2. A third half link extends horizontally from the crossbar switch 114 to the right to a third port location P3. A fourth half link extends diagonally from the crossbar switch 114 down and to the right to a fourth port location P4. A fifth half link extends diagonally fro the crossbar switch 114 down and to the left to a fifth port location P5. A sixth half link extends horizontally from the crossbar switch 114 to the left to a sixth port location P6. The rectangular islands of FIG. 5 are laid out in rows, but the side edges of the islands of one row are staggered laterally with respect to the corresponding side edges of the islands of the next row. The islands are therefore oriented in a staggered brick structure as illustrated. If a connection is to be provided from functional circuitry in the lower left island 110 to functional circuitry in the island 100 in the top row, then the configurable mesh bus structure can be configured such that a connection is established between these two islands that only passes through three intervening islands before reaching island 100. The path of such a connection is indicated by dashed line 115. Connectivity is improved as compared to the Manhattan pattern of FIG. 3. The comparative diagrams of FIGS. 3 and 5 are only for a small number of islands, but the comparative advantage of the staggered pattern of FIG. 5 as compared to the Manhattan pattern of FIG. 3 becomes more pronounced as the layout patterning technique is extended to include more and more islands.

The islands of the tiling area 49 of the IB-NFP integrated circuit 12 are disposed in the staggered pattern explained in connection with FIG. 5. Each island includes: 1) an amount of functional circuitry, 2) circuitry for a configurable mesh data bus, 3) circuitry for a configurable mesh control bus, and 4) circuitry for a configurable mesh event bus.

Figure 7:
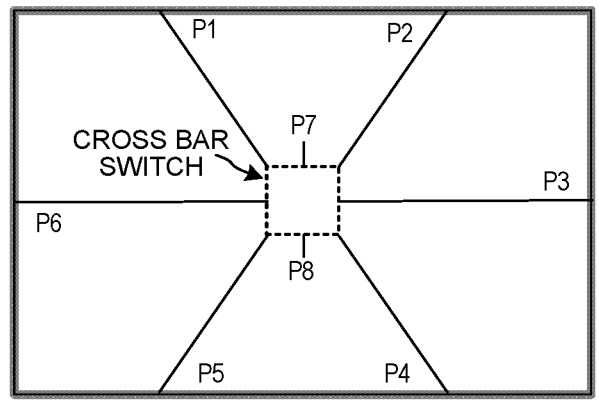
FIG. 7 is a diagram that illustrates the circuitry for the configurable mesh data bus that is part of a full island.

FIG. 7 is a diagram that illustrates the circuitry for the configurable mesh data bus that is part of a full island. The configurable mesh data bus structure actually includes four mesh bus structures, each of which includes a crossbar switch that is disposed in the center of the island as illustrated, and each of which includes six half links that extend to port locations P1-P6 as illustrated, and each of which also includes two links that extend between the crossbar switch and the functional circuitry of the island at port locations P7 and P8. These four mesh bus structures are referred to as the command mesh bus, the pull-id mesh bus, and data0 mesh bus, and the data1 mesh bus. The half links of these mesh buses do not necessarily all extend along the exact same path when the island is considered from the top-down perspective, but rather the half links of these mesh buses extend roughly along the same line. The mesh buses terminate at the edges of the island such that if another identical tile were laid out to be adjacent, then the half links of the corresponding mesh buses of the two islands would align and couple to one another in an end-to-end collinear fashion to form the staggered pattern illustrated in FIG. 5. Similarly, the circuitry of the crossbar switches of the four mesh buses are not all disposed in the same exact location when the island is considered from the top-down perspective, but rather the crossbar switches are located roughly in the center of the island. The four mesh buses of the configurable mesh data bus together are a Command/Push/Pull (CPP) bus as is explained in further detail below.

Figure 8:
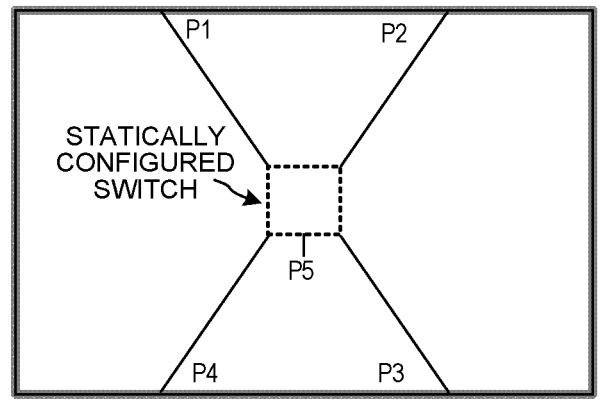
FIG. 8 is a diagram that illustrates the circuitry of the configurable mesh control bus that is part of a full island.

FIG. 8 is a diagram that illustrates the circuitry of the configurable mesh control bus that is part of a full island. Unlike the structure of the mesh buses of the configurable mesh data bus of FIG. 7 where each crossbar switch is coupled to the functional circuitry of the island by two links, the crossbar switch of the configurable mesh control bus of FIG. 8 is coupled to the functional circuitry of the island by one link. Also, the configurable mesh control bus circuitry does not involve horizontally extending half links. The crossbar switch is configured by hardwired tie off connections as described in further detail below. This configuration is fixed at the time of chip manufacture and is not changeable. Accordingly, the crossbar switch is sometimes referred to here more specifically as a "statically configured switch", rather than as a crossbar switch.

Figure 9:
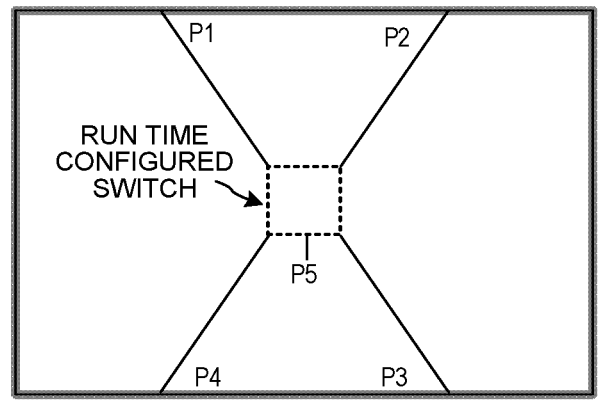
FIG. 9 is a diagram that illustrates the circuitry of the configurable mesh event bus that is part of a full island.

FIG. 9 is a diagram that illustrates the circuitry of the configurable mesh event bus that is part of a full island. The structure of the event bus is similar to the structure of the control bus, except that the crossbar switches of the configurable mesh event bus are not hardwired into one configuration. The crossbar switch is referred to as a "run time configured switch".

Figure 10:
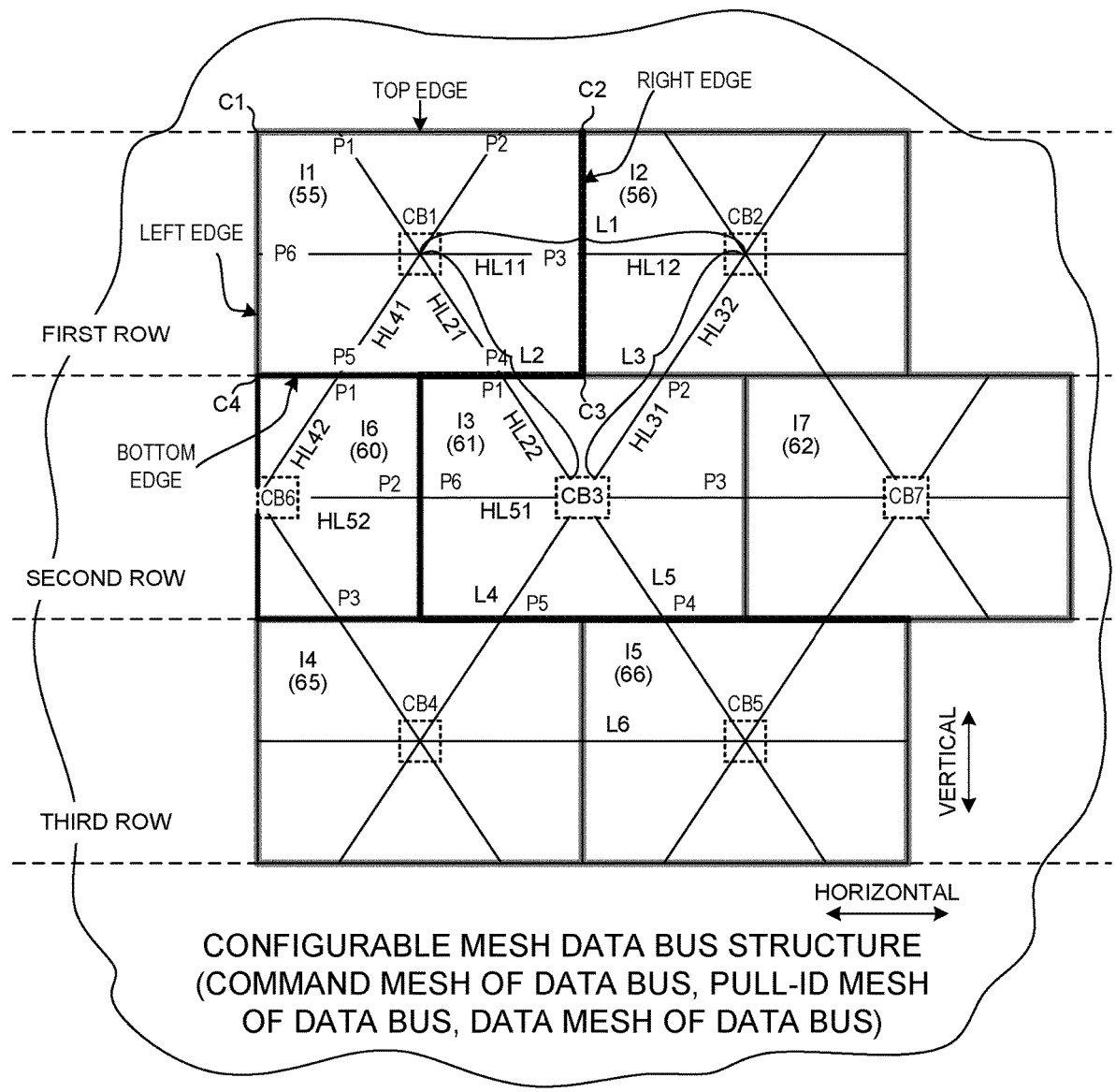
FIG. 10 is a more detailed diagram of the structure of one of the mesh buses of the configurable mesh data bus in a part of IB-NFP integrated circuit 12.

FIG. 10 is a more detailed diagram of the structure of one of the mesh buses of the configurable mesh data bus in a part of IB-NFP integrated circuit 12. A first crossbar CB1 is located centrally within a first rectangular island I1. The first rectangular island I1 is PCIE (1) island 55 of FIG. 2. A second crossbar CB2 that is located centrally within a second rectangular island I2. The second rectangular island I2 is ME cluster (3) island 56 of FIG. 2. A third crossbar CB3 that is located centrally within a third rectangular island I3. The third rectangular island I3 is Crypto Bulk (2) island 61 of FIG. 2. The first and the second islands I1 and I2 are disposed in a first row that extends along a horizontal dimension. The third island I3 is disposed in a second row that extends from the first row along a vertical dimension (i.e., the second row is below the first row when considered from the perspective of FIG. 10). A first link L1 comprises a first half link HL11 and a second half link HL12. HL11 and HL12 are collinear. First link L1 extends in a substantially straight line between CB1 and CB2. A second link L2 comprises a third half link HL21 and a fourth half link HL22. Half links HL21 and HL22 are collinear. Second link L2 extends in a substantially straight line between CB1 and CB3. A third link L3 comprises a fifth half link HL31 and a sixth half link HL32. Half links HL31 and HL32 are collinear. Third link L3 extends in a substantially straight line between CB2 and CB3. Links L1, L2 and L3 form an isosceles triangle as illustrated. Reference numerals P1, P2, P3, P4, P5 and P6 identify port locations. Island I1 has an upper left corner C1, an upper right corner C2, a lower right corner C3, and a lower left corner C4. Port location P1 is located on the top edge of the island about one quarter of the way from the upper left corner to the upper right corner. Port location P2 is located on the top edge of the island about three quarters of the way from the upper left corner to the upper right corner. Port location P3 is located in the middle of the right edge of the island. Port location P4 is located on the bottom edge of the island about one quarter of the way from the lower right corner to the lower left corner. Port location P5 is located on the bottom edge of the island about three quarters of the way from the lower right corner to the lower left corner. Port location P6 is located in the middle of the left edge of the island.

Island I6 is a half island. Island I6 includes a centrally located crossbar switch CB6. Two links extend between crossbar switch CB6 and the functional circuitry of the half island. There are, however, only three half links that extend to three corresponding port locations P1, P2 and P3. Half link HL42, for example, is oriented to extend in collinear fashion to half link HL41 of island I1. Half link HL42 joins at its port location P1 with half link HL41 at its port location P5. The other connections between the half links of the various islands are not described here. There are four instances of the general bus structure illustrated in FIG. 10, one for the command mesh of the configurable mesh data bus, one for the pull-id mesh of the configurable mesh data bus, one for the data0 mesh of the configurable mesh data bus, and one for the data1 mesh of the configurable mesh data bus.

Figure 11:
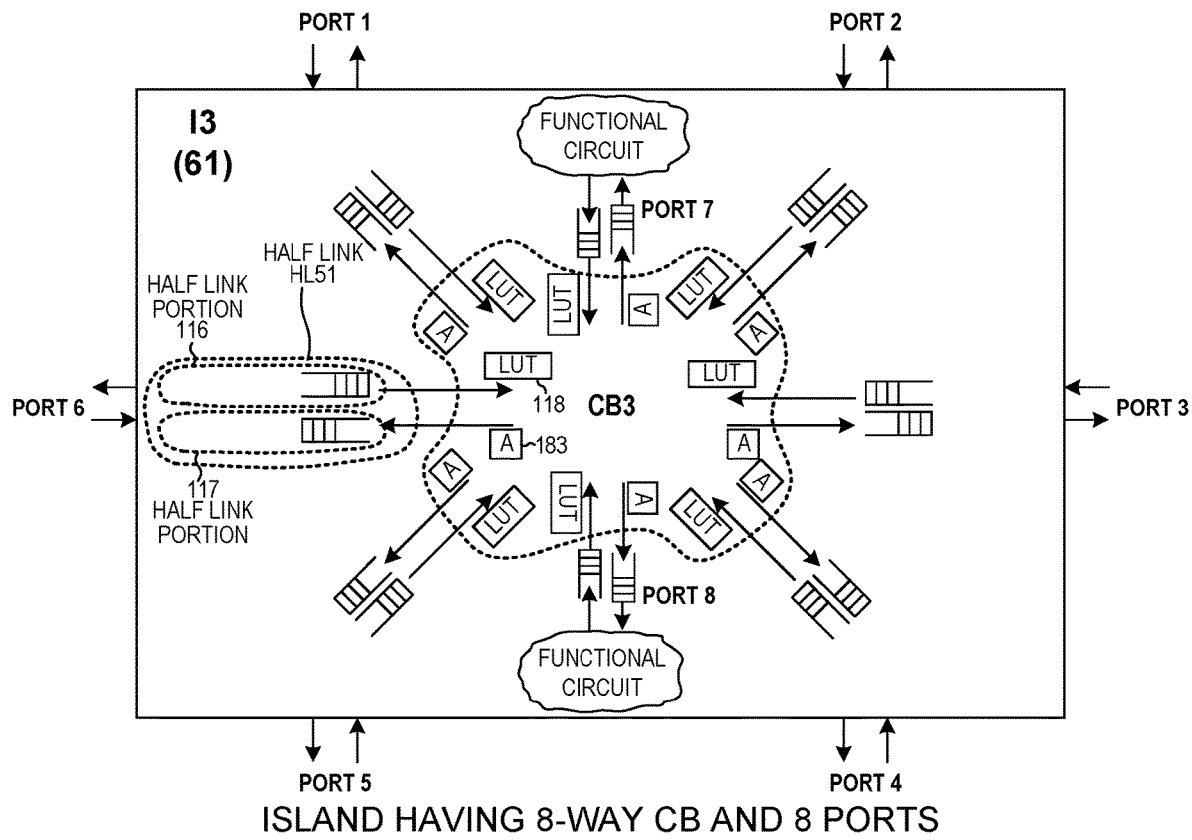
FIG. 11 is a diagram that shows the crossbar switch CB3 of island I3 (61).

FIG. 11 is a diagram that shows the crossbar switch CB3 of island I3 (61). Each half link is bidirectional in that it can supply information from an input port location to the crossbar switch CB3, and in that it can receive information from the crossbar switch CB3 and supply that information to an output port location. For example, half link HL51 includes a half link portion 116 that can communicate information from input port location P6 to CB3, and half link HL51 also includes a half link portion 117 that can communicate information from CB3 to output port location P6. There is a Look Up Table (LUT) within CB3 associated with each half link portion that supplies information to the crossbar switch. In the case of FIG. 11, LUT 118 is the LUT associated with incoming half link portion 116. There is also an arbiter within CB3 associated with each half link portion that communicates information from the crossbar switch to an output port location. In the case of FIG. 11, arbiter 183 is the arbiter associated with half link portion 117 that communicates information from CB3 to output port location 6.

Figure 12:
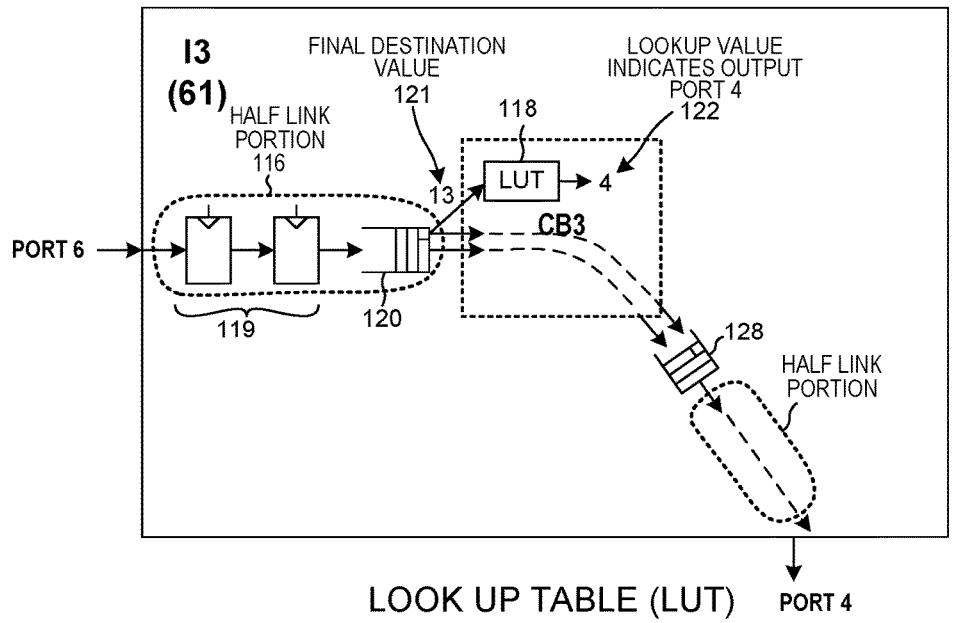
FIG. 12 is a diagram of island I3 that illustrates an operation of LUT 118 of crossbar switch CB3 in further detail.

FIG. 12 is a diagram of island I3 that illustrates the operation of LUT 118 in further detail. Crossbar switch CB3 receives information from half link portion 116 and switches the information so that it is output to another half link portion. In the case of FIG. 12, the information is switched so that it is output to the half link portion for output port location 4. Incoming half link portion 116 includes a chain of registers 119 and an input FIFO (First In First Out) 120. The multiple bits of information being communicated across the half link portion 116 is called a bus transaction value. The bus transaction value includes a final destination value portion, a valid bit, and a payload portion. The final destination value indicates the destination island to which the bus transaction value will be communicated through configurable mesh CPP data bus. Input FIFO 120 supplies a bus transaction value to CB3. The final destination value portion of the bus transaction value is supplied to LUT 118. LUT 118 was previously configured so that when it is presented with a particular final destination value 121, it outputs a FIFO lookup value 122 that causes CB3 to route the bus transaction value through CB3 to an appropriate output port. In the example of FIG. 12, the final destination value is 13. From the value 13 the LUT 118 outputs a lookup value of 4. By configuring all the LUTs appropriately, a bus transaction value having a particular final destination value will be routed through the configurable mesh data bus via one and only one path to the island indicated by the final destination value. In the example of FIG. 12, LUT 118 outputs a lookup value of 4. CB3 uses this lookup value 4 to route the bus transaction value onto the output link portion that will communicate the bus transaction value to output port 4.

Figure 13:
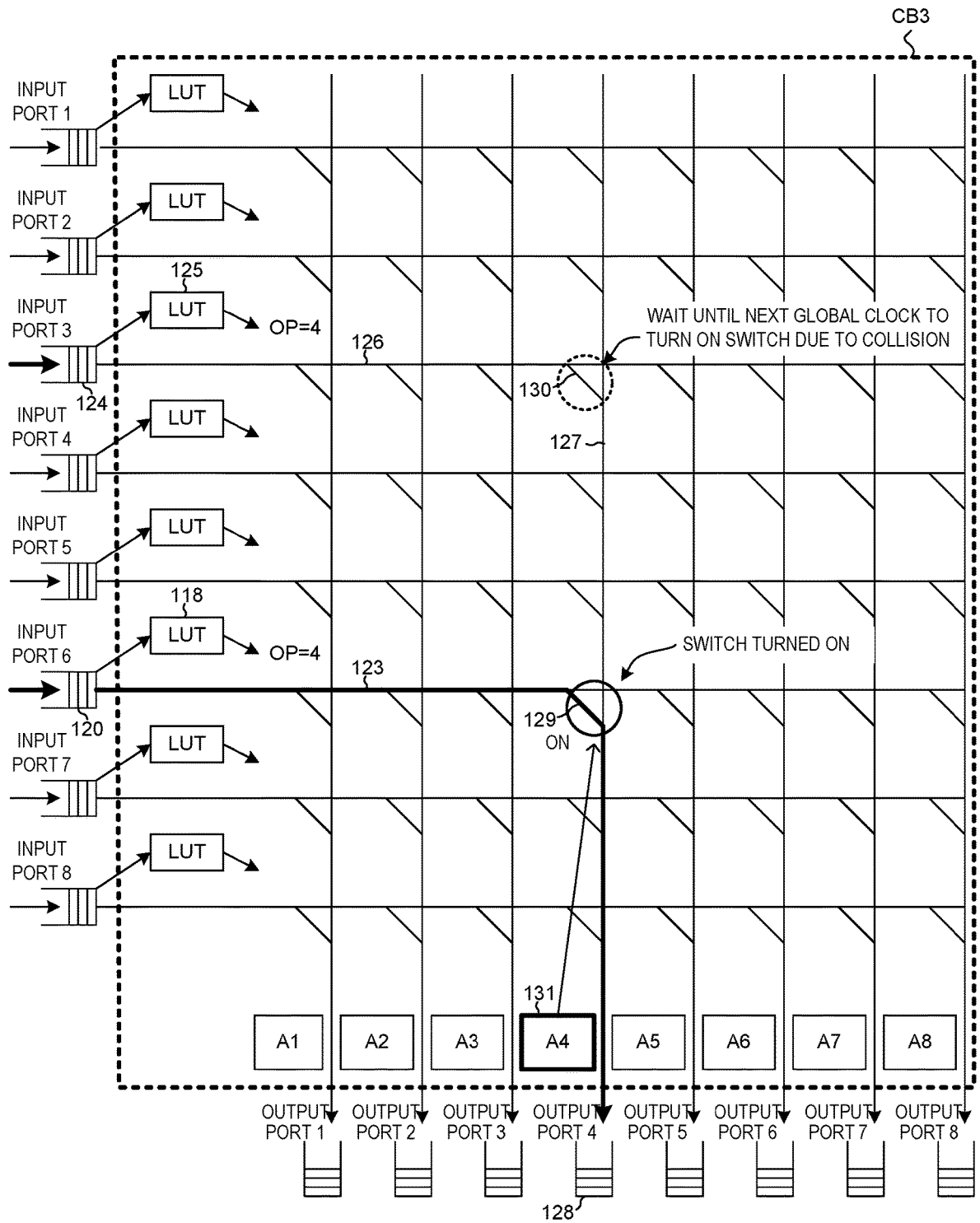
FIG. 13 is a diagram that shows the crossbar switch CB3 in further detail.

FIG. 13 is a diagram that shows the crossbar switch CB3 in further detail. In the left column are illustrated the input FIFOs. There is one such input FIFO at the end of each of the eight half link portions that can supply bus transaction values from an input port to CB3. For example, the half link portion that extends from input port 6 ends in input FIFO 120. LUT 118 is associated with this incoming half link portion. The final destination value portion of the bus transaction value output by FIFO 120 is supplied to LUT 118. The bus transaction value output by FIFO 120 is also communicated horizontally into the crossbar switch via a set of conductors 123. Similarly, the half link portion that extends from input port 3 ends in FIFO 124. The final destination value of the bus transaction value output by FIFO 124 is supplied to LUT 125. The bus transaction value output by FIFO 124 is also communicated horizontally into the crossbar switch via a set of conductors 126. As illustrated, there is one set of horizontally extending conductors for each of the eight input ports.

In addition to the sets of horizontally extending conductors, there is also one set of vertically extending conductors for each of the eight half link portions onto which a bus transaction value can be routed. For example, the set of vertical conductors 127 can communicate a bus transaction value vertically downward to the output FIFO 128 of the half link portion that extends to output port 4. There is a set of switches at the intersection of each set of horizontally extending conductors and each set of vertically extending conductors. Each such set of switches is generally just referred to as a switch. Each such switch can be turned on by an arbiter to couple the set of horizontally extending conductors to the set of vertically extending conductors. Alternatively, each such switch can be turned off by an arbiter so that the switch does not couple the set of horizontally extending conductors to the set of vertically extending conductors. There is an arbiter for each of the eight output ports as illustrated. The arbiter associated with an output port controls the eight switches along the set of vertically extending conductors that extend to the output FIFO for that output port. In the example illustrated, arbiter 131 can turn on switch 129 to couple the set of horizontally extending conductors 123 to the set of vertically extending conductors 127. Also, arbiter 131 can turn on switch 130 to couple the set of horizontally extending conductors 126 to the set of vertically extending conductors 127. There are eight such switches, one for each input port, and each of these switches is controlled by arbiter 131.

A 1.0 GHz global clock clocks the data bus structure, including the arbiters. During a given period of the 1.0 GHz global clock, at most one bus transaction value is switched onto a set of vertically extending conductor for output to a particular output port. A contention situation may arise in which, during a given period of the global clock, the bus transaction values of multiple sets of horizontally extending conductors are to be switched onto the same output port. For example, two bus transaction values on the sets of horizontally extending conductors 123 and 126 may have final destination values. When looked up in their associated LUTs, both final destinations result in the both bus transactions values being destined to go out to output port 4. If, however, both switches 129 and 130 were made to be conductive during the same global clock period, then a collision would occur and the data of the bus transaction values would be corrupted. The arbiter 131 prevents this problem. If there is space available in the output FIFO 128 associated with arbiter 131, then arbiter 131 causes one bus transaction value to be pushed into output FIFO 128. The arbiter receives all LUT lookup values from the LUTs of the input ports. If the lookup values indicate that only one bus transaction value is to be routed onto the output half link portion for output port 4, then the arbiter 131 controls the appropriate switch to turn on and to couple the bus transaction value onto the vertically extending conductors 127. If, however, the lookup values from the LUTs indicate that two or more bus transaction values are to be routed to output port 4, then the arbiter 131 turns on the switches so that a bus transaction value from only one of the input ports will be switched onto the set of vertically extending conductors and to the output port. In the example of FIG. 13, the final destination values of the two bus transaction values received from input ports 3 and 6 both result in their respective LUTs outputting lookup values indicating that their respective bus transaction values are to be routed to output port 4. Arbiter 131 receives the lookup values from all eight LUTs. In the notation of FIG. 13, the OP=4 notation means "output port 4". Each LUT actually supplies a single bit to each of the eight arbiters. If the bit to an arbiter is asserted, this indicates to the arbiter that the LUT for the corresponding input port is signaling that a bus transaction value should be routed to the output port associated with the arbiter. In the example of FIG. 13, LUTs 118 and 125 both assert their respective single bit OP values for arbiter 131. In response, arbiter 131 controls switch 129 to be on during a first global clock period while switch 130 is off. After the bus transaction value from input port location 6 has passed through the crossbar switch and out to output port location 4 during the first global clock period, then the arbiter 131 switches switch 129 to be off and switch 130 to be on during the second global clock period. The bus transaction value from input port location 3 then passes through the crossbar switch and to output port location 4 during the second global clock cycle.

Figure 14:
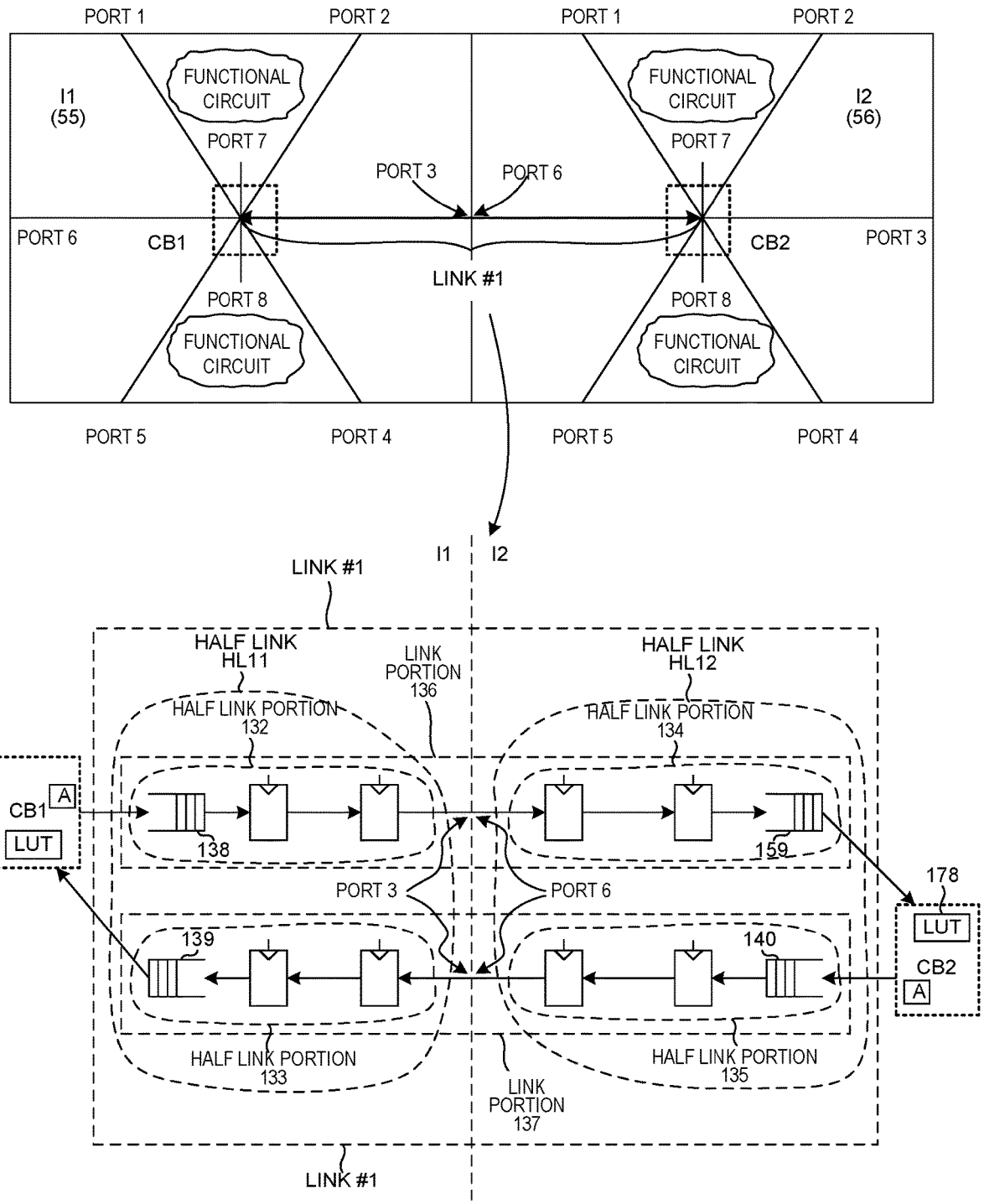
FIG. 14 is a diagram that illustrates the terminology employed.

FIG. 14 is a diagram that illustrates the terminology employed. Link L1 is the bidirectional link that extends horizontally between crossbar switch CB1 of island I1 and crossbar switch CB2 of island I2 of FIG. 10. This link L1 extends through port location 3 of island I1, and through port location 6 of island I2. The bottom portion of FIG. 14 shows that this link involves two half links. Half link HL11 is the half of the link in island I1. Half link HL12 is the half of the link in island I2. Each half link is bidirectional. Each half link includes two half link portions. For example, half link portion 132 extends from CB1 to port location 3 of island I1. Half link portion 133 extends from port location 3 of island I1 to CB1. Half link portion 134 extends from port location 6 of island I2 to CB2. Half link portion 135 extends from CB2 to port location 6 of island I2. Half link portions 132 and 134 are collinear and join to form link portion 136. Half link portions 133 and 135 are collinear and join to form link portion 137. The half link portions that carry data away from a crossbar switch start with an output FIFO. FIFO 138 is the output FIFO for half link portion 132. FIFO 140 is the output FIFO for half link portion 135. The half link portions that carry data into a crossbar switch end with an input FIFO. FIFO 139 is the input FIFO for half link portion 133. FIFO 159 is the input FIFO for half link portion 134.

Figure 15:
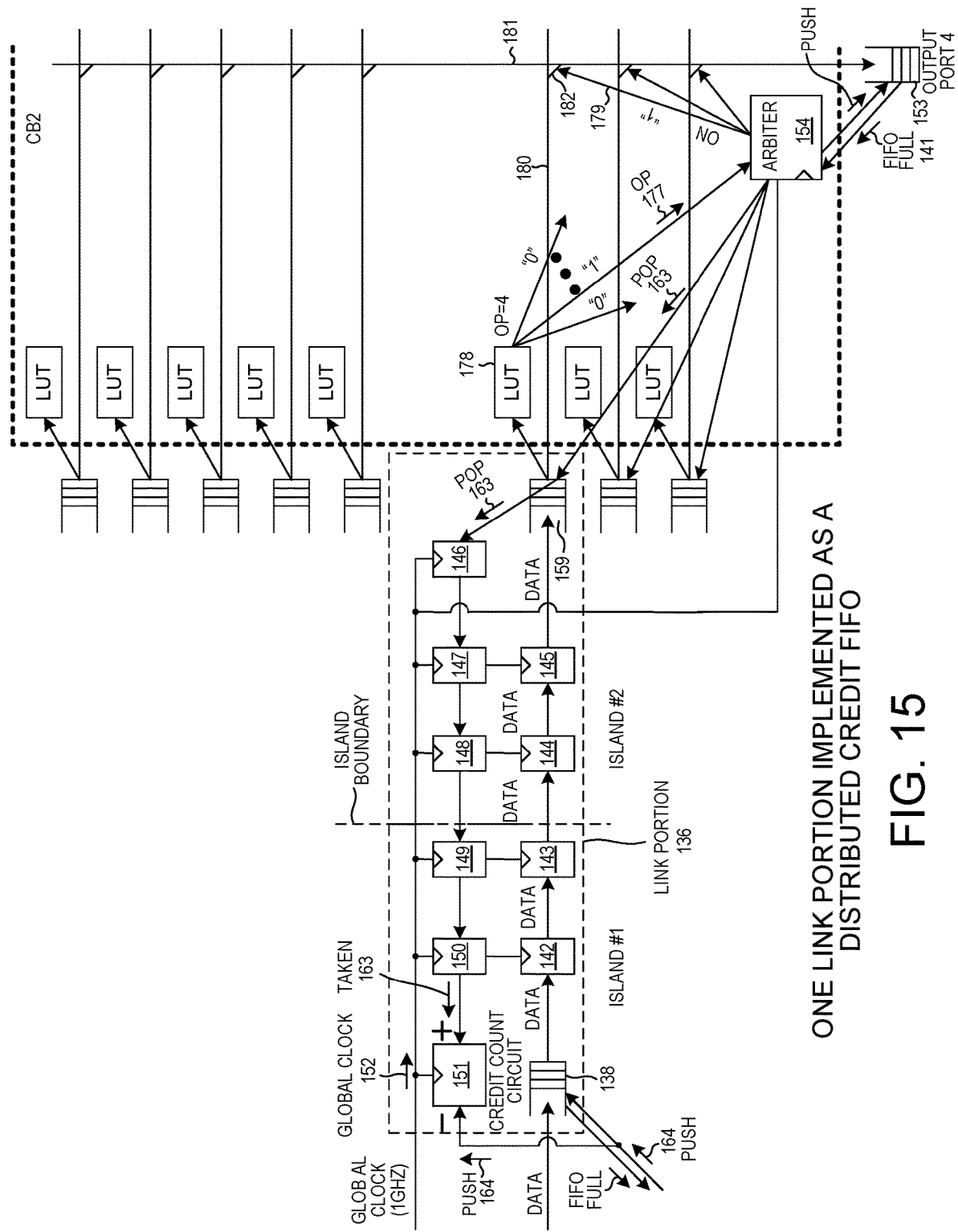
FIG. 15 is a diagram that shows how link portion 136 between islands I1 and I2 is realized as a distributed credit FIFO.

FIG. 15 is a diagram that shows how link portion 136 between islands I1 and I2 is realized as a distributed credit FIFO. Link portion 136 includes the first FIFO 138 that is associated with output port 3 of first island I1, a first chain of registers 142-145, second FIFO 159 that is associated with input port 6 of second island I2, a second chain of registers 146-150, and a credit count circuit 151 disposed in the first island I1. As explained above, a bus transaction value can be communicated from the crossbar switch CB1 of island I1, through output FIFO 138, through chain of registers 142-145, and to input FIFO 159, and to crossbar switch CB2 of island I2. The chain of registers is clocked by the 1.0 GHz global clock signal 152. This global clock clocks all the registers of all the links of the entire configurable mesh data bus. The physical distance between the crossbar switches CB1 and CB2 is smaller than the distance a signal can propagate on a conductor across the integrated circuit in one period of the global clock. Multiple bus transaction values may flow in a pipelined fashion through this link portion.

Arbiter 154 is the arbiter of CB2 for output port 4. The other arbiters for the other output ports are not illustrated. Arbiter 154 receives a FIFO full signal 141 from the output FIFO 153 for output port 4. If the FIFO full signal 141 indicates that space is available in output FIFO 153, then arbiter 154 can cause a selected bus transaction value from one of the input ports of the crossbar switch to be supplied through the crossbar switch and into output FIFO 153. For each input FIFO of the crossbar switch, its associated LUT receives the final destination value of the bus transaction value being output by the associated input FIFO. A single conductor extends from each LUT to arbiter 154 for output port 4. If the lookup value output by the LUT indicates that the bus transaction value should be output onto output port 4, then the LUT asserts the single-bit signal on this conductor for output port 4. Arbiter 154 receives one such single-bit signal from each LUT. All the conductors for communicating these single-bit signals are not shown in FIG. 15 due to space limitations. Signal 177 is the single-bit signal supplied by LUT 178 to arbiter 154. If one of these OP signals indicates that a bus transaction value is to be output from output port 4, then arbiter 154 turns on the appropriate switch to couple the bus transaction value from its horizontally extending conductors onto the vertically extending conductors and to output FIFO 153. A signal conductor extends from arbiter 154 to each of the eight switches that might be turned on to route a bus transaction value to output FIFO 153. Arbiter 154 can turn on a selected one of these eight switches by asserting the ON signal on the appropriate one of these eight signal conductors. In the case of FIG. 15, conductor 179 is the conductor that extends from arbiter 154 to the switch that can switch input port 6 to output port 4. Reference numeral 180 identifies the set of horizontally extending conductors for input port 6. Reference numeral 181 identifies the set of vertically extending conductors for output port 4. Reference numeral 182 identifies the switch that can couple the set of horizontally extending conductors 180 to the set of vertically extending conductors 181.

When the arbiter 154 causes a bus transaction value from input port 6 to be routed through the crossbar switch and to be pushed into output FIFO 153, the arbiter 154 issues a pop signal 163 back to input FIFO 159 from which the bus transaction value came. In addition, the pop signal is supplied to the first register 146 of the second chain of registers. The second chain of registers is really a chain of flip-flops that forms a shift register. This shift register shifts the pop signal (also called a "taken signal") back to the left from the second island I2 to the credit count circuit 151. When the taken signal 163 arrives at the credit count circuit 151, a credit count value maintained by the credit count circuit is incremented to indicate that link portion 136 can hold one more bus transaction value. When the crossbar switch CB1 of the first island I1 pushes a bus transaction value into FIFO 138 of link portion 136, the push FIFO signal 164 is also supplied to credit count circuit 151. This push signal 164 causes credit count circuit 151 to decrement the credit value. A lower credit value indicates that link portion 136 can hold one less bus transaction value. In the illustrated example, only if the credit count is greater than zero can a data value be pushed into input FIFO 138.

It is possible that the input FIFOs leading to the crossbar switch present multiple bus transaction values that should be switched to the same output FIFO 153. If such a case of contention, arbiter 154 selects one of the bus transaction values to be switched to the output FIFO during the global clock period as explained above. The arbiter only turns on the appropriate switch to direct this one bus transaction value to the output FIFO 153. The arbiter pops the input FIFO that supplied the bus transaction value at the end of the global clock period. Then in the next global clock period, if there is space available in the output FIFO as indicated by the FIFO full signal, then the arbiter turns on the appropriate switch to direct the next bus transaction value into the output FIFO. Once again, at the end of the transfer, the arbiter 154 asserts the POP signal to the particular input FIFO that supplied the bus transaction value that was transferred. There are eight conductors extending from arbiter 154 to the input FIFOs so that arbiter 154 can supply a POP signal to the appropriate input FIFO. Only three of these conductors are shown in FIG. 15 due to space limitations. In this way, the arbiter 154 only supplies one bus transaction value from one input FIFO onto the output FIFO 153 during a given global clock period.

Figure 16:
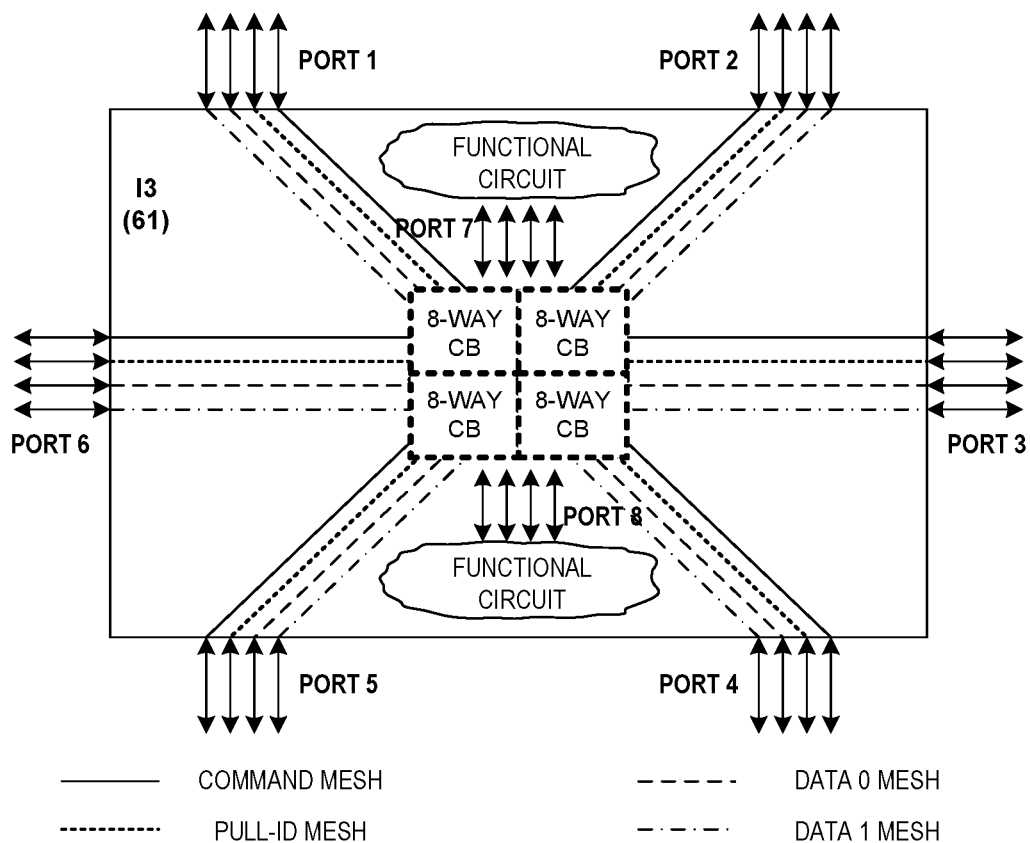
FIG. 16 is a top-down diagram that illustrates in schematic fashion how island I3 includes a separate set of half link portions and crossbar switches for the four different mesh buses of the configurable mesh CPP data bus.

FIG. 16 is a top-down diagram that illustrates in schematic fashion how island I3 includes a separate set of link portions and crossbar switches for the four different mesh buses of the configurable mesh CPP data bus. There is one set of half links and a crossbar switch for the command mesh of the configurable mesh data bus. There is one set of half links and a crossbar switch for the pull-id mesh of the configurable mesh data bus. There is one set of half links and a crossbar switch for the data0 mesh of the configurable mesh data bus. There is one set of half links and a crossbar switch for the data1 mesh of the configurable mesh data bus. The termination points of these half links at the edges of the island are such that when two identical islands are made to be adjacent, that the command mesh half links join to another, that the pull-id mesh half links join to one another, that the data0 mesh half links join to one another, and that the data1 mesh half links join to one another. The four mesh structures of the configurable mesh data bus implement a command/push/pull (CPP) data bus.

Figure 17:
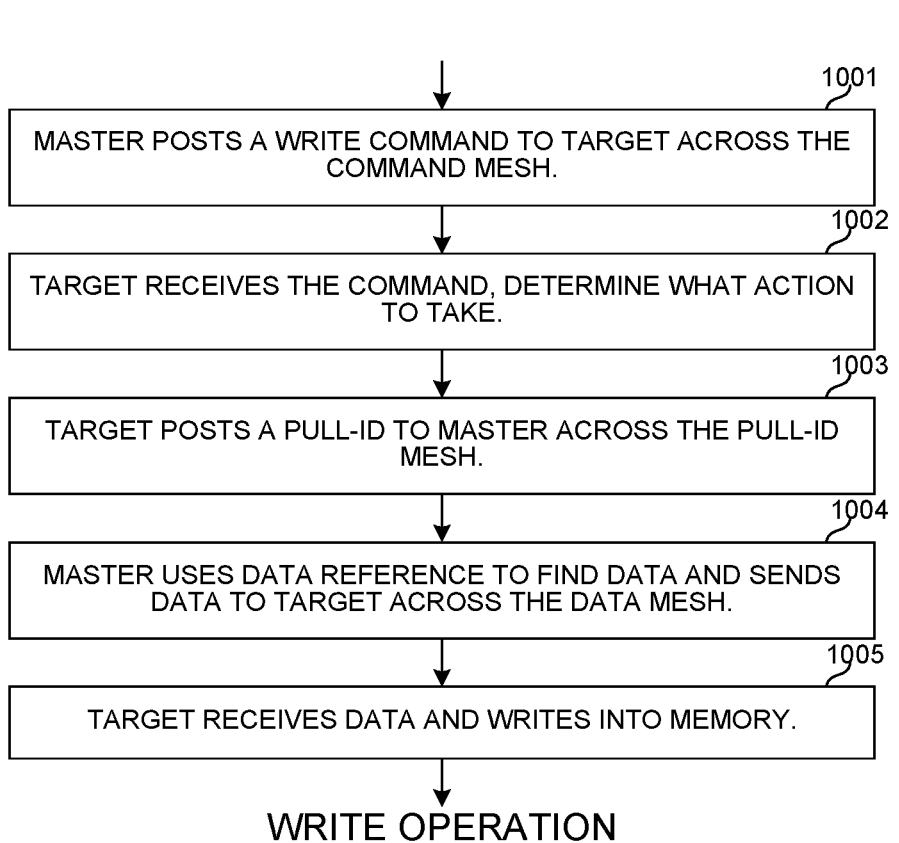
FIG. 17 is a flowchart of a write operation method 1000 that might occur across the configurable mesh CPP data bus.

FIG. 17 is a flowchart of a write operation method 1000 that might occur across the configurable mesh CPP data bus. In a first step (step 1001), certain functional circuitry in one of the islands uses its data bus interface to output a bus transaction value onto the configurable mesh CPP data bus. This functional circuitry is referred to as the "master" of the write operation. The format of the bus transaction value is as set forth in FIG. 18. A bus transaction value 1006 includes a metadata portion 1007 and a payload portion 1008 as shown. The metadata portion 1007 includes a final destination value 1009 and a valid bit 1010.

The bus transaction value in this case is a write command to write data into functional circuitry in another island. The functional circuitry that receives the bus transaction value and the data to be written is referred to as the "target" of the write operation. The write command is said to be "posted" by the master circuit onto the command mesh. As indicated in FIG. 18, the write command includes a metadata portion and a payload portion. The metadata portion includes the 6-bit final destination value. This final destination value identifies an island by number, where the island identified is the final destination of the bus transaction value. The final destination value is used by the various crossbar switches of the command mesh to route the bus transaction value (i.e., the command) from the master circuit to the appropriate target circuit. All bus transaction values on the data bus that originate from the same island that have the same final destination value will traverse through the configurable mesh data bus along the same one path all the way to the indicated final destination island.

A final destination island may have more than one potential target circuit. The 4-bit target field of payload portion indicates which one of these targets in the destination island it is that is the target of the command. The 5-bit action field of the payload portion indicates that the command is a write. The 14-bit data reference field is a reference usable by the master circuit to determine where in the master the data is to be found. The address field indicates an address in the target where the data is to be written. The length field indicates the amount of data.

In a next step (step 1002) in the method of FIG. 17, the target circuit receives the write command from the command mesh and examines the payload portion of the write command. From the action field the target circuit determines that it is to perform a write action. To carry out this action, the target circuit writes (i.e., posts) a bus transaction value (step 1003) called a pull-id onto the pull-id mesh. The pull-id is also of the format indicated in FIG. 18. The payload portion of the pull-id is of the format set forth in FIG. 20. The final destination field of the metadata portion of the pull-id indicates the island where the master circuit is located. The target port field identifies which sub-circuit target it is within the target's island that is the target circuit of the command. The pull-id is communicated through the pull-id mesh back to the master circuit.

The master circuit receives the pull-id from the pull-id mesh and uses the content of the data reference field of the pull-id to find the data. In the overall write operation, the master circuit knows the data it is trying to write into the target circuit. The data reference value that is returned with the pull-id is used by the master circuit as a flag to match the returning pull-id with the write operation the master circuit had previously initiated.

The master circuit responds by sending (step 1004) the identified data to the target across one of the data meshes data0 or data1 as a "pull" data bus transaction value. The term "pull" means that the data of the operation passes from the master to the target. The term "push" means that the data of the operation passes from the target to the master. The format of the "pull" data bus transaction value sent in this sending of data is also as indicated in FIG. 18. The format of the payload portion in the case of the payload being pull data is as set forth in FIG. 22. The first bit of the payload portion is asserted. This bit being a digital high indicates that the transaction is a data pull as opposed to a data push. The target circuit then receives (step 1005) the data pull bus transaction value across the data1 or data0 mesh. The target circuit writes the content of the data field (the data field of FIG. 22) of the pull data payload portion into target memory at the appropriate location indicated by the address field of the original write command.

Figure 24:
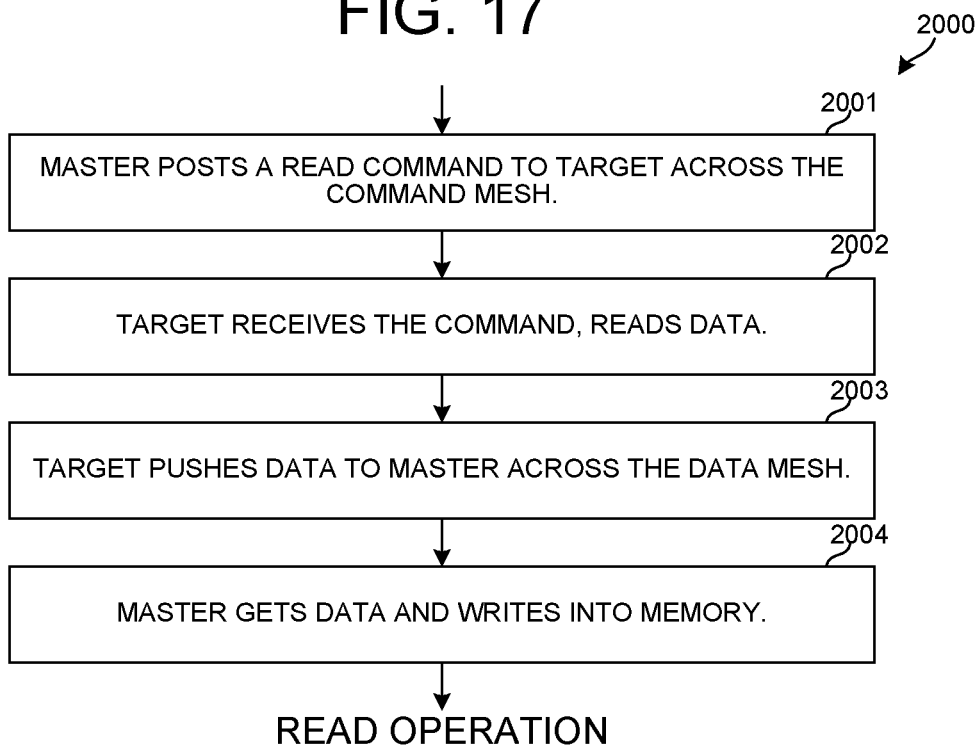
FIG. 24 is a flowchart of a read operation method 2000 that might occur across the configurable mesh CPP data bus.

FIG. 24 is a flowchart of a read operation method 2000 that might occur across the configurable mesh CPP data bus. In a first step (step 2001), a master circuit in one of the islands uses its data bus interface to output (to "post") a bus transaction value onto the command mesh bus of the configurable mesh CPP data bus. In this case, the bus transaction value is a read command to read data from a target circuit. The format of the read command is as set forth in FIGS. 18 and 19. The read command includes a metadata portion and a payload portion. The metadata portion includes the 6-bit final destination value that indicates the island where the target is located. The action field of the payload portion of the read command indicates that the command is a read. The 14-bit data reference field is usable by the master circuit as a flag to associated returned data with the original read operation the master circuit previously initiated. The address field in the payload portion indicates an address in the target where the data is to be obtained. The length field indicates the amount of data.

The target receives the read command (step 2002) and examines the payload portion of the command. From the action field of the command payload portion the target circuit determines that it is to perform a read action. To carry out this action, the target circuit uses the address field and the length field to obtain the data requested. The target then pushes (step 2003) the obtained data back to the master circuit across data mesh data1 or data0. To push the data, the target circuit outputs a push bus transaction value onto the data1 or data0 mesh. FIG. 23 sets forth the format of the payload portion of this push bus transaction value. The first bit of the payload portion indicates that the bus transaction value is for a data push, as opposed to a data pull. The master circuit receives the bus transaction value of the data push (step 2004) from the data mesh bus. The master circuit then uses the data reference field of the push bus transaction value to associate the incoming data with the original read command, and from the original read command determines where the pushed data (data in the date field of the push bus transaction value) should be written into the master circuit. The master circuit then writes the content of the data field of the data field into the master's memory at the appropriate location.

As explained above, the contents of the LUTs of the crossbar switches of the configurable mesh data bus determine how bus transaction values will be routed on their ways to their final destinations. The contents of the LUTs are set so that the configurable mesh data bus contains no loops. For a bus transaction value having a metadata portion indicating a given final destination, and given that this bus transaction value is injected onto a given link, there is only one path through the configurable mesh data bus that the bus transaction value can take to get to its final destination. Having only one path avoids deadlocks. Also, for a given application to which the IB-NFP integrated circuit is to be put, the anticipated traffic from each source of traffic on the chip to each destination of traffic on the chip is determined. For the anticipated traffic over each such source-to-destination path, the routing through the data mesh is configured so that the anticipated traffic will be spread and balanced across the mesh data bus so that no link of the mesh data bus will be overburdened. The configuration information for the LUTs of the crossbar switches is loaded into the various LUTs using the configurable control bus (CB). The LUTs of the configurable mesh data bus are loaded in this way initially at startup of the IB-NFP integrated circuit before any communication across the configurable mesh data bus occurs.

Figure 25:
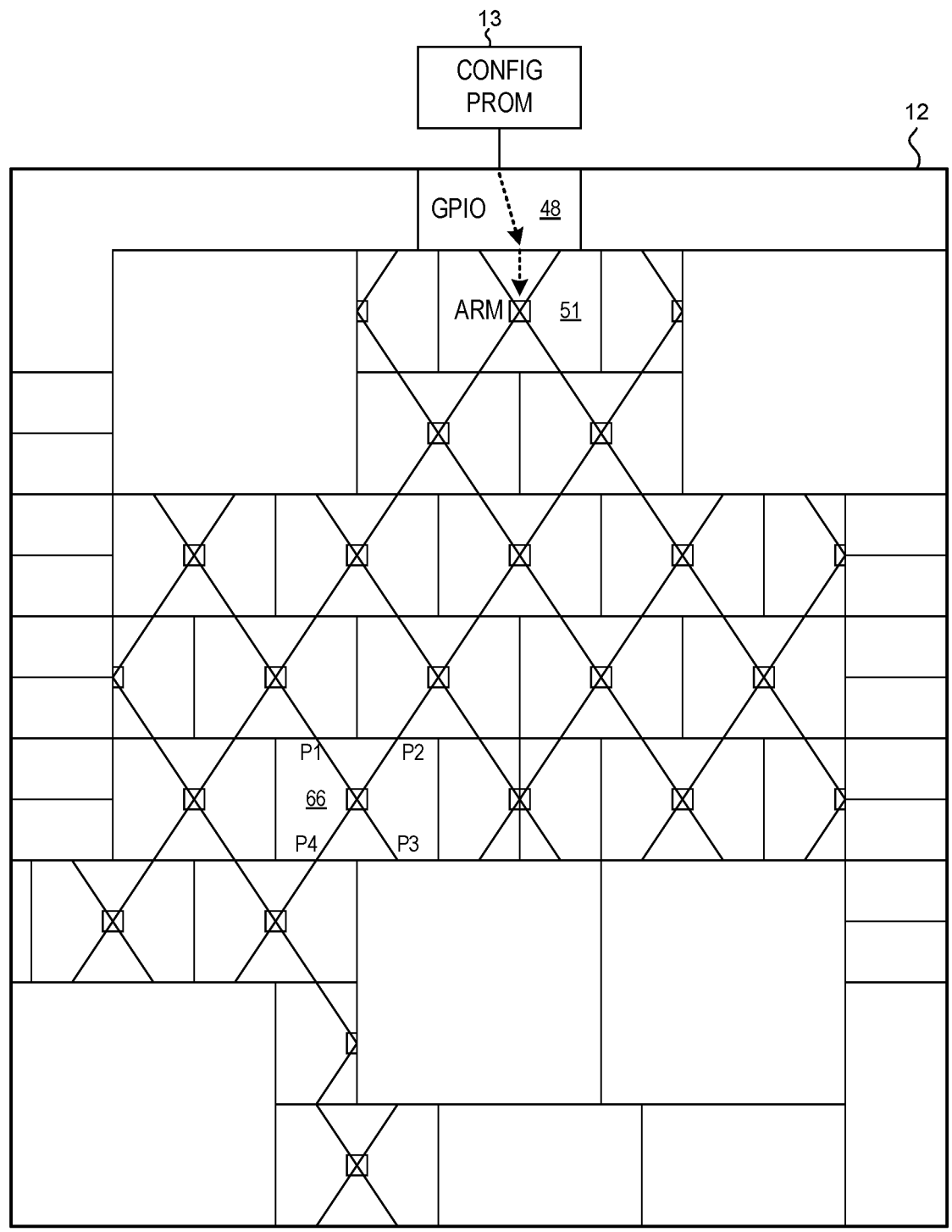
FIG. 25 is a diagram the configurable mesh control bus structure of the IB-NFP integrated circuit 12.

FIG. 25 is a diagram of the configurable mesh control bus structure of the IB-NFP integrated circuit 12. As set forth above in connection with FIG. 8, the configurable mesh control bus structure of each full island involves a centrally located switch, and four duplex half links. A first half link extends from the switch up and to the left to a first port location P1 of the island. A second half link extends from the switch up and to the right to a second port location P2 of the island. A third half link extends from the switch down and to the right to a third port location P3 of the island. A fourth half link extends from the switch down and to the left to a fourth port location P4 of the island. These port locations are marked on island 66. The control bus does not have to communicate high speed data in this example. Information passing across the control bus from one switch of one island to another switch of an adjacent island does not pass through many registers. In other examples, links of the control bus may have pipelining registers in the routes of links between switches, where the pipelining registers are clocked by the 1.0 GHz global clock.

Figure 26:
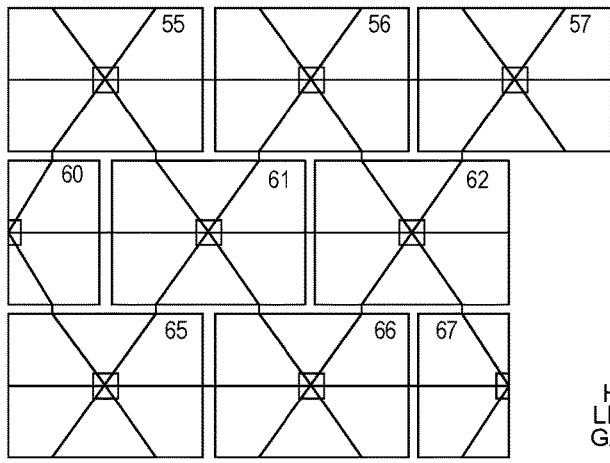
FIG. 26 is a top-down diagram that illustrates the configurable mesh data bus and how the islands do not abut each other in one embodiment.
Figure 27:
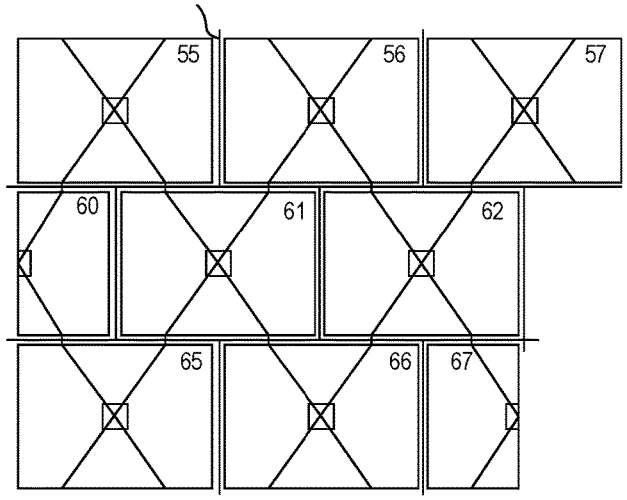
FIG. 27 is a top-down diagram that illustrates the configurable mesh control bus and how the islands do not abut each other in one embodiment.
Figure 28:
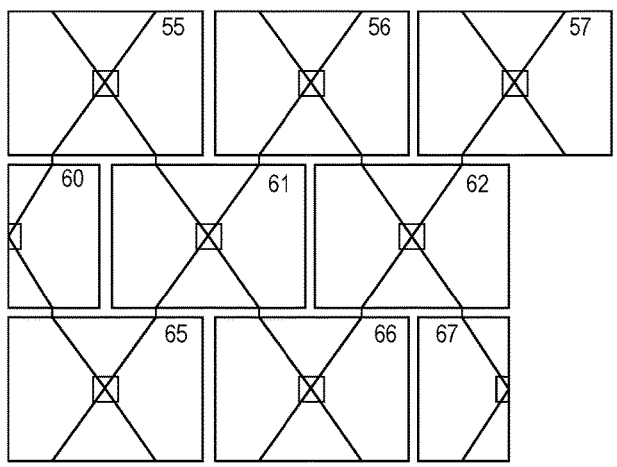
FIG. 28 is a top-down diagram that illustrates the configurable mesh event bus and how the islands do not abut each other in one embodiment.

Although the islands of IB-NFP integrated circuit 12 are illustrated as abutting one another, in some examples there is actually a small interstitial spacing between adjacent islands. FIG. 26 is a top-down diagram of a part of the IB-NFP integrated circuit. FIG. 26 shows the interstitial spacings between islands and shows how the configurable mesh data bus bridges those spacings. FIG. 27 is a top-down diagram of the same part of the IB-NFP integrated circuit. FIG. 27 shows the interstitial spacings between islands and shows how the configurable control bus bridges those spacings. FIG. 28 is a top-down diagram of same part of the IB-NFP integrated circuit. FIG. 28 shows the interstitial spacings between islands and shows how the configurable mesh event bus bridges those spacings.

Figure 29:
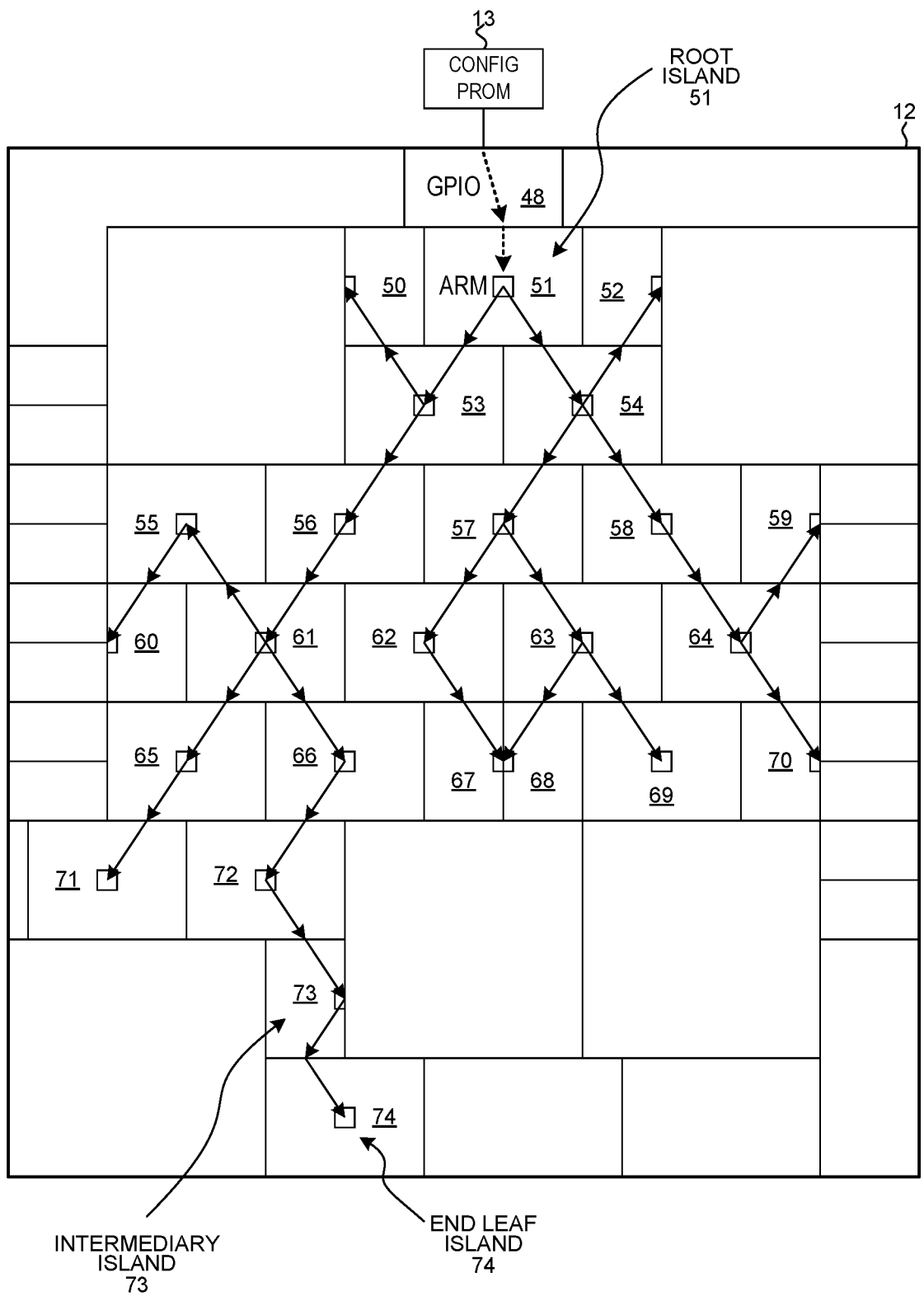
FIG. 29 is a top-down diagram of the configurable mesh control bus structure of the IB-NFP integrated circuit 12 configured to form a tree structure.

FIG. 29 is a top-down diagram of the configured configurable mesh control bus structure of the IB-NFP integrated circuit 12. The configurable mesh control bus structure is configured to form a tree structure. The source or root of the tree structure is the functional circuitry in the ARM island 51. The arrows on the various half links of the control bus in the illustration of FIG. 29 indicate how configuration information flows through the tree structure. Configuration information flows from the ARM island 51 and down through intermediary islands 53-58, 61-66, 72 and 73 of the branch structure and to the end leaf islands 50, 52, 59, 60, 67, 68, 70, 71, 74 of the tree structure, but configuration information cannot flow in the reverse direction toward the ARM island 51. Configuration information for loading the LUTs of the crossbar switches of the configurable mesh data bus is stored in external configuration PROM 13. After power up of the IB-NFP integrated circuit 12, functional circuitry in the ARM island 51 reads this configuration information out of external configuration PROM 13 via GPIO interface block 48. The configuration information for a given LUT is then communicated down through the whole tree. The appropriate crossbar switch of the island of which the LUT is a part will match a selection field portion of the configuration information with its hard-wired island number. Each island is provided with a hard-wire island number. The island uses the hard-wire island number to examine information of the control bus and to determine which configuration has an associated selection field portion destined for the island number. When such a match occurs, the identified configuration information is loaded into the LUTs of the island. The configuration of the configurable control bus into the tree structure is statically determined by hardwired tie off connections. The configuration of the control bus is therefore set at the time of chip manufacture.

Figure 30:
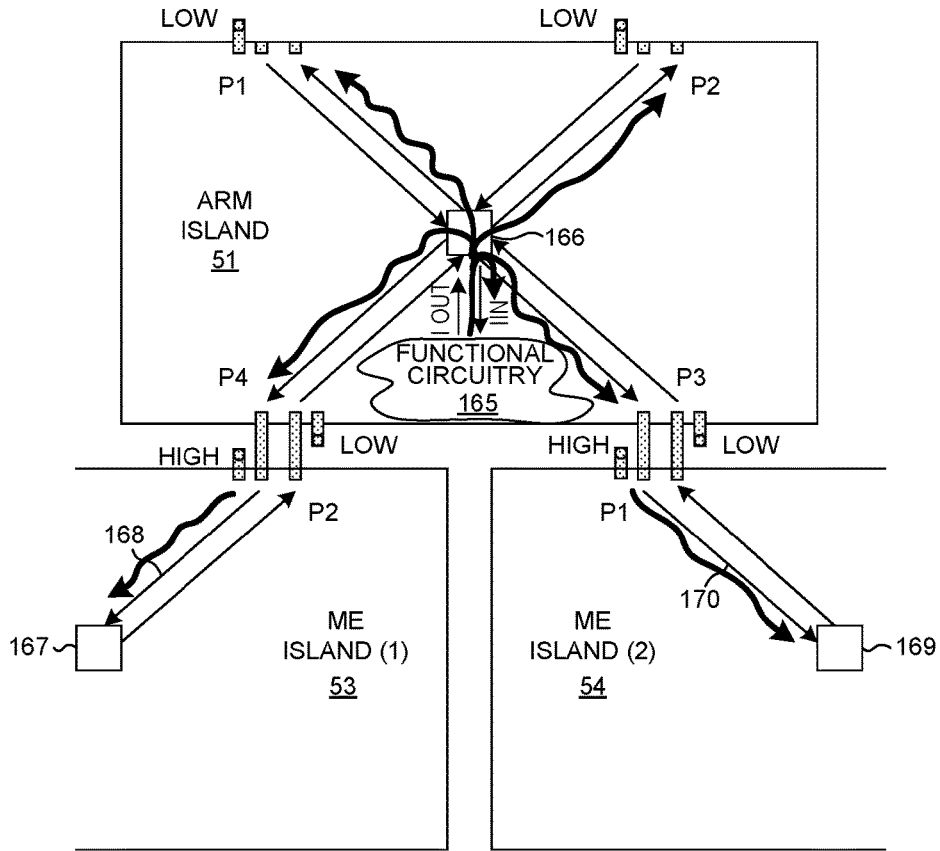
FIG. 30 is a simplified top-down diagram of the control bus portion of the ARM island 51 and parts of ME island 53 and ME island 54.

FIG. 30 is a simplified top-down diagram of the control bus portion of ARM island 51 and parts of ME island 53 and ME island 54. Each half link has an associated tie off input conductor that can be either tied to a digital logic high voltage or to a digital logic low voltage. If the tie off conductor is tied to a digital high, then the associated input half link portion is configured to receive control information into the island through that port location. If the tie off conductor is tied to a digital low, then the associated input half link portion is configured to output control information from the central switch. In the example of FIG. 30, the tie offs for the input ports P1, P2, P3 and P4 for the control bus of ARM island 51 are all tied low. The source of control information is therefore the functional circuitry 165 of the island 51. Regardless of the source, the control information is output to each of the output ports of the island by the control bus half links. The control information is also supplied to the functional circuitry via the output port that couples to the functional circuitry 165. The control information originates from configuration PROM 13, flows through GPIO interface block 48, and through functional circuitry 165 of ARM island 51, and through switch 166, and out to the four output ports P1, P2, P3 and P4 (and also back to the functional circuitry 165). Ports P1 and P2 are not coupled to another island so that fact that the configuration information flows out to these output ports is of no moment. The configuration information that flows out to output port P4, however, flows into ME island 53 through input port P2 of island 53, through half link portion 168, and to switch 167. The tie off associated with input port P2 of ME island 53 is tied high. This configures port P2 of ME island 53 to be the source of configuration information for the ME island. At most one tie off of one port of an island can be tied high. If no tie off is tied high, then the source for the configuration information is the functional circuit of the island.

Likewise, the configuration information flows out of port P3 of ARM island 51 and into input port P1 of ME island 54, through half link portion 170, and to central switch 169. The tie off associated with input port P1 of ME island 54 is tied high. This configures port P1 of ME island 54 to be the source of configuration information for the ME island 54.

Figure 31:
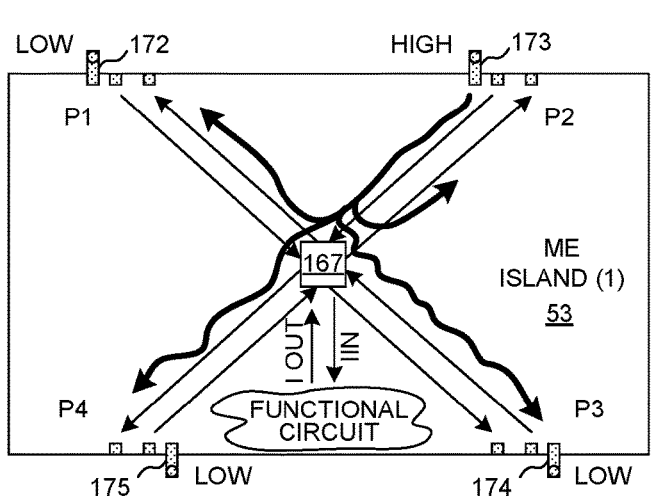
FIG. 31 is a diagram that shows how configuration information flows into and through ME island 53.

FIG. 31 is a diagram that shows how configuration information flows into and through ME island 53. As described above in connection with FIG. 30, the configuration information flows into port P2 of ME island 53 and to switch 167. The tie off for port P2 of island 53 is tied high and as a result this input port is configured to be the source of the configuration information for the island. The configuration information is output to all ports and to the functional circuitry of the island. In this way, the control bus structure of each island is hardwire-configured with tie offs such that the control bus structure of the overall IB-NFP integrated circuit 12 is configured to form the tree structure as illustrated in FIG. 29.

Figure 32:
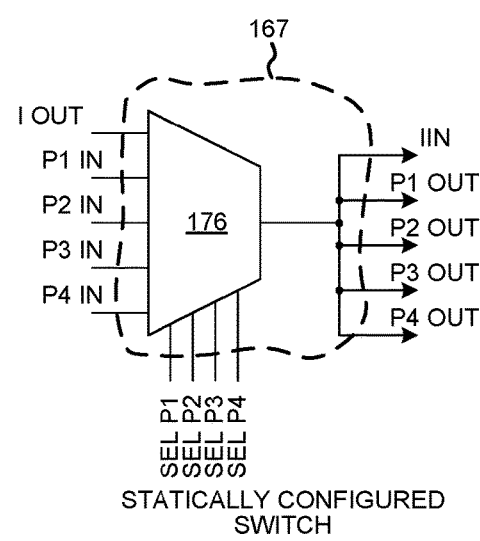
FIG. 32 is a simplified diagram of the central switch of the control bus structure of an island.

FIG. 32 is a simplified diagram of the central switch of the control bus structure of an island. The labels P1_IN, P2_IN, P3_IN and P4_IN indicate the input half link portions of the island at input ports P1, P2, P3 and P4 that are possible sources of configuration information for the island. Configuration information present at any one of these input ports, or on the output IOUT of the functional circuitry of the island, is multiplexed by multiplexer 176 onto all the output half link portions of the island: P1_OUT, P2_OUT, P3_OUT, P4_OUT, and onto the input IIN of the functional circuitry of the island. Which one of the input ports (or the functional circuitry) it is that will be the source of the configuration information is determined by the tie off signal values SEL_P1, SEL_P2, SEL_P3 and SEL_P4. SEL_P1 is the tie off value at input port P1. The tie off signal SEL_P2 is the tie off value at input port P2. The tie off signal SEL_P3 is the tie off value at input port P3. The tie off signal SEL_P4 is the tie off value at input port P4. Each full island in the IB-NFP integrated circuit 12 has four such tie offs. If none of the tie offs is tied high, then the source of configuration information is the IOUT from the functional circuitry of the island. In one example, power and ground conductors extending in upper layer metal extend through the interstitial space between adjacent islands, and each tie off tab conductor of the island is coupled up to one of these conductors by an appropriate vertically extending conductive via. The tie off tab conductors are illustrated in FIG. 31 as rectangular tab structures 172-175. The round circle seen in each of the tab conductors represents the vertically-extending conductive via that couples the tab conductor to either a power conductor or a ground conductor in the metal layers above.

Figure 33:
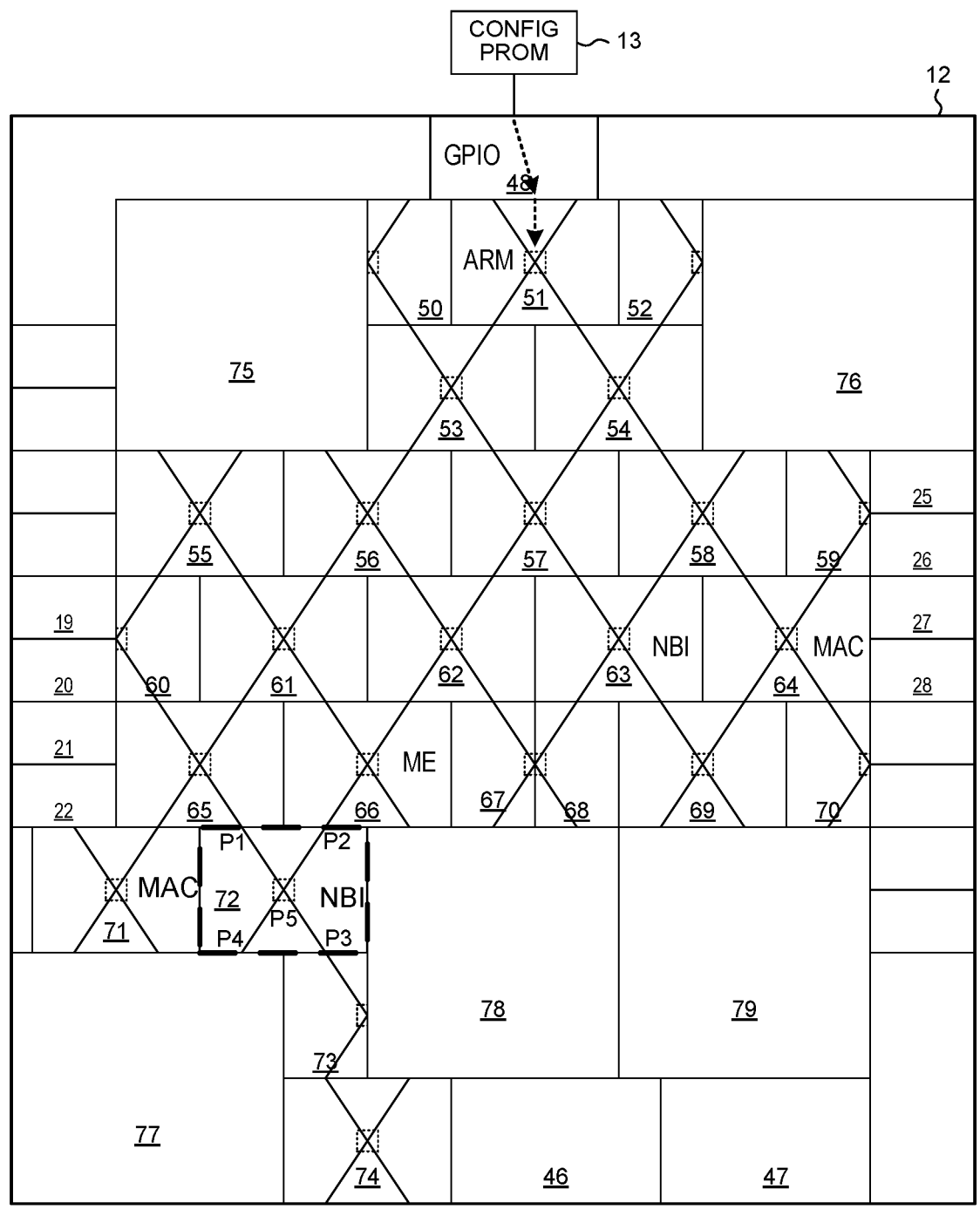
FIG. 33 is a diagram of the configurable mesh event bus structure of the IB-NFP integrated circuit 12.

FIG. 33 is a configurable mesh event bus structure of the IB-NFP integrated circuit 12. From the top-down view shown in FIG. 33 four port locations are visible on the top overlay layer; however, each island also has a half link portion extending down into each island coupling the Real Time Configurable Switch (RTCS) to functional circuitry within the island. For example, ingress NBI island 72 is an island with four half link portions coupling four port locations (P1-P4) on the top overlay layer to the RTCS; however, ingress NBI island 72 also has a fifth half link portion coupling the RTCS to functional circuitry within the ingress NBI island 72. As set forth above in connection with FIG. 9, the configurable mesh event bus structure of each full island involves a centrally located RTCS, and five duplex half links. A first half link extends from the RTCS up and to the left to a first port location P1 of the island. A second half link extends from the RTCS up and to the right to a second port location P2 of the island. A third half link extends from the RTCS down and to the right to a third port location P3 of the island. A fourth half link extends from the RTCS down and to the left to a fourth port location P4 of the island. A fifth half link extends from the RTCS down to the functional circuitry within the island. These port locations are marked on ingress NBI island 72 in FIG. 33.

Figure 34:
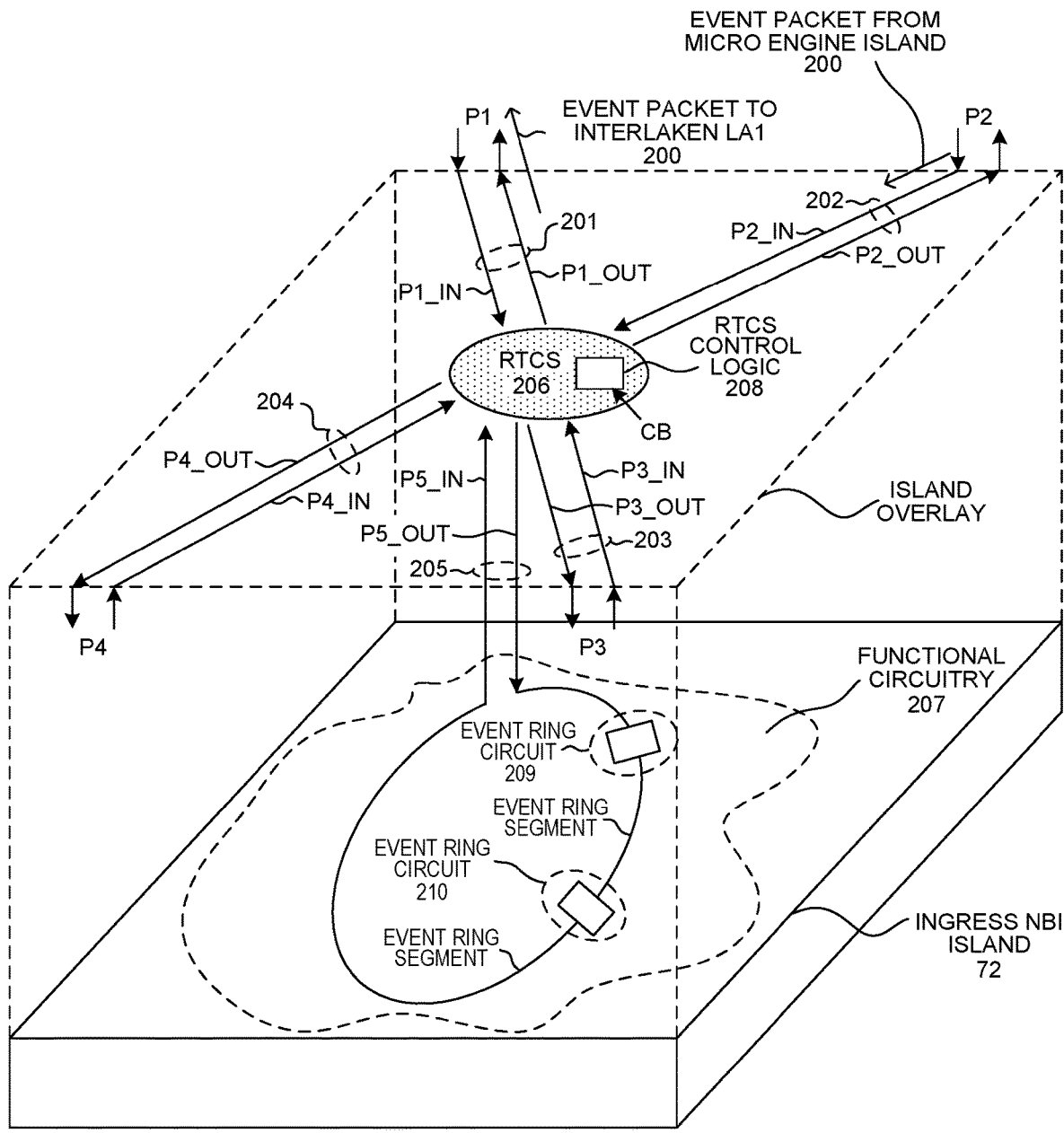
FIG. 34 is a simplified perspective view of the local event ring within NBI island 72.

FIG. 34 is a perspective view of the local event ring within NBI island 72. As discussed above, the ingress NBI island 72 includes four half links (201-204) and a centrally located Real Time Configurable Switch (RTCS) 206. RTCS 206 may also be referred to as a "switch". Half link 201 includes a half link portion P1_IN that can communicate information from port location P1 to RTCS 206 and a half link portion P1_OUT that can communicate information from switch 206 to port location P1. Half link 202 includes a half link portion P2_IN that can communicate information from port location P2 to RTCS 206 and a half link portion P2_OUT that can communicate information from RTCS 206 to port location P2. Half link 203 includes a half link portion P3_IN that can communicate information from port location P3 to RTCS 206 and a half link portion P3_OUT that can communicate information from RTCS 206 to port location P3. Half link 204 includes a half link portion P4_IN that can communicate information from port location P4 to RTCS 206 and a half link portion P4_OUT that can communicate information from RTCS 206 to port location P4. Link 205 includes a link portion P5_IN that can communicate information from functional circuitry 207 within the ingress NBI island 72 to RTCS 206 and a link portion P5_OUT that can communicate information from RTCS 206 to functional circuitry 207 within the NBI island 72. A RTCS control logic 208 is coupled to RTCS 206. The RTCS control logic 208 includes instructions associated with each half link portion coupled to RTCS 206. The RTCS control logic 208 controls which inputs to RTCS 206 are coupled to which outputs of RTCS 206. The RTCS control logic 208 is programmed via the configurable mesh control bus (CB). The configurable mesh control bus (CB) is coupled to the RTCS control logic 208. In one embodiment, the RTCS control logic 208 in each island is programmed once via the configurable mesh control bus upon powering on the IB-NFP integrated circuit 12. In another, embodiment, the RTCS control logic 208 in each island is programmed not only upon powering on the IB-NFP integrated circuit 12, but also at another time during subsequent operation of the IB-NFP integrated circuit 12.

Functional circuitry 207 includes a first event ring circuit 209 and a second event ring circuit 210. Link portion P5_OUT couples to an input terminal of event ring circuit 209 via a first event ring segment. An output terminal of event ring circuit 209 couples to an input terminal of event ring circuit 210 via a second event ring segment. An output of event ring circuit 210 couples to link portion P5_IN via a third event ring segment. Event ring circuit 209 is described in FIG. 36. Event ring circuit 210 is described in FIG. 37. The event packet 200 is further described in FIG. 38A and FIG. 38B. Vacancy indicator bit 239, source of event 240, and type of event 241 form a sort of header of the event packet, and event data 242 is a payload of the event packet.

In operation, an event packet 200 is communicated to RTCS 206 via an input half link. RTCS 206 then communicates the event packet 200 via another half link portion according to the instructions stored in RTCS control logic 208. For example, event packet 200 from the ingress ME 66 may be communicated via half link portion P2_IN to RTCS 206 as illustrated in FIG. 34. RTCS 206 then may communicate the event packet 200 via another half link portion to any one of the four port locations or to the functional circuitry 207 within the NBI island 72. The RTCS 206 is configured, via RTCS control logic 208, to couple half link portion P2_IN to link portion P5_OUT. The RTCS 206 is also configured to couple link portion P5_IN to half link portion P1_OUT. The event packet 200 is communicated from port location P2 to RTCS 206 via half link portion P2_IN. The event packet 200 is communicated from RTCS 206 to functional circuitry 207 via link portion P5_OUT. The event packet 200 is then communicated from link portion P5_OUT to the input terminal of event ring circuit 209 via an event ring segment. The event packet 200 is then communicated from the output terminal of event ring circuit 209 to the input terminal of event ring circuit 210 via an event ring segment. The event packet 200 is then communicated from the output terminal of event ring circuit 210 to link portion P5_IN via an event ring segment. The event packet 200 is then communicated to RTCS 206 via link portion P5_IN. The event packet 200 is then communicated to port location P1 from RTCS 206 via half link portion P1_OUT. The event packet 200 is then communicated through port location P1 to Interlaken LA(1) island 65.

Alternatively, RTCS 206, via RTCS control logic 208, may be configured such that half link portion P1_IN is coupled directly to half link portion P2_OUT. Therefore, event packet 200 from ME island 66 would not be communicated to functional circuitry 207, but rather would be directly communicated to port location P1 and subsequently Interlaken LA(1) island 65. This alternative may be used to connect a local event ring through one island without making the functional circuitry of the said one island part of the local event ring.

A global clock signal is not shown in FIG. 34; however, a global clock signal is coupled to RTCS 206, event ring circuit 209, and event ring circuit 210. The global clock signal may be a variety of different frequencies. In one embodiment, the global clock is a one gigahertz signal and is coupled to all local event ring circuitry. Depending on the frequency of global clock signal intermediate registers, or "slots", may be required to address propagation delay in sending event packets between various event ring circuits. In an embodiment, a slot may be coupled in series at multiple locations along the local event ring. For example, one or more slots may be coupled in series along a half link portion or between local event ring circuits.

Figure 35:
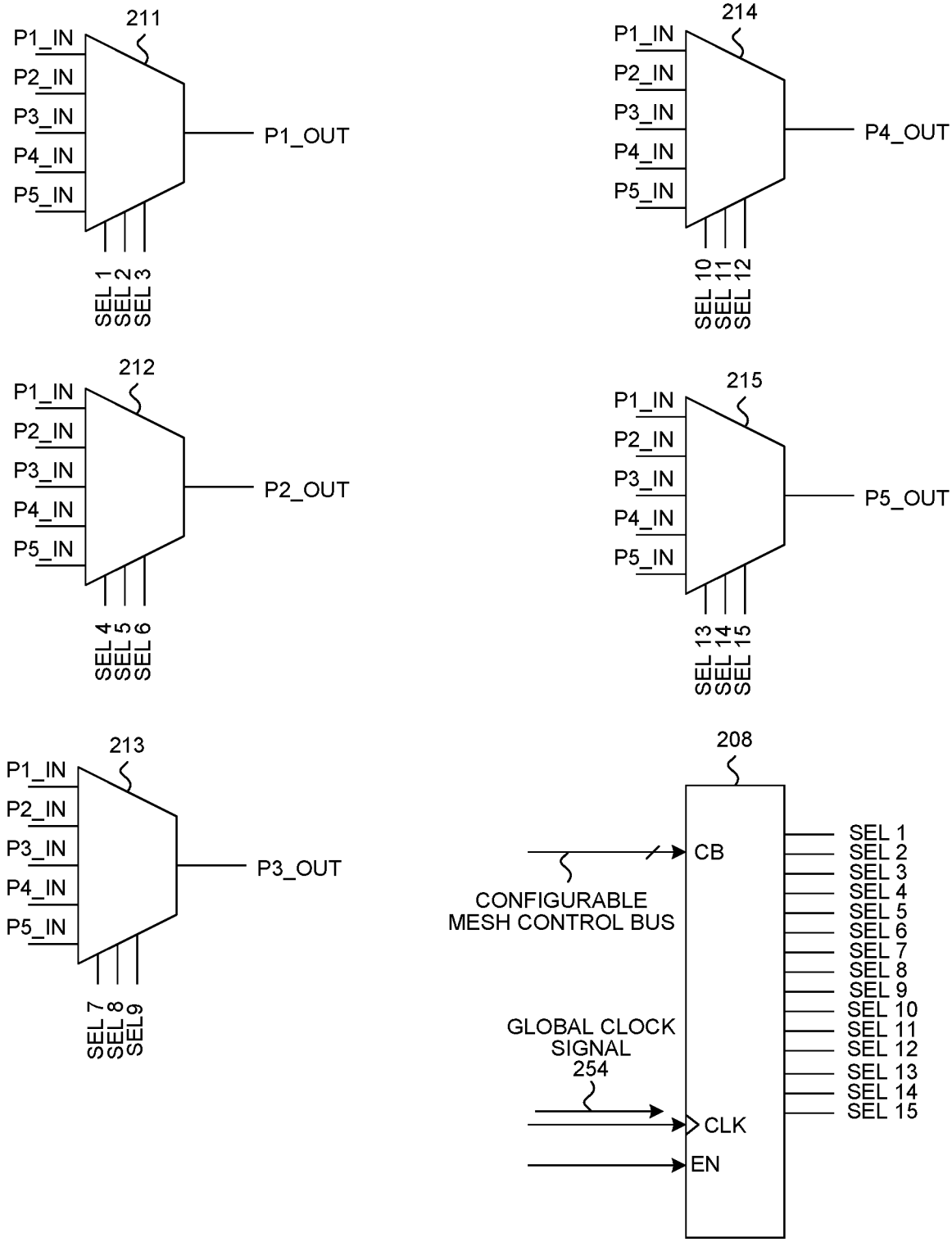
FIG. 35 is a functional diagram of the RTCS 206 shown in FIG. 34.

FIG. 35 is a functional diagram of the RTCS 206 shown in FIG. 34. RTCS 206 includes five multiplexers (211-215) and RTCS control logic 208. RTCS 206 has five inputs P1_IN, P2_IN, P3_IN, P4_IN and P5_IN. RTCS 206 has five outputs P1_OUT, P2_OUT, P3_OUT, P4_OUT, and P5_OUT. Each output has an independent multiplexer (211-215), which couples one of the five inputs to a single output terminal of each multiplexer. Each multiplexer is controlled by an individual set of select control lines (SEL1-SEL15). In one embodiment, each multiplexer has three select control lines. Three controls lines results in the ability to control up to eight possible multiplexer inputs. RTCS control logic 208 has a clock input (CLK), an enable input (EN), a configurable mesh control bus input, and fifteen select control outputs (SEL 1-15). Configuration information is communicated via the configurable mesh control bus to RTCS control logic 208. RTCS control logic 208 sources a signal on select control outputs (SEL 1-15) based upon the configuration information. Three select control lines (SEL 1-3) are coupled to multiplexer 211. Three select control lines (SEL 4-6) are coupled to multiplexer 212. Three select control lines (SEL 7-9) are coupled to multiplexer 213. Three select control lines (SEL 10-12) are coupled to multiplexer 214. Three select control lines (SEL 13-15) are coupled to multiplexer 215. The three signals communicated to a multiplexer and control which, if any, of the multiplexer inputs are coupled to the multiplexer output. In one embodiment, the signal on a select control line may be a logic low or high signal, meaning that the voltage applied to the control line be above or below a threshold voltage.

In operation, configuration information is communicated to RTCS control logic 208 via the configurable mesh control bus. According to the configuration information received, RTCS control logic 208 sources an independent signal on each select control line (SEL1-15). The signals are coupled to respective multiplexers as described above. In response to the signal received via select control lines, each multiplexer couples one of its inputs to the output terminal of the multiplexer or leaves the output terminal in a floating state.

Figure 36:
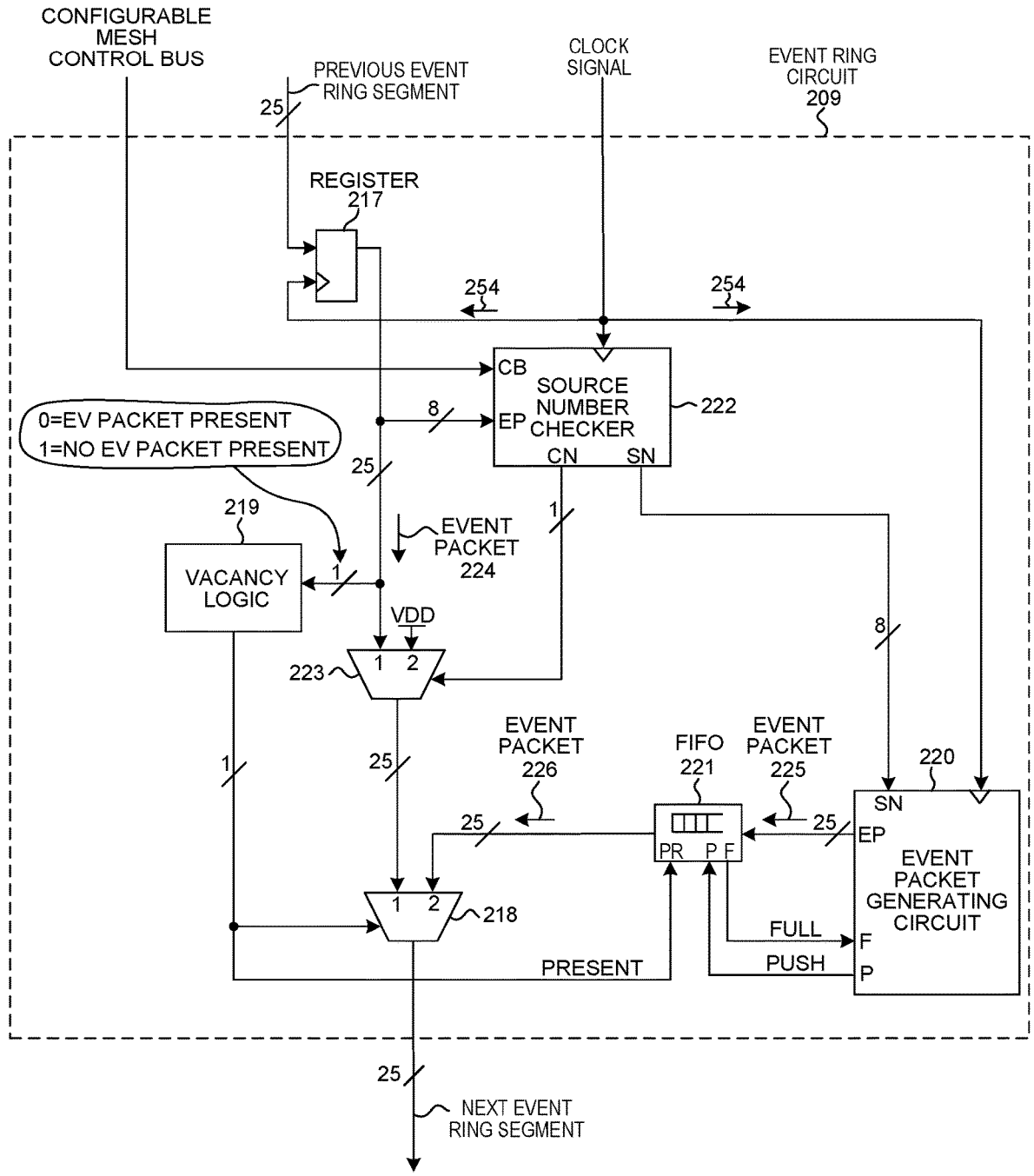
FIG. 36 is a more detailed block diagram of event ring circuit 209 shown in FIG. 34.

FIG. 36 is an expanded diagram of event ring circuit 209 shown in FIG. 34. Event ring circuit 209 includes register 217, multiplexer 218, vacancy logic 219, event packet generating circuit 220, First In First Out circuit (FIFO) 221, source number checker 222, and multiplexer 223. A previous local event ring segment is coupled to the data input terminal of register 217. A global clock signal 254 is coupled to the clock input terminal of register 217. The output terminal of register 217 couples to a first input terminal of multiplexer 223, to an event packet input terminal (EP) of source number checker 222 and to an input terminal of vacancy logic 219. A second input terminal of multiplexer 223 is coupled to a logic high signal, such as a voltage source. An output terminal of multiplexer 223 is coupled to a first input terminal of multiplexer 218. An output terminal of vacancy logic 219 is coupled to a selector input terminal of multiplexer 218. The output terminal of vacancy logic 219 is also coupled to a present input terminal (PR) of FIFO 221. A global clock signal 254 is coupled to the clock input terminal of source number checker 222. The configurable mesh control bus is coupled to a control bus input terminal (CB) of source number checker 222. A control output terminal (CN) of source number checker 222 is coupled to a selector input terminal of multiplexer 223. A source number output terminal (SN) of source number checker 222 is coupled to a source number (SN) input terminal of event packet generating circuit 220. A global clock signal 254 is coupled to the clock input terminal of event packet generating circuit 220. An event packet output terminal (EP) of event packet generating circuit 220 is coupled to a data input terminal of FIFO circuit 221. A push output terminal (P) of event packet generating circuit 220 is coupled to a push input terminal (P) of FIFO 221. A full (F) output control terminal of FIFO 221 is coupled to a full (F) input terminal of event circuit generating circuit 220. A data output terminal of FIFO circuit 221 is coupled to a second input terminal of multi-plexer 218. An output terminal of multiplexer 218 is coupled to the next segment of the event ring.

In operation, event packet generating logic 220 creates event packets to be inserted into a local event ring. Event packets created by event packet generating circuit 220 represent events which occurred within the island where the event ring circuit is located. In the embodiment illustrated in FIG. 36, event packet generating circuit 220 creates event packets representing events which occurred in NBI island 72. The event packet 225 created by event packet generating logic 220 is communicated to FIFIO 221. FIFO 221 acts as a buffer to store event packets until the event packets can be inserted into the local event ring. Event packets can only be inserted into the local event ring when the previous event ring segment is carrying no event packet. The event packet generating circuit 220 communicates a signal from the push output terminal (P) of the event packet generating circuit 220 to the push input terminal (P) of FIFO 221 when the event packet generating circuit 220 is communicating an event packet from the event packet output terminal (EP) to the data input terminal of FIFO 221. FIFO 221 has a finite memory size. In the event that FIFO 221 memory is full, no additional event packets from event packet generating circuit 220 may be stored in FIFO 221. A signal indicating that the FIFO 221 is full is communicated from the full output terminal (F) of FIFO 221 to the full input terminal (F) of event packet generating circuit 220. FIFO 221 always outputs a value; however, if no event packets are stored in FIFO 221 an output value with a first bit set to one (1) is communicated to the second terminal of multiplexer 218.

A first value is clocked into register 217 from the previous event ring segment. The first value is then communicated from the output of register 217 to the input terminal of vacancy logic 219, the event packet input terminal (EP) of source number checker 222, and the first input terminal of multiplexer 223.

Vacancy logic 219 receives the first bit of the first value communicated from register 217. The first bit of the first value indicates if an event packet it present on the segment. The first bit is one (1) if the event ring segment is carrying no event packet. The first bit of the first value is zero (0) if an event packet is present on the event ring segment.

Source number checker 222 receives an assigned source number from the configurable mesh control bus via the control bus input terminal (CB). The assigned source number is a number that is unique to event ring circuit 209. All event packets inserted into a local event ring by event ring circuit 209 will have a "source of event" field that indicates the source number assigned to event ring circuit 209. In one embodiment, the "source of event" filed is eight bits wide. An event packet bit sequence map and table is provided in FIG. 38A and FIG. 38B. Source number checker 222 communicates the assigned source number from the source number output terminal (SN) of source number checker 222 to the source number input terminal (SN) of event packet generating circuit 220. Event packet generating circuit 220 uses the source number information received from source number checker 222 to fill in the "source of event" field in new event packets.

Source number checker 222 also receives eight bits of the first value via the event packet input terminal (EP). The eight bits make up the "source of event" field and indicate which event ring circuit in the local event ring inserted the value. The source number checker 222 compares the received eight bits with the eight bit source number assigned to event ring circuit 209 via the configurable mesh control bus. When the eight bits representing the assigned source number are the same as the received eight bits of the first value, the source number checker 222 communicates a signal from control output terminal (CN) to the selector input terminal of multiplexer 223, such that multiplexer 223 couples the second input terminal of multiplexer 223 to the output terminal of multiplexer 223. The result is that source number checker 222 couples the logic high signal to the output terminal of multiplexer 223 when the eight source of event bits match, and that the source number checker 222 couples the output of register 217 to the output of multiplexer 223 when the eight source of event bits do not match. Coupling the logic high signal to the output terminal of multiplexer 223 has the effect of passing no event packet to the first input terminal of multiplexer 218. Source number checker 222 also receives a global clock signal 254 via the clock input terminal. The source number checker 222 transmits and receives communications during transitions of the global clock signal.

Vacancy logic 219 receives the first bit of the first value communicated from register 217. The first bit of the first value is one (1) if no event packet is present. The first bit of the first value is zero (0) if an event packet is present.

When an event packet 224 is present, the first bit of the first value is a zero (0) and vacancy logic 219 will communicate a control signal to the selector input terminal of multiplexer 218 so that multiplexer 218 will couple the first input terminal of multiplexer 218 to the output terminal of multiplexer 218. The vacancy logic 219 will also communicate a control signal to the present input terminal (PR) of FIFO 221 so that FIFO 221 will not communicate an event packet to the second input terminal of multiplexer 218. Therefore, when the first bit of the first signal is zero (0) either the event packet 224 or the logic high signal will be coupled to the next event ring segment. Whether the event packet 224 or the logic high signal is coupled to the next event ring segment depends on the signal communicated from the control output terminal (CN) of source number checker 222. If the first bit of the first value is zero (0) and the received source number does not match the assigned source number, then event packet 224 will be coupled to the next event ring segment. If the first bit of the first value is zero (0) and the received source number does match the assigned source number, then the logic high signal will be coupled to the next event ring segment. Coupling the logic high signal to the next event ring segment has the effect of deleting event packet 224 from the local event ring and inserting no event packet in the local event ring.

When, on the other hand, an event packet is not present, the first bit of the first value is one (1) and vacancy logic 219 will communicate a control signal to the selector input terminal of multiplexer 218 so that multiplexer 218 will couple the second input terminal of multiplexer 218 to the output terminal of multiplexer 218. The vacancy logic 219 will also communicate a control signal to the present input terminal (PR) of FIFO 221 so that FIFO 221 will communicate event packet 226 to the second input terminal of multiplexer 218. Therefore, when the first bit of the first value is a one (1) the next event packet 226 stored in FIFO 221 will be coupled to the next event ring segment.

The configurable mesh control bus is coupled to the control bus input terminal (CB) of source number checker 222. Source number checker 222 may be assigned a source number via the configurable mesh control bus. In one embodiment, source number checker 222 is assigned a source number once upon powering on the IB-NFP integrated circuit 12. In another embodiment, source number checker 222 is assigned a first source number upon powering on the IB-NFP integrated circuit 12 and a second source number, replacing the first source number, during subsequent operation of the IB-NFP integrated circuit 12.

Figure 37:
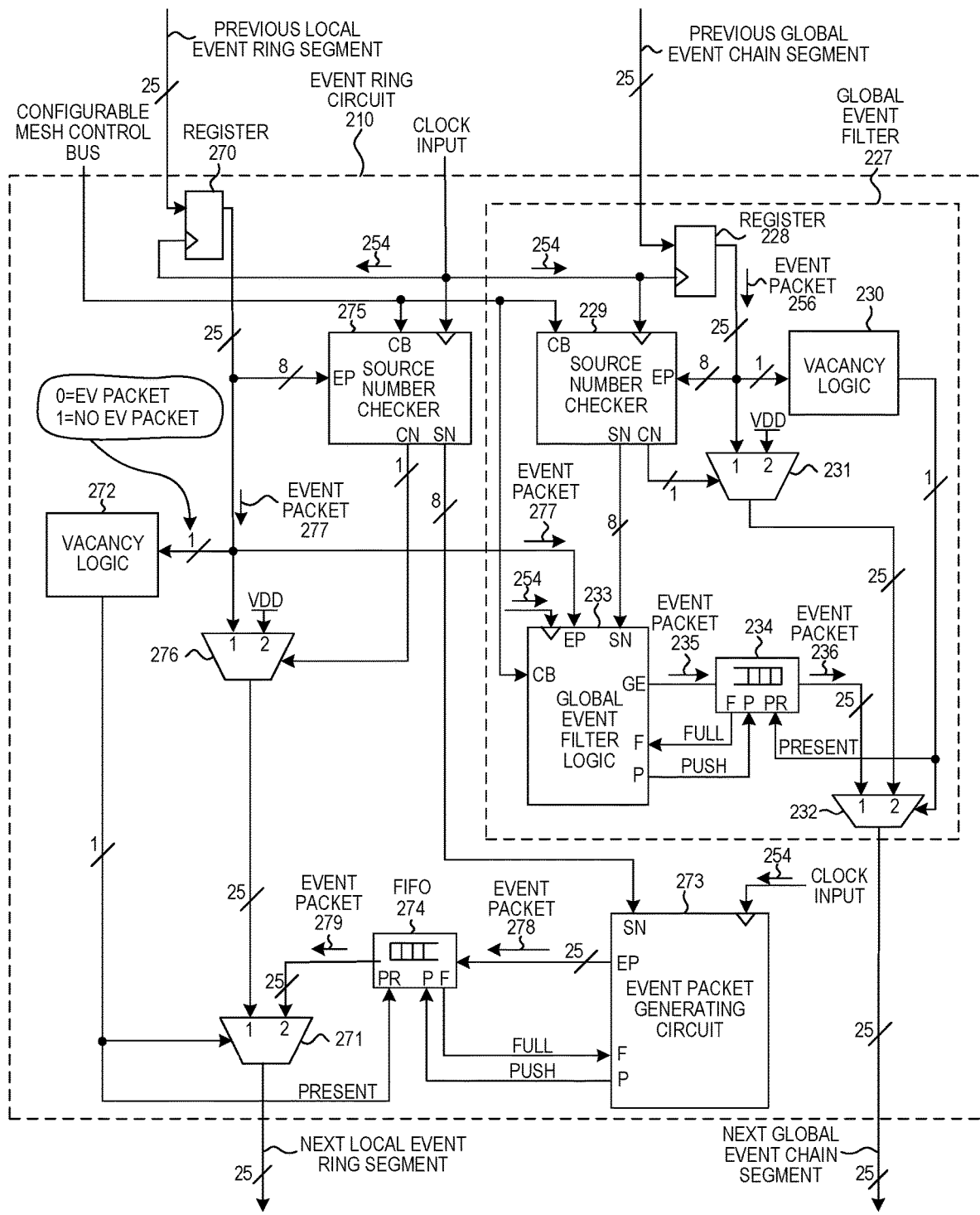
FIG. 37 is a more detailed diagram of event ring circuit 210 of FIG. 34.

FIG. 37 is an expanded diagram of event ring circuit 210 shown in FIG. 34. Event ring circuit 210 includes a global event filter 227 in addition to the items included in event ring circuit 209. Event ring circuit 210 includes register 270, multiplexer 271, vacancy logic 272, event packet generating circuit 273, First In First Out circuit (FIFO) 274, source number checker 275, multiplexer 276, and global event filter 227. Global event filter 227 includes register 228, source number checker 229, vacancy logic 230, multiplexer 231, multiplexer 232, global event filter logic 233, and FIFO 234.

A previous local event ring segment is coupled to the data input terminal of register 270. A global clock signal 254 is coupled to the clock input terminal of register 270. The output terminal of register 270 couples to a first input terminal of multiplexer 276, to an event packet input terminal (EP) of source number checker 275 and to an input terminal of vacancy logic 272. A second input terminal of multiplexer 276 is coupled to a logic high signal, such as a voltage source. An output terminal of multiplexer 276 is coupled to a first input terminal of multiplexer 271. An output terminal of vacancy logic 272 couples to a selector input terminal of multiplexer 271. The output terminal of vacancy logic 272 also couples to a present input terminal (PR) of FIFO 274. A global clock signal 254 is coupled to the clock input terminal of source number checker 275. The configurable mesh control bus is coupled to a control bus input terminal (CB) of source number checker 275. A control output terminal (CN) of source number checker 275 is coupled to a selector input terminal of multiplexer 276. A source number output terminal (SN) of source number checker 275 is coupled to a source number (SN) input terminal of event packet generating circuit 273. A global clock signal 254 is coupled to the clock input terminal of event packet generating circuit 273. An event packet output terminal (EP) of event packet generating circuit 273 is coupled to a data input terminal of FIFO circuit 274. A push output terminal (P) of event packet generating circuit 273 is coupled to a push input terminal (P) of FIFO 274. A full (F) output control terminal of FIFO 274 is coupled to a full (F) input terminal of event circuit generating circuit 273. A data output terminal of FIFO circuit 274 is coupled to a second input terminal of multiplexer 271. An output terminal of multiplexer 271 is coupled to the next segment of the event ring.

Within global filter 227, a previous global event chain segment is coupled to the data input terminal of register 228. The output terminal of register 228 is coupled to a first input terminal of multiplexer 231, an event packet input terminal (EP) of source number checker 229, and an input terminal of vacancy logic 230. A global clock signal 254 is coupled to the clock input terminal of register 228. A second input terminal of multiplexer 231 is coupled to a logic high signal, such as a voltage source. An output terminal of multiplexer 231 is coupled to a second input of multiplexer 232. An output terminal of vacancy logic 230 couples to a selector input terminal of multiplexer 232. A global clock signal 254 is coupled to the clock input of source number checker 229. The configurable mesh control bus is coupled to the control bus input terminal (CB) of source number checker 229. A control output terminal (CN) of source number checker 229 is coupled to a selector input terminal of multiplexer 231. A source number output terminal (SN) of source number checker 229 is coupled to a source number input terminal (SN) of global event filter 233. A global clock signal 254 is coupled to the clock input terminal of global event filter logic 233.

The output terminal of register 217 is coupled to the event packet input terminal (EP) of global event filter logic 233. Configurable mesh control bus is coupled to a control bus input terminal (CB) of global event filter 223. A global event output terminal (GE) of global event filter logic 223 is coupled to a data input terminal of FIFO circuit 234. A push output terminal (P) of global event filter logic 233 is coupled to a push input terminal (P) of FIFO 221. A full output terminal (F) of FIFO 234 is coupled to a full input terminal (F) of global event filter logic 233. A data output terminal of FIFO circuit 234 is coupled to a first input terminal of multiplexer 232. An output terminal of multiplexer 232 is coupled to the next segment of the global event chain.

In operation with respect to local event ring, event packet generating logic 273 creates event packets to be inserted into a local event ring. Event packets created by event packet generating circuit 273 represent events which occurred within the island where the event ring circuit is located. In the embodiment illustrated in FIG. 36, event packet generating circuit 273 creates event packets representing events which occurred in NBI island 72. The event packet 278 created by event packet generating logic 273 is communicated to FIFIO 274. FIFO 274 acts as a buffer to store event packets until the event packets can be inserted into the local event ring. Event packets can only be inserted into the local event ring when the previous event ring segment is carrying no event packet. The event packet generating circuit 273 communicates a signal from the push output terminal (P) of the event packet generating circuit 273 to the push input terminal (P) of FIFO 274 when the event packet generating circuit 273 is communicating an event packet from the event packet output terminal (EP) to the data input terminal of FIFO 274. FIFO 274 has a finite memory size. In the event that FIFO 274 memory is full, no additional event packets from event packet generating circuit 273 may be stored in FIFO 274. A signal indicating that the FIFO 274 is full is communicated from the full output terminal (F) of FIFO 274 to the full input terminal (F) of event packet generating circuit 273. FIFO 274 always outputs a value; however, if no event packets are stored in FIFO 274 an output value with a first bit set to one (1) is communicated to the second terminal of multiplexer 271. A first value is clocked into register 270 from the previous event ring segment during a transitioning of global clock signal 254. The first value is then communicated from the output terminal of register 270 to the input terminal of vacancy logic 272, the event packet input terminal (EP) of source number checker 275, and the first input terminal of multiplexer 276.

Source number checker 275 receives an assigned source number from the configurable mesh control bus via the control bus input terminal (CB). The assigned source number is a number that is unique to event ring circuit 210. All event packets inserted into a local event ring by event ring circuit 210 will have a "source of event" field that indicates the source number assigned to event ring circuit 210. In one embodiment, the "source of event" filed is eight bits wide. An event packet bit sequence map and table is provided in FIG. 38A and FIG. 38B. Source number checker 275 communicates the assigned source number from the source number output terminal (SN) of source number checker 275 to the source number input terminal (SN) of event packet generating circuit 273. Event packet generating circuit 273 uses the source number information received from source number checker 275 to fill in the "source of event" field in new event packets.

Source number checker 275 also receives eight bits of the first value via the event packet input terminal (EP). The eight bits make up the "source of event" field and indicate which event ring circuit in the local event ring inserted the value. The source number checker 275 compares the received eight bits with the eight bit source number assigned to event ring circuit 210 via the configurable mesh control bus. When the eight bits representing the assigned source number are the same as the received eight bits of the first value, the source number checker 275 communicates a signal from control output terminal (CN) to the selector input terminal of multiplexer 276, such that multiplexer 276 couples the second input terminal of multiplexer 276 to the output terminal of multiplexer 276. The result is that source number checker 275 couples the logic high signal to the output terminal of multiplexer 276 when the eight source of event bits match, and that the source number checker 275 couples the output of register 270 to the output of multiplexer 276 when the eight source of event bits do not match. Coupling the logic high signal to the output terminal of multiplexer 276 has the effect of passing no event packet to the first input terminal of multiplexer 271. Source number checker 275 also receives a global clock signal 254 via the clock input terminal. The source number checker 275 transmits and receives communications during transitions of the global clock signal.

Vacancy logic 272 receives the first bit of the first value communicated from register 270. The first bit of the first value is one (1) if no event packet is present. The first bit of the first value is zero (0) if an event packet is present.

When an event packet 277 is present, the first bit of the first value is a zero (0) and vacancy logic 272 will communicate a control signal to the selector input terminal of multiplexer 271 so that multiplexer 271 will couple the first input terminal of multiplexer 271 to the output terminal of multiplexer 271. The vacancy logic 272 will also communicate a control signal to the present input terminal (PR) of FIFO 274 so that FIFO 274 will not communicate an event packet to the second input terminal of multiplexer 271. Therefore, when the first bit of the first value is zero (0) either the event packet 277 or the logic high signal will be coupled to the next event ring segment. Whether the event packet 277 or the logic high signal is coupled to the next event ring segment depends on the signal communicated from the control output terminal (CN) of source number checker 275. If the first bit of the first value is zero (0) and the received source number does not match the assigned source number, then event packet 277 will be coupled to the next event ring segment. If the first bit of the first value is zero (0) and the received source number does match the assigned source number, then the logic high signal will be coupled to the next event ring segment. Coupling the logic high signal to the next event ring segment has the effect of deleting event packet 277 from the local event ring and inserting no event packet in the local event ring.

When an event packet is not present, the first bit of the first value is one (1) and vacancy logic 272 will communicate a control signal to the selector input terminal of multiplexer 271 so that multiplexer 271 will couple the second input terminal of multiplexer 271 to the output terminal of multiplexer 271. The vacancy logic 272 will also communicate a control signal to the present input terminal (PR) of FIFO 274 so that FIFO 274 will communicate event packet 279 to the second input terminal of multiplexer 271. Therefore, when the first bit of the first value is a one (1) the next event packet 279 stored in FIFO 274 will be coupled to the next event ring segment.

In operation with respect to the global event chain, global event filter logic 233 filters monitors event packet being communicated along the local event ring. All event packets have a "type of event" field indicating the category of event the event packet is representing. An event packet bit sequence map and table is provided in FIG. 38A and FIG. 38B. The global event filter logic 233 compares the "type of event" bits of an event packet being communicated along the local event ring to an array of "type of event" bit sequences that have been identified as representing global events. In one embodiment, the array of "type of event" bit sequences is communicated to the global event filter logic 233 via the configurable mesh control bus. In another embodiment, the array of "type of event" bit sequences is hardcoded within the global event circuit logic 233. In an embodiment, the "type of event" field within the event packet is four bits wide.

In the embodiment illustrated in FIG. 37, event packet 277 is communicated from the output terminal of register 270 to the event packet input terminal (EP) of global event filter logic 233. When event packet 277 has a "type of event" bit sequence that is the same as one of the array of "type of event" bit sequences identified as representing global event, global event filter logic 233 communicates event packet 235 from the global event output terminal (GE) of global event filter logic 233 to the data input terminal of FIFO 234. In one embodiment, event packet 235 is identical to event packet 277. In another embodiment, the "vacancy indicator", "type of event", and "event data" fields of event packet 235 are the same as those of event packet 277; however, the "source of event" field of event packet 235 is updated with the source number assigned to event ring circuit 210. FIFO 234 acts as a buffer to store event packets until the event packets can be inserted into the global event ring. Event packets can only be inserted into the global event ring when the previous event chain segment is carrying no event packet. The global event filter logic 233 communicates a signal from the push output terminal (P) of the global event filter logic 233 to the push input terminal (P) of FIFO 234 when the global event filter logic 233 is communicating an event packet from the global event output terminal (GE) to the data input terminal of FIFO 234. FIFO 234 has a finite memory size. In the event that FIFO 234 memory is full, no additional event packets from global event filter logic 233 may be stored in FIFO 234. A signal indicating that the FIFO 234 is full is communicated from the full output terminal (F) of FIFO 234 to the full input terminal (F) of global event filter logic 233. FIFO 234 always outputs a value; however, if no event packets are stored in FIFO 234 an output value with a first bit set to one (1) is communicated to the first terminal of multiplexer 232.

A second value is clocked into register 228 from the previous event chain segment during a transitioning of global clock signal 254. The second value is then communicated from the output terminal of register 228 to the input terminal of vacancy logic 230, the event packet input terminal (EP) of source number checker 229, and the first input terminal of multiplexer 231.

Source number checker 229 receives an assigned source number from the configurable mesh control bus via the control bus input terminal (CB). The assigned source number is a number that is unique to event ring circuit 210. In one embodiment, all event packets inserted into a global event chain by event ring circuit 210 will have a "source of event" field that indicates the source number assigned to event ring circuit 210. In another embodiment, event packets inserted into a global event chain by event ring circuit 210 will have a "source of event" field that indicates a source number assigned to one event ring circuit within the same local event ring as event ring circuit 210. In one embodiment, the "source of event" field is eight bits wide. An event packet bit sequence map and table is provided in FIG. 38A and FIG. 38B. Source number checker 229 communicates the assigned source number from the source number output terminal (SN) of source number checker 229 to the source number input terminal (SN) of global event filter logic 233. Global event filter logic 233 may use the source number information received from source number checker 229 to fill in the "source of event" field in event packets inserted into the global event chain.

Source number checker 229 also receives eight bits of the second value via the event packet input terminal (EP). The eight bits make up the "source of event" field and indicate which event ring circuit in the global event chain inserted the value. The source number checker 229 compares the received eight bits with the eight bit source number assigned to event ring circuit 210 via the configurable mesh control bus. When the eight bits representing the assigned source number are the same as the received eight bits of the first value, the source number checker 229 communicates a signal from control output terminal (CN) to the selector input terminal of multiplexer 231, such that multiplexer 231 couples the second input terminal of multiplexer 231 to the output terminal of multiplexer 231. The result is that source number checker 229 causes the coupling of the logic high signal to the output terminal of multiplexer 231 when the eight source of event bits match, and that the source number checker 229 causes the coupling of the output of register 228 to the output of multiplexer 231 when the eight source of event bits do not match. Coupling the logic high signal to the output terminal of multiplexer 231 has the effect of passing no event packet to the second input terminal of multiplexer 232. Source number checker 229 also receives a global clock signal 254 via the clock input terminal. The source number checker 229 transmits and receives communications during transitions of the global clock signal.

Vacancy logic 230 receives the first bit of the second value communicated from register 228. The first bit of the second value is one (1) if no event packet is present. The first bit of the second value is zero (0) if an event packet is present.

When an event packet 256 is present, the first bit of the second value is a zero (0) and vacancy logic 230 will communicate a control signal to the selector input terminal of multiplexer 232 so that multiplexer 232 will couple the second input terminal of multiplexer 232 to the output terminal of multiplexer 232. The vacancy logic 230 will also communicate a control signal to the present input terminal (PR) of FIFO 234 so that FIFO 234 will not communicate an event packet to the first input terminal of multiplexer 232. Therefore, when the first bit of the second value is zero (0) either the event packet 256 or the logic high signal will be coupled to the next event chain segment. Whether the event packet 256 or the logic high signal is coupled to the next event chain segment depends on the signal communicated from the control output terminal (CN) of source number checker 229. If the first bit of the second value is zero (0) and the received source number does not match the assigned source number, then event packet 256 will be coupled to the next event chain segment. If the first bit of the second value is zero (0) and the received source number does match the assigned source number, then the logic high signal will be coupled to the next event chain segment. Coupling the logic high signal to the next event chain segment has the effect of deleting event packet 256 from the global event chain and inserting no event packet in the global event chain.

When an event packet is not present, the first bit of the second value is one (1) and vacancy logic 230 will communicate a control signal to the selector input terminal of multiplexer 232 so that multiplexer 232 will couple the first input terminal of multiplexer 232 to the output terminal of multiplexer 232. The vacancy logic 230 will also communicate a control signal to the present input terminal (PR) of FIFO 234 so that FIFO 234 will communicate event packet 236 to the first input terminal of multiplexer 232. Therefore, when the first bit of the second value is a one (1) the next event packet 236 stored in FIFO 234 will be coupled to the next event chain segment.

The configurable mesh control bus is coupled to the control bus input terminal (CB) of source number checkers 222 and 229. Source number checkers 222 and 229 may be assigned a source number via the configurable mesh control bus. In one embodiment, source number checkers 222 and 229 are assigned a source number once upon powering on the IB-NFP integrated circuit 12. In another embodiment, source number checkers 222 and 229 are assigned a first source number upon powering on the IB-NFP integrated circuit 12 and a second source number, replacing the first source number, during subsequent operation of the IB-NFP integrated circuit 12.

Figure 39:
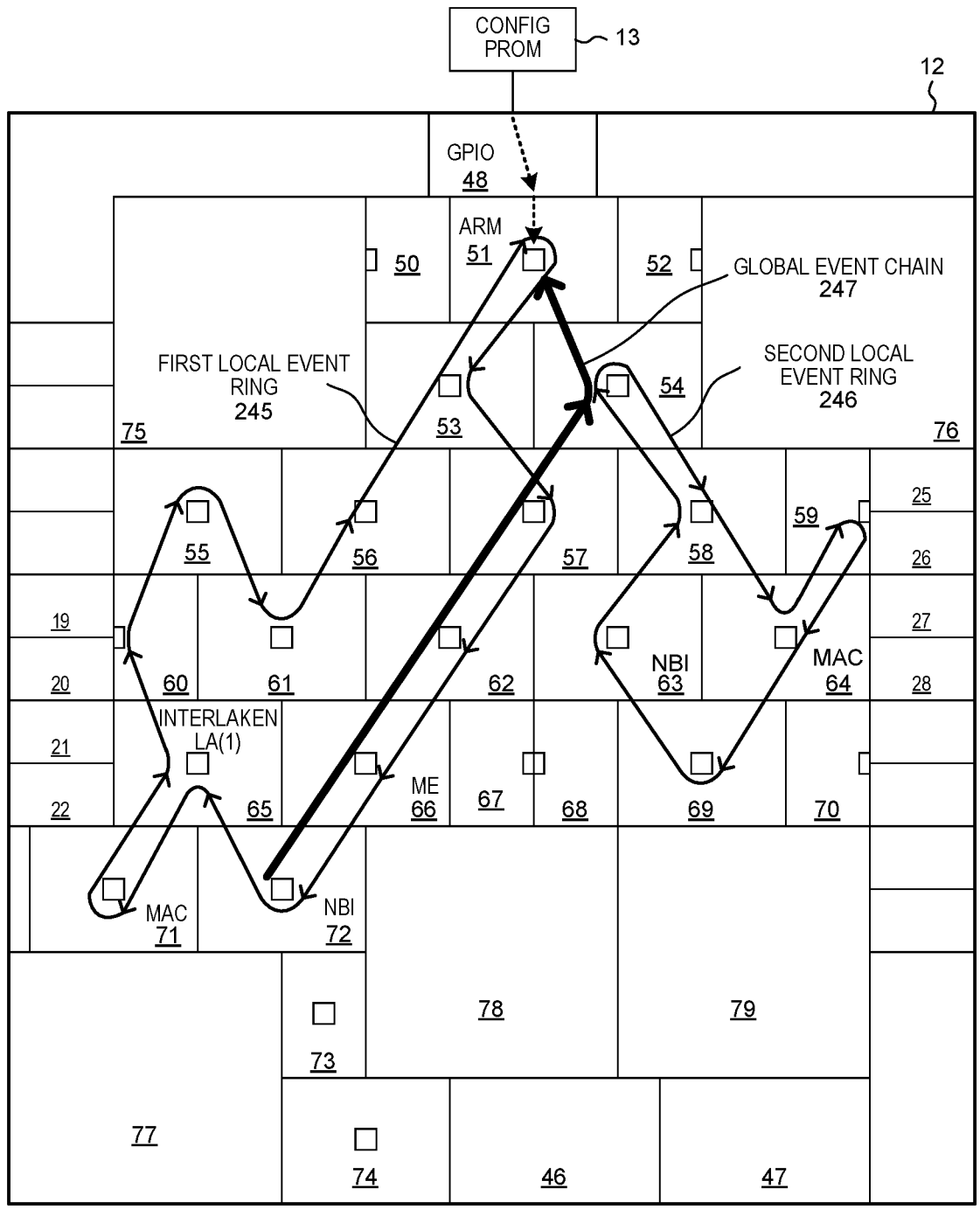
FIG. 39 is a diagram of the configurable mesh event bus configured to form two local event rings and a global event chain.

FIG. 39 is a diagram of the configurable mesh event bus configured to form two local event rings and a global event chain. FIG. 39 shows the configurable mesh event bus of FIG. 33 configured to form a first 245 and a second 246 local event ring and a single global event chain 247. Ingress NBI island 72 is the ingress NBI island 72 shown in FIG. 33 and FIG. 34. The first local event ring 245 flows through the ingress MAC island 71, ingress NBI island 72, ingress ME island 66, ARM island 51 and eight other islands (53, 57, 62, 65, 60, 55, 61, and 56). The second local event ring 246 flows through egress NBI island 63, egress MAC island 64 and four other islands (54, 58, 59, and 69). The global event chain 247 begins on ingress NBI island 72, couples through island 66, island 62, island 57, island 54 and terminates on ARM island 51. Both local event rings 245 and 246 are unidirectional, in that event packets travel in a single direction along the local event ring. The global event chain is unidirectional, in that global event packets travel in a single direction along the global event chain. Whereas the global even chain has a single point of termination on ARM island 51, both local event rings 245 and 246 have no fixed termination location. Rather, event packets are removed at different points along the local event ring depending upon where in the local event ring the event packet was inserted into the local event ring. Each local event ring operates as a source-release ring.

Figure 40:
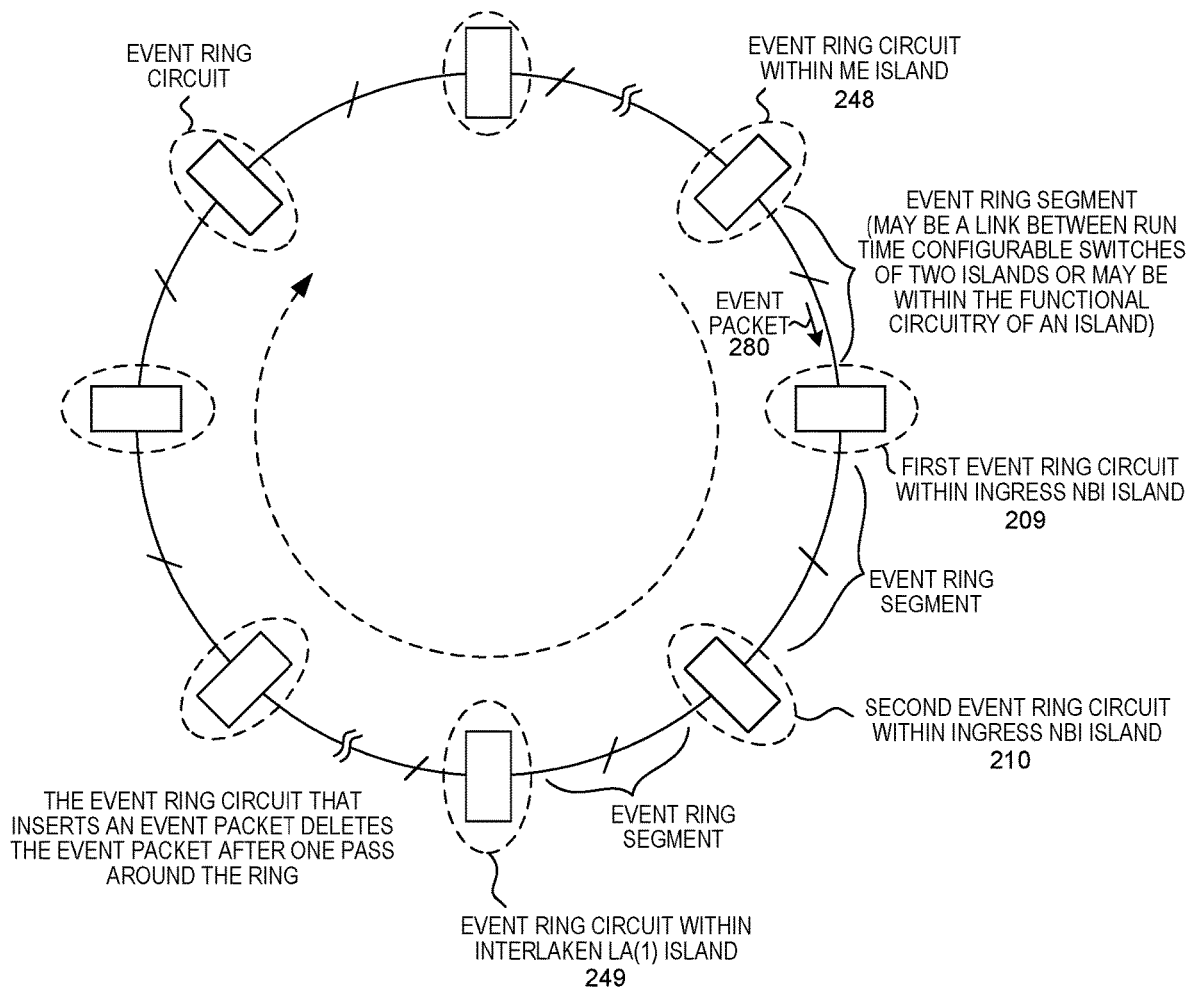
FIG. 40 is a simplified system level illustration that shows how a local event ring is a source-release ring.

FIG. 40 is a simplified system level illustration of a source-release ring. The source-release ring includes event ring circuits and event ring segments. An event ring segment couples a first event ring circuit to a second event ring circuit. The source-release ring illustrates the flow of the first local event ring 245 through ingress ME island 66, ingress NBI island 72, and Interlaken LA(1) island 65. The first local event ring 245 flows through a single event ring circuit 248 within ME island 66. The first local event ring 245 continues through the first 209 and second 210 event ring circuits of ingress NBI island 72 to event ring circuit 249 within Interlaken LA(1) island 65. A source-release ring is a circuit in which an event packet is clocked into sequential registers along a single direction. The event packet travels around the ring, stepping through the ring one register at a time. All event packets are transferred from the present register to the next register upon the transition of a synchronized clock cycle. In a source-release ring, only the source of an event packet can delete the event packet from the ring. Event ring circuits must monitor the passing event packet and only delete the event packet if the present event ring circuit was the source of the event packet. FIG. 40 is a simplified drawing. Event ring segments may comprise switches, slots, traces on silicon or other functional circuitry.

Referring to FIG. 39 and traveling clockwise around the source-release ring shown in FIG. 40, an event packet 280 is inserted into local event ring 245 by event ring circuit 248 within ME island 66. The event packet 280 is then communicated via an event ring segment to the first event ring circuit 209 within ingress NBI island 72. Since an event packet generated by another event ring circuit is present, the first event ring circuit 209 within ingress NBI island 72 cannot insert or delete an event packet, but can monitor the contents of the event packet 280. The event packet 280 is then communicated via an event ring segment to the second event ring circuit 210 within ingress NBI island 72. Since an event packet generated by another event ring circuit is present, the second event ring circuit 210 within ingress NBI island 72 cannot insert or delete an event packet, but can monitor the contents of the event packet 280. The event packet 280 is then communicated via an event ring segment to an event ring circuit 249 within the Interlaken LA(1) island 65. Since an event packet generated by another event ring circuit is present, the event ring circuit 249 within the Interlaken LA(1) island 65 cannot insert or delete an event packet, but can monitor the contents of the event packet 280. The event packet 280 will continue to be communicated around the first local event ring 245 until it returns to the event ring circuit 248 within the ingress ME island 66, where event ring circuit 248 will delete or "release" the event packet 280 from the local event ring 245.

Figure 41:
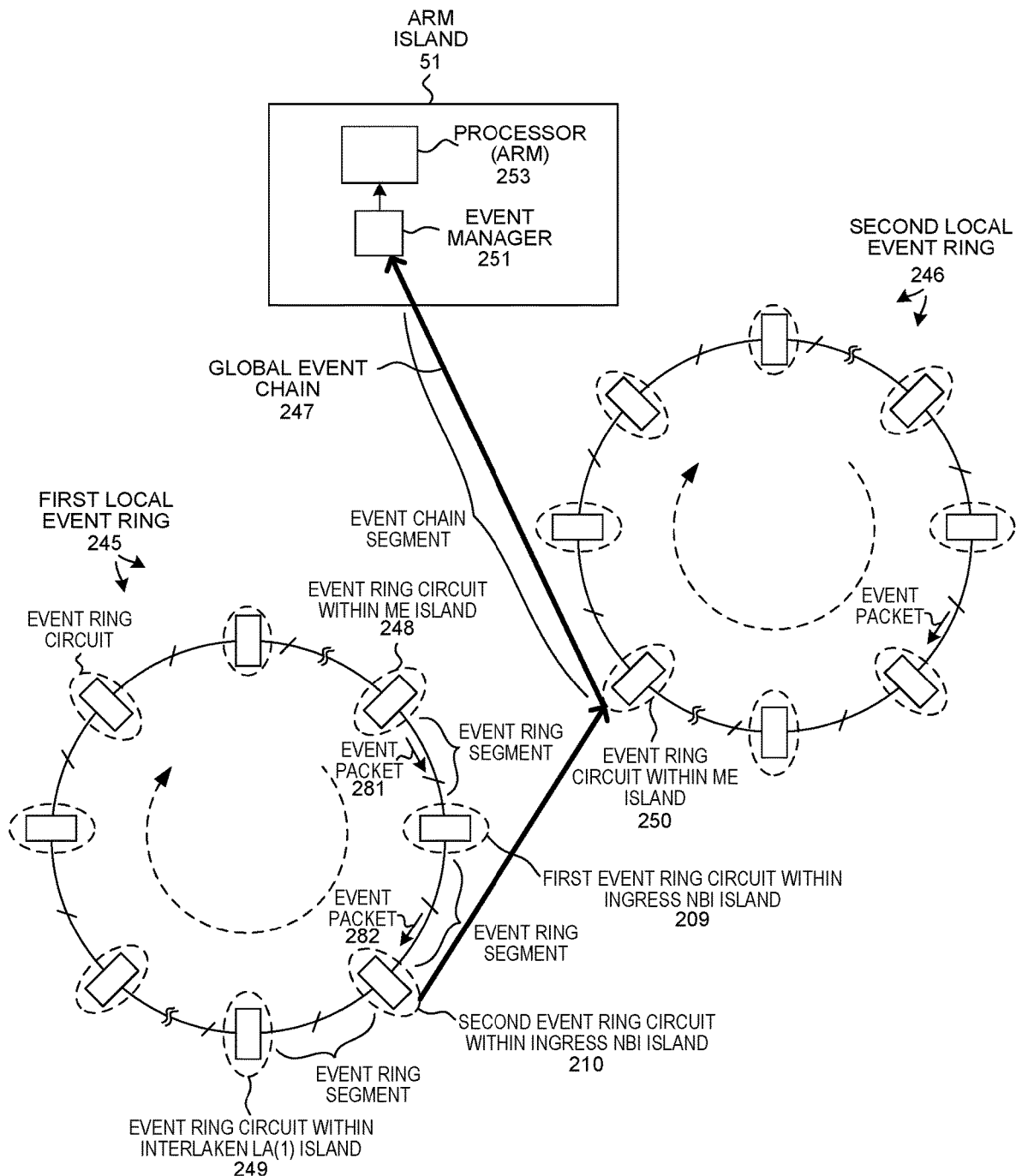
FIG. 41 is a simplified diagram of the first 245 and second 246 local event rings and single global event chain 247 shown in FIG. 39.

FIG. 41 is a simplified diagram of the first 245 and second 246 local event rings and single global event chain 247 shown in FIG. 39. The first local event ring 245 includes an event ring circuit 248 with ingress ME island 66, the first event ring circuit 209 within ingress NBI island 72, the second event ring circuit 210 within NBI island 72, an event ring circuit 249 within Interlaken LA(1) island 65, and multiple event ring segments coupling each event ring circuit to the following event ring circuit. The second local event ring 246 includes event ring circuit 250 within ME cluster island 54, other event ring circuits and multiple event ring segments coupling each event ring circuit to the following event ring circuit. The ARM island 51 includes an event manager 251 and processor 253. A global event chain 247 couples event ring circuit 210 to event ring circuit 250 and event ring circuit 250 to event manager 251 within ARM island 51. Operation of event manager 251 is disclosed below with respect to FIG. 42.

Event packets are communicated along first 245 and second 246 local event rings as described above with respect to FIG. 40. With respect to the first local event ring 245, once an event packet is communicated to the second event ring circuit 210 within ingress NBI 72, the global event filter 227 within the second event ring circuit 210 monitors the event packet and detects if the event packet represents a global event. If the global event filter 227 detects an event packet representing a global event, the event packet is copied to the global event chain 247. With respect to the second local event ring 246, once an event packet is communicated to the event ring circuit 250 within ME cluster island 54, a global event filter within event ring circuit 250 monitors the event packet and detects if the event packet represents a global event. If the global event filter within event ring circuit 250 detects an event packet representing a global event, the event packet is copied to the global event chain 247.

In one embodiment, the event ring circuit 248 within the ingress ME island 66 inserts an event packet 281 into the first local event ring 245. The event packet 281 represents a global event. The event packet 281 is then communicated to the first event ring circuit 209 within ingress NBI island 72 via an event ring segment. Since an event packet generated by another event ring circuit is present, the first event ring circuit 209 within ingress NBI island 72 cannot insert or delete an event packet, but can monitor the contents of the event packet 281. The event packet 281 is then communicated to the second event ring circuit 210 within ingress NBI island 72 via an event ring segment. Since an event packet generated by another event ring circuit is present, the second event ring circuit 210 within ingress NBI island 72 cannot insert or delete an event packet, but can monitor the contents of the event packet 281. The global event filter 227 within event ring circuit 210 determines that event packet 281 represents a global event. Upon determining that the event packet 281 represents a global event, event ring circuit 210 will copy the event packet 281 to the first event chain segment of the global event chain 247. The event packet 281 is also communicated along the first local event ring 245 as described with respect to FIG. 40 above. The event packet 281 then is communicated along a second event chain segment of the global event chain 247 to event manager 251 within ARM island 51. Simultaneously, other event packets are communicated along the second local event ring 246. The global event filter in event ring circuit 250 determines if event packets represent global events. Upon determining that an event packet represents a global event, the global event filter in event ring circuit 250 copies the event packet to the second segment of the global event chain 247. As shown above, the global event chain 247 allows event packets representing global events to be communicated to ARM island 51 from both the first 245 and the second 246 local event rings.

It is noted that while select event packets are only copied to the global event chain 247 by global event filters; global event filters do not delete or "release" event packets from the first 245 or second 246 local event rings. Only the event ring circuit which inserted the event packet into the local event ring can delete or "release" the said event packet from the local event ring. Event packets are only deleted from the global event chain by event manager 251 within ARM island 51. Global events may represent events such as error code correction (ECC) events or direct memory access (DMA) events.

In another embodiment, the event ring circuit 248 within the ingress ME island 66 inserts the event packet 282 to the first local event ring 245. Event packet 282 does not represent a global event. The event packet 282 is then communicated to the event ring circuit 209 within ingress NBI island 72 via an event ring segment. Since an event packet generated by another event ring circuit is present, event ring circuit 209 within ingress NBI island 72 cannot insert or delete an event packet, but can monitor the contents of the event packet 282. Since the event ring circuit 209 does not have a global event filter, the event ring circuit 209 will not determine if the event packet 282 represents a global event and will not copy the event packet 282 to the global event chain. The event packet 282 is communicated to event ring circuit 210 within ingress NBI island 72 via an event ring segment. Since an event packet generated by another event ring circuit is present, event ring circuit 210 within ingress NBI island 72 cannot insert or delete an event packet, but can monitor the contents of the event packet 282. The global event filter 227 within event ring circuit 210 determines that event packet 282 does not represent a global event. Upon determining that the event packet 282 does not represent a global event, event ring circuit 210 will not copy the event packet 282 to the first event chain segment of the global event chain 247. The event packet 282 is communicated along the first local event ring 245 as described with respect to FIG. 40 above. As shown above, the global event chain 247 does not communicate event packets representing local event to the ARM island 51.

Figure 42:
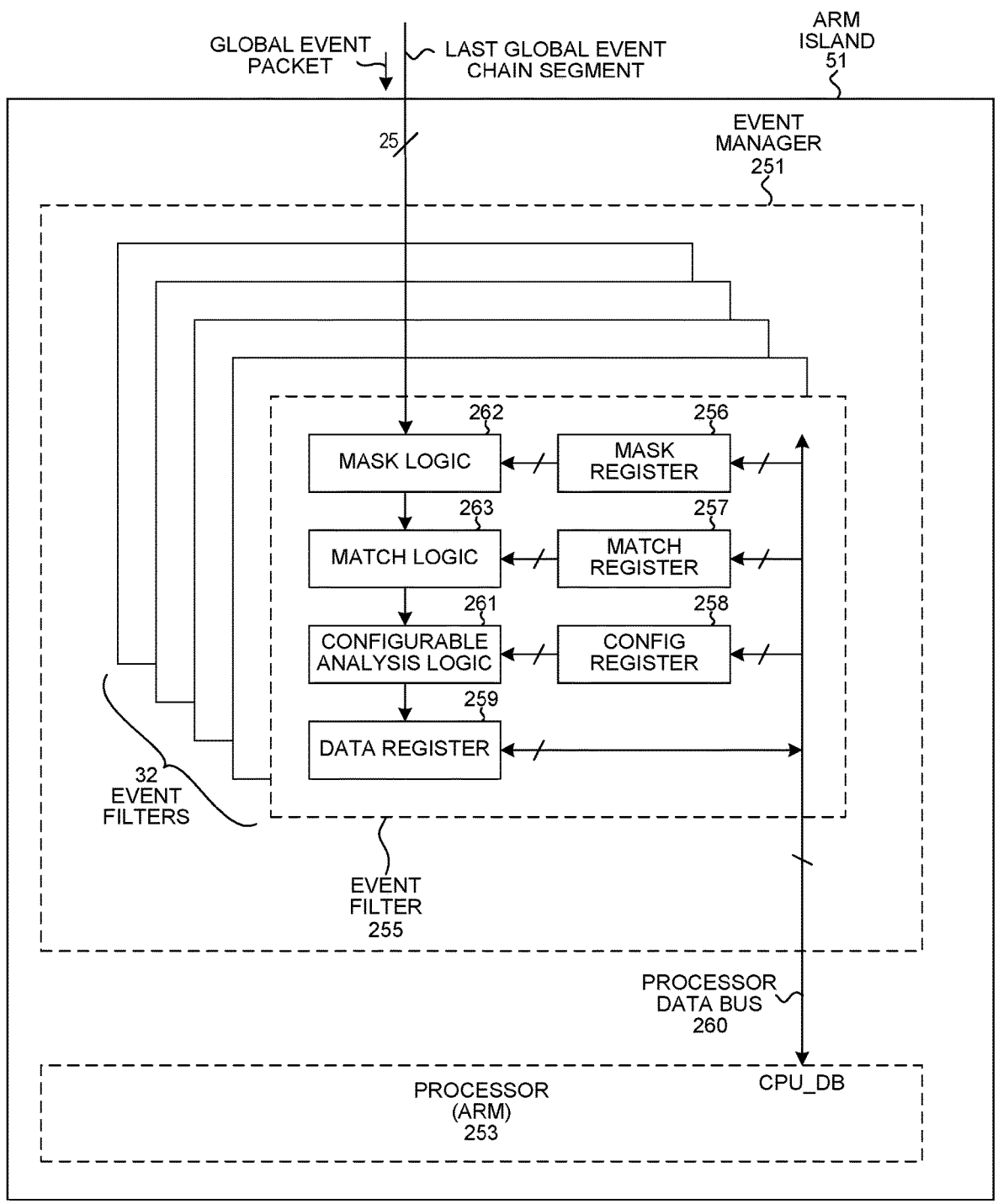
FIG. 42 is a more detailed diagram of event manager 251 within island 51.

FIG. 42 shows the event manager 251 of ARM island 51 in further detail. An event manager is also included in all cluster local scratch circuits, such as cluster local scratch 342 shown in FIG. 50. Event manager 251 receives incoming global event packets from the last segment of the global event chain, detects various types of the global event packets, and collects and logs various types of information regarding the detected types of global event packets. Event manager 251 may, for example, count the number of certain types of global event packets received. Event manager 251 may, for example, log certain information about certain types of global event packets. The collected data is stored in a data register. The ARM processor can configure the global event manager 251 via data bus 260 and set up which types of global event packets will be detected and logged. The ARM processor 253 can then read the collected data from the data register via data bus 260.

In one embodiment, event manager 251 includes thirty-two event filters. One of the event filters 255 includes mask logic 262, a mask register 256, match logic 263, a match register 257, configurable analysis logic 261, a configuration register 258, and a data register 259. The last segment of the global event chain is coupled to an input of an amount of mask logic 262. The mask logic 262 uses the value in mask register 256 to mask out certain parts of the incoming global event packet. The output of the mask logic 262 is supplied to match logic 263. The match logic 263 compares the output of the mask logic 262 to the value or values stored in match register 257. Match register 257 may, for example, include an array of bit sequences. If the unmasked event packet bits output by the mask logic are determined to match one of the bit sequences stored in match register 257, then the match logic 263 outputs a digital value indicative of the occurrence. The digital value output by the match logic is supplied to configurable analysis logic 261. Configurable analysis logic 261 may, for example, be configured by the value in configuration register 258 to be a counter so that the configurable analysis logic counts the number of matches that occur. The output of the configurable analysis logic 261 is written into data register 259. Processor 253 can read the results from data register 259 via data bus 260. Processor data bus 260 is coupled to a first input (CPU_DB) of processor 253.

Operational Example

Figure 43:
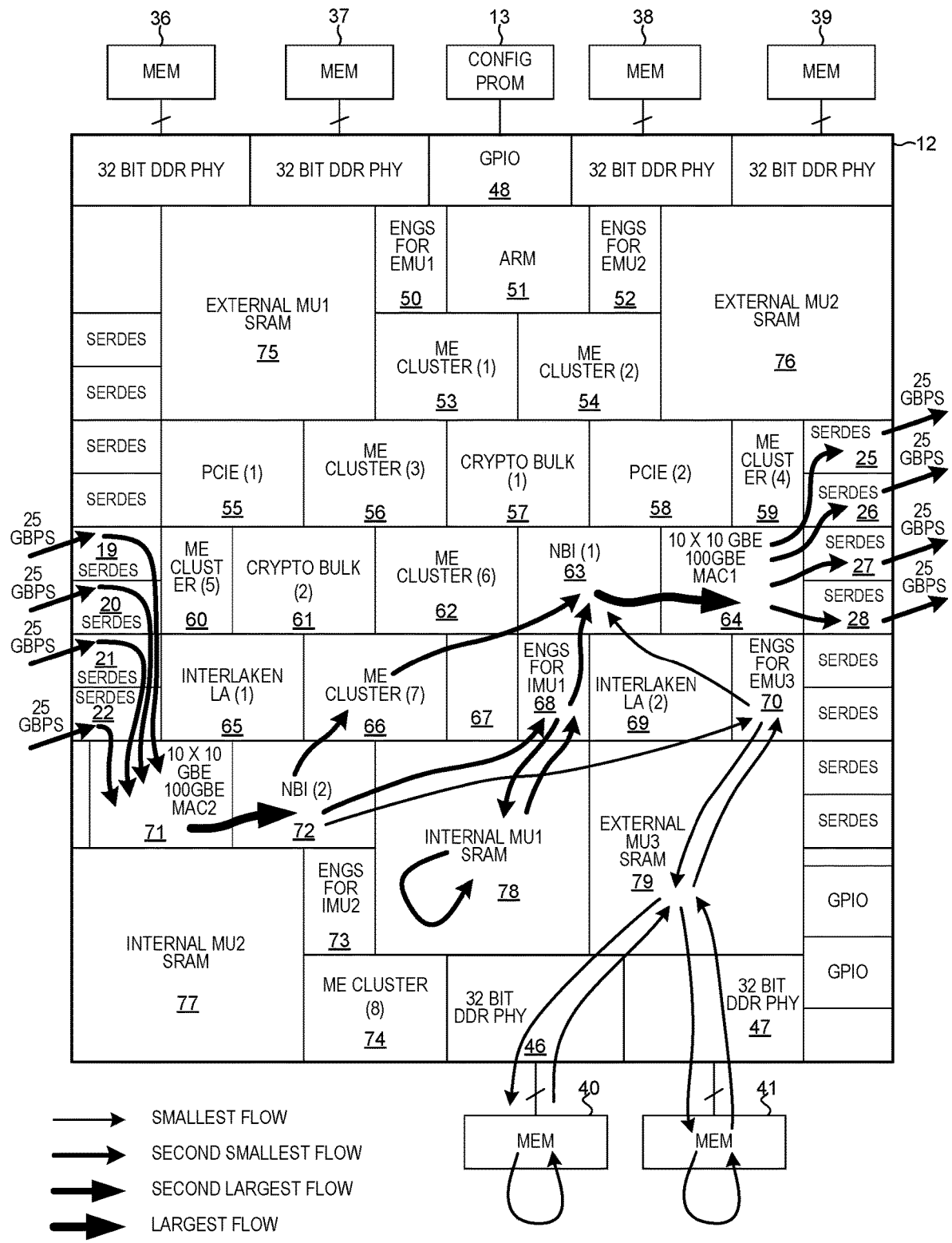
FIG. 43 is a schematic diagram that illustrates an operational example of IB-NFP integrated circuit 12 within the MPLS router 1 of FIG. 1.

FIG. 43 is a schematic diagram that illustrates an operational example of IB-NFP integrated circuit 12 within the MPLS router 1 of FIG. 1. 100 Gbps packet traffic is received via optical cable 7 (see FIG. 1), flows through optics transceiver 10, flows through PHY integrated circuit 11, and is received onto IB-NFP integrated circuit 12 spread across the four SerDes I/O blocks 19-22. Twelve virtual input ports are provided at this interface in the example of FIG. 1. The symbols pass through direct dedicated conductors from the SerDes blocks 19-22 to ingress MAC island 71. Ingress MAC island 71 converts successive symbols delivered by the physical coding layer into packets by mapping symbols to octets, by performing packet framing, and then by buffering the resulting packets for subsequent communication to other processing circuitry. The packets are communicated from MAC island 71 across a private inter-island bus to ingress NBI (Network Bus Interface) island 72. Although dedicated connections are provided for this purpose in the particular example described here, in other examples the packets are communicated from ingress MAC island 71 to ingress NBI island via the configurable mesh data bus.

For each packet, the functional circuitry of ingress NBI island 72 examines fields in the header portion to determine what storage strategy to use to place the packet into memory. In one example, the NBI island examines the header portion and from that determines whether the packet is an exception packet or whether the packet is a fast-path packet. If the packet is an exception packet then the NBI island determines a first storage strategy to be used to store the packet so that relatively involved exception processing can be performed efficiently, whereas if the packet is a fast-path packet then the NBI island determines a second storage strategy to be used to store the packet for more efficient transmission of the packet from the IB-NFP.

In the operational example of FIG. 43, NBI island 72 examines a packet header, performs packet preclassification, determines that the packet is a fast-path packet, and determines that the header portion of the packet should be placed into a CTM (Cluster Target Memory) in ME (Microengine) island 66. The header portion of the packet is therefore communicated across the configurable mesh data bus from NBI island 72 to ME island 66. The CTM is tightly coupled to the ME. The ME island 66 determines header modification and queuing strategy for the packet based on the packet flow (derived from packet header and contents) and the ME island 66 informs a second NBI island 63 of these. In this simplified example being described, the payload portions of fast-path packets are placed into internal SRAM (Static Random Access Memory) MU block 78 and the payload portions of exception packets are placed into external DRAM 40 and 41.

Half island 68 is an interface island through which all information passing into, and out of, SRAM MU block 78 passes. The functional circuitry within half island 68 serves as the interface and control circuitry for the SRAM within block 78. For simplicity purposes in the discussion below, both half island 68 and MU block 78 may be referred to together as the MU island, although it is to be understood that MU block 78 is actually not an island as the term is used here but rather is a block. In one example, MU block 78 is an amount of so-called "IP" that is designed and supplied commercially by a commercial entity other than the commercial entity that designs and lays out the IB-NFP integrated circuit. The area occupied by block 78 is a keep out area for the designer of the IB-NFP in that the substantially all the wiring and all the transistors in block 78 are laid out by the memory compiler and are part of the SRAM. Accordingly, the mesh buses and associated crossbar switches of the configurable mesh data bus, the mesh control bus, and the mesh event bus do not pass into the area of block 78. No transistors of the mesh buses are present in block 78. There is an interface portion of the SRAM circuitry of block 78 that is connected by short direct metal connections to circuitry in half island 68. The data bus, control bus, and event bus structures pass into and over the half island 68, and through the half island couple to the interface circuitry in block 78. Accordingly, the payload portion of the incoming fast-path packet is communicated from NBI island 72, across the configurable mesh data bus to SRAM control island 68, and from control island 68, to the interface circuitry in block 78, and to the internal SRAM circuitry of block 78. The internal SRAM of block 78 stores the payloads so that they can be accessed for flow determination by the ME island.

In addition, a preclassifier in the ingress NBI island determines that the payload portions for others of the packets should be stored in external DRAM 40 and 41. For example, the payload portions for exception packets are stored in external DRAM 40 and 41. Interface island 70, IP block 79, and DDR PHY I/O blocks 46 and 47 serve as the interface and control for external DRAM integrated circuits 40 and 41. The payload portions of the exception packets are therefore communicated across the configurable mesh data bus from NBI island 72, to interface and control island 70, to external MU SRAM block 79, to 32-bit DDR PHY I/O blocks 46 and 47, and to external DRAM integrated circuits 40 and 41. At this point in the operational example, the packet header portions and their associated payload portions are stored in different places. The payload portions of fast-path packets are stored in internal SRAM in MU block 78, whereas the payload portions of exception packets are stored in external SRAM in external DRAMs 40 and 41.

ME island 66 informs second NBI island 63 where the packet headers and the packet payloads can be found and provides the second NBI island 63 with an egress packet descriptor for each packet. The egress packet descriptor indicates a queuing strategy to be used on the packet. Second NBI island 63 uses the egress packet descriptor to read the packet headers and any header modification from ME island 66 and to read the packet payloads from either internal SRAM 78 or external DRAMs 40 and 41. Second NBI island 63 places packet descriptors for packets to be output into the correct order. For each packet that is then scheduled to be transmitted, the second NBI island uses the packet descriptor to read the header portion and any header modification and the payload portion and to assemble the packet to be transmitted. Note that the header modification is not actually part of the egress packet descriptor, but rather it is stored with the packet header by the ME when the packet is presented to the NBI. The second NBI island then performs any indicated packet modification on the packet. The resulting modified packet then passes from second NBI island 63 and to egress MAC island 64.

Egress MAC island 64 buffers the packets, and converts them into symbols. The symbols are then delivered by conductors from the MAC island 64 to the four SerDes I/O blocks 25-28. From SerDes I/O blocks 25-28, the 100 Gbps outgoing packet flow passes out of the IB-NFP integrated circuit 12 and across SerDes connections 34 (see FIG. 1) and to switch fabric 9. Twelve virtual output ports are provided in the example of FIG. 1.

Figure 44:
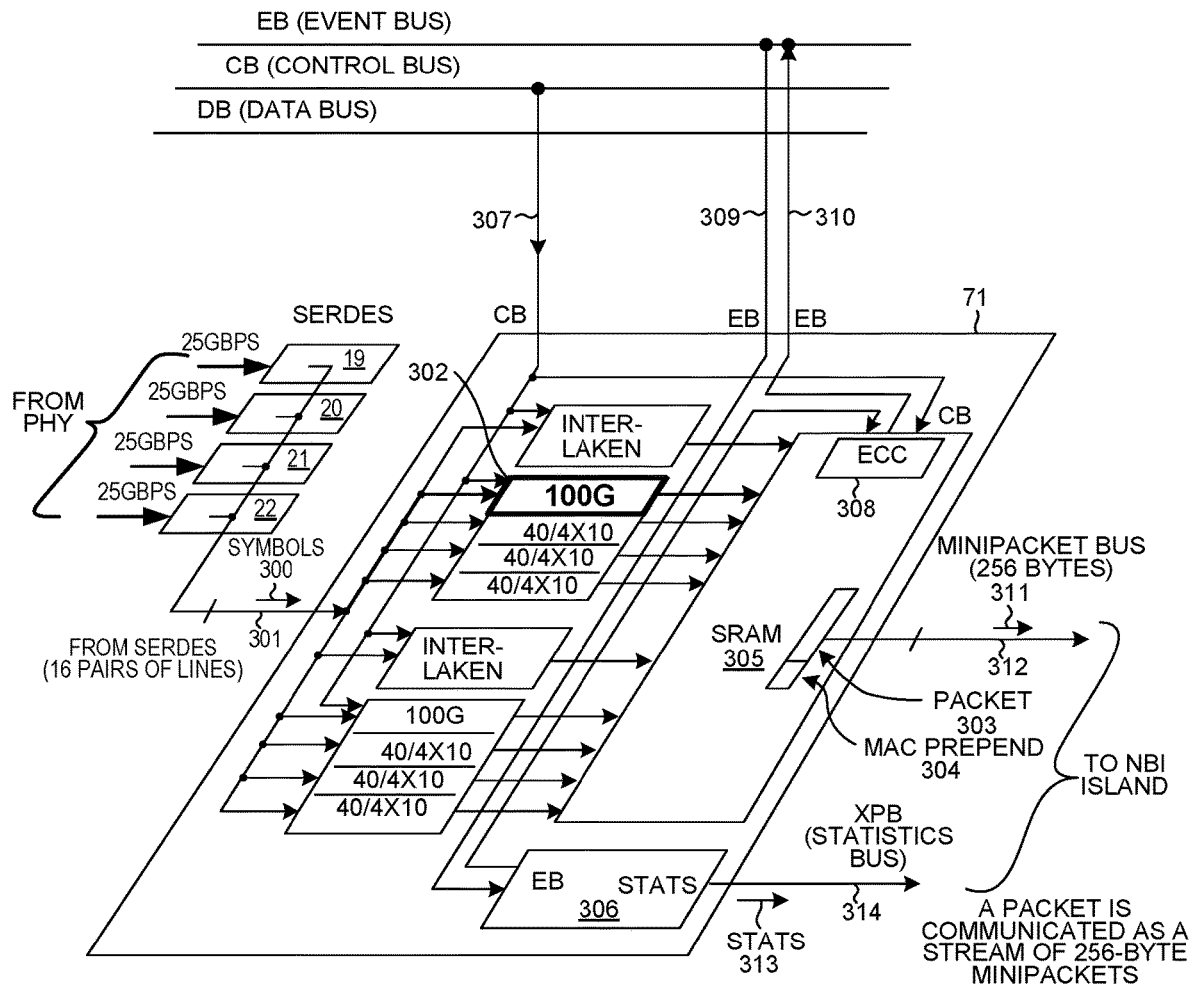
FIG. 44 is a diagram of the four SerDes I/O blocks 19-22 and the ingress MAC island 71 of IB-NFP integrated circuit 12.

FIG. 44 is a diagram of the four SerDes I/O blocks 19-22 and the ingress MAC island 71. The symbols 300 pass from the four SerDes I/O blocks and to the ingress MAC island across dedicated conductors 301. The symbols are converted into packets by a 100 Gbps ethernet block 302. The 100 Gbps ethernet block 302 analyzes the packets and places the results in this analysis at the beginning of the packet in the form of a "MAC prepend" value. The resulting packets and associated MAC prepend values are then buffered in SRAM 305. Reference numeral 303 identifies a part of the block that represents one packet and reference numeral 304 identifies a part of the block that represents the MAC prepend value. The MAC prepend value 304 includes: 1) an indication of the length of the packet, 2) an indication whether the packet is an IP packet, 3) and indication of whether the checksums are correct, and 4) a time stamp indicating when the packet was received.

As packets are loaded into SRAM, a statistics block 306 counts the number of packets that meet certain criteria. Various sub-circuits of the ingress MAC island are configurable. The input conductors 307 labeled CB couples the certain portions of the MAC island to the control bus tree illustrated in FIG. 29 so that these portions receive configuration information from the root of control bus tree. SRAM block 305 includes error detection and correction circuitry (ECC) 308. Error information detected and collected by ECC block 308 and statistics block 306 is reported through the local event bus and global event chain back to the ARM island 51 by the mechanism described above in connection with FIG. 29. Ingress MAC island 71 is part of one of the local event rings. Event packets are circulated into the MAC island via conductors 309 and are circulated out of the MAC island via conductors 310. Packets that are buffered in SRAM 305 are then output from the MAC island to the ingress NBI island 72 in the form of one or more 256 byte minipackets 311 communicated across dedicated connections 312. Statistics information 313 is also communicated to the ingress NBI island 72 via dedicated connections 314.

Figure 45:
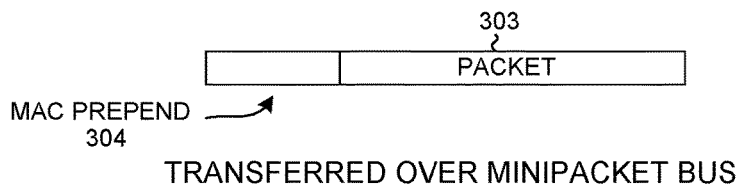
FIG. 45 is a diagram that illustrates how a packet is communicated as a sequence of minipackets across connections 312.

FIG. 45 is a diagram of packet 303 communicated across connections 312.

Figures 46, 47:
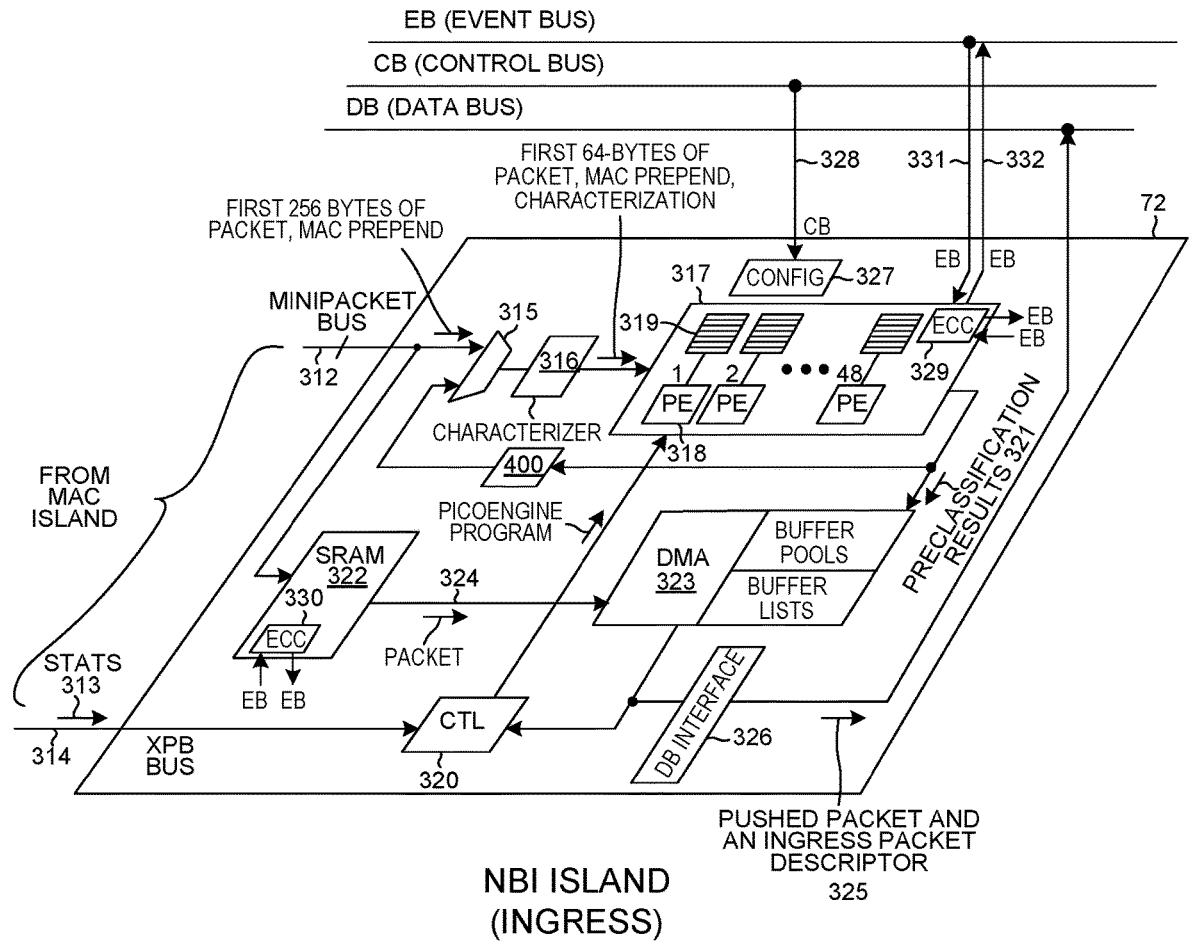
FIG. 46 is a diagram of ingress NBI island 72.
FIG. 47 is a table that sets forth the parts of preclassification results 321.

FIG. 46 is a diagram of ingress NBI island 72. Ingress NBI island 72 receives the MAC prepend and the minipackets via dedicated connections 312 from the ingress MAC island 72. The first 256 bytes of the packet and the MAC prepend pass through multiplexing circuitry 315 and to a characterizer 316. Characterizer 316 outputs characterization information, the first sixty-four bytes of the packet, and the MAC prepend. This is passed to a pool 317 of forty-eight picoengines. Each picoengine executes a program stored in an associated instruction control store. Reference numeral 318 identifies the first picoengine and reference numeral 319 identifies its instruction control store. The program in the instruction control store for each picoengine can be updated and changed under software control via control block 320. Control block 320 is also usable to receive the statistics information 313 from the MAC island via XPB bus connections 314. To perform deeper and deeper analysis into the header structure of an incoming packet, the output of the pool 317 can be passed back through a tunnel recirculation path and tunnel recirculation FIFO 400 to the characterizer 316 in an iterative fashion. Pool 317 outputs preclassification results 321.

FIG. 47 is a table that sets forth the part of preclassification results 321. The preclassification results 321 include: 1) a determination of which one of multiple buffer pools to use to store the packet, 2) a sequence number for the packet in a particular flow of packets through the IB-NFP, and 3) user metadata. The user metadata is typically a code generated by the picoengines, where the code communicates certain information about the packet. In the present operational example, the user metadata includes a bit. If the bit is set then the packet was determined to be of a first type (an exception packet), whereas if the bit is not set then the packet was determined to be of a second type (a fast-path packet).

The packet is buffered in SRAM 322. A buffer pool is a set of targets in ME islands where header portions can be placed. A buffer list is a list of memory addresses where payload portions can be placed. DMA engine 323 can read the packet out of SRAM via conductors 324, then use the buffer pools to determine a destination to which the packet header is to be DMA transferred, and use the buffer lists to determine a destination to which the packet payload is to be DMA transferred. The DMA transfers occur across the configurable mesh data bus. In the case of the exception packet of this example the preclassification user metadata and buffer pool number indicate to the DMA engine that the packet is an exception packet and this causes a first buffer pool and a first different buffer list to be used, whereas in the case of the fast-path packet the preclassification user metadata and buffer pool number indicate to the DMA engine that the packet is a fast-path packet and this causes a second buffer pool and a second buffer list to be used. Block 326 is data bus interface circuitry through which the configurable mesh data bus in accessed. Arrow 325 represents packets that are DMA transferred out of the NBI island 72 by DMA engine 323. Each packet is output with a corresponding ingress packet descriptor.

FIG. 48 is a table that sets forth the parts of an ingress packet descriptor. An ingress packet descriptor includes: 1) an address indicating where and in which ME island the header portion is stored, 2) an address indicating where and in which MU island the payload portion is, 3) how long the packet is, 4) a sequence number for the flow to which the packet belongs, 5) user metadata.

The programs stored in the instruction stores that are executable by the picoengines can be changed multiple times a second as the router operates. Configuration block 327 receives configuration information from the control bus CB tree via connections 328 and supplies the configuration information to various ones of the sub-circuits of NBI island 72 that are configurable. Error detection and correction (ECC) circuitry 329 collects error information such as errors detected in the contents of the instruction stores. ECC circuitry 329 and ECC circuitry 330 are coupled via connections 331 and 332 and other internal island connections not shown to be part of the local event ring of which the ingress MAC island 72 is a part.

FIG. 49 is a diagram of the microengine (ME) island 66. In the present operational example, packet headers and the associated preclassification results are DMA transferred from the ingress NBI island 72 across the configurable mesh data bus and into the Cluster Target Memory (CTM) 333 of the ME island 66. The DMA engine 323 in the ingress NBI island is the master and the CTM 333 is the target for this transfer. The packet header portions and the associated ingress packet descriptors pass into the ME island via data bus island bridge 334 and data bus interface circuitry 335. Once in the CTM 333, the header portions are analyzed by one or more microengines. The microengines have, through the DB island bridge 334, a command out interface, a pull-id in interface, a pull-data out interface, and a push data in interface. There are six pairs of microengines, with each pair sharing a memory containing program code for the microengines. Reference numerals 336 and 337 identify the first pair of picoengines and reference numeral 338 identifies the shared memory. As a result of analysis and processing, the microengines modify each ingress packet descriptor to be an egress packet descriptor. Each egress packet descriptor includes: 1) an address indicating where and in which ME island the header portion is found, 2) an address indicating where and in which MU island the payload portion is found, 3) how long the packet is, 4) sequence number of the packet in the flow, 5) an indication of which queue the packet belongs to (result of the packet policy), 6) an indication of where the packet is to be sent (a result of the packet policy), 7) user metadata indicating what kind of packet it is.

Memory errors and other events detected in the ME island are reported via a local event ring and the global event chain back to the ARM island 51. A local event ring is made to snake through the ME island for this purpose. Event packets from the local event chain are received via connections 339 and event packets are supplied out to the local event chain via connections 340. The CB island bridge 341, the cluster local scratch 342, and CTM 333 can be configured and are therefore coupled to the control bus CB via connections 343 so that they can receive configuration information from the control bus CB.

A microengine within the ME island can use data bus commands to interact with a target, regardless of whether the target is located locally on the same ME island as the microengine or whether the target is located remotely in another island, using the same configurable data bus communications. If the target is local within the ME island, then the microengine uses data bus commands and operations as described above as if the memory were outside the island in another island, except that bus transaction values do not have a final destination value. The bus transaction values do not leave the ME island and therefore do not need the final destination information. If, on the other hand, the target is not local within the ME island then intelligence 343 within the DB island bridge adds the final destination value before the bus transaction value is sent out onto the configurable mesh data bus. From the perspective of the microengine master, the interaction with the target has the same protocol and command and data format regardless of whether the target is local or remote.

Figure 51:
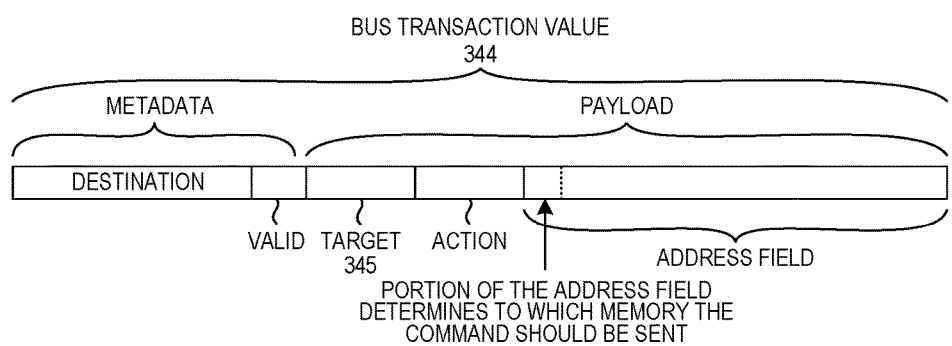
FIG. 51 is a bit sequence map of a bus transaction value used to communicate packet data from the ingress NBI island 72 to the ME island 66 across the CPP data bus.

FIG. 51 is a diagram of a bus transaction value 344 used to communicate packet data from the ingress NBI island 72 to the ME island 66. In a multi-target island such as the ME island 66, the target field 345 of the bus transaction value contains a number that indicates which target it is that is to receive the payload of the bus transaction value. In the present example, the header portions of the incoming 100 Gbps flow are written into CTM 333.

Figure 50:
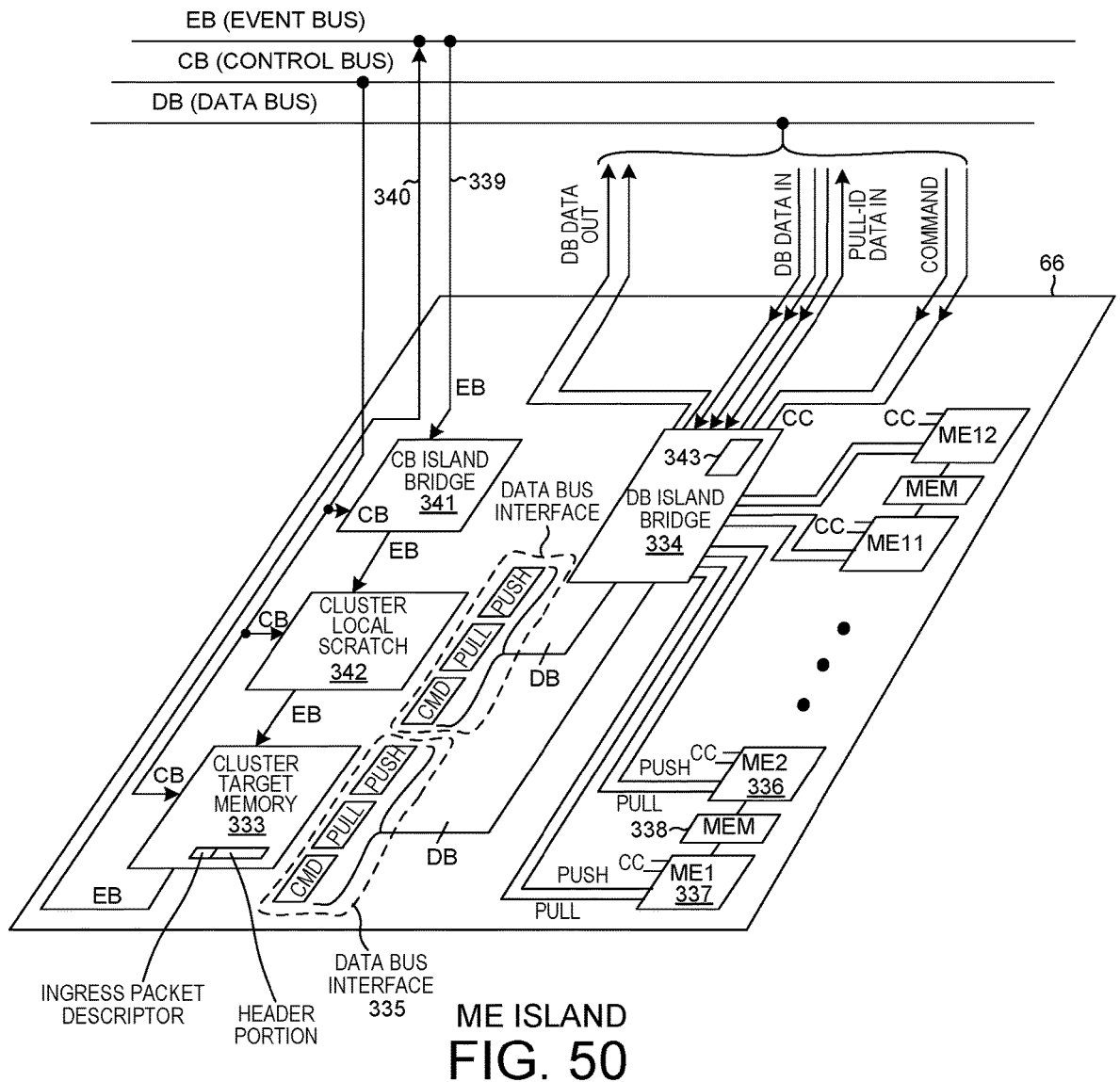
FIG. 50 is a diagram of the microengine (ME) island 66.

The local event ring flow through ME island 66 illustrated in FIG. 50. The local event ring couples from the event bus (EB) through CB island bridge 341, cluster local scratch 342, cluster target memory 333 and back to event bus (EB). Local and global events are communicated between CB island bridge 341, cluster local scratch 342, cluster target memory 333 via the local event bus. Each cluster local scratch 342 contains an event manager 251 as illustrated in FIG. 42.

Figure 52:
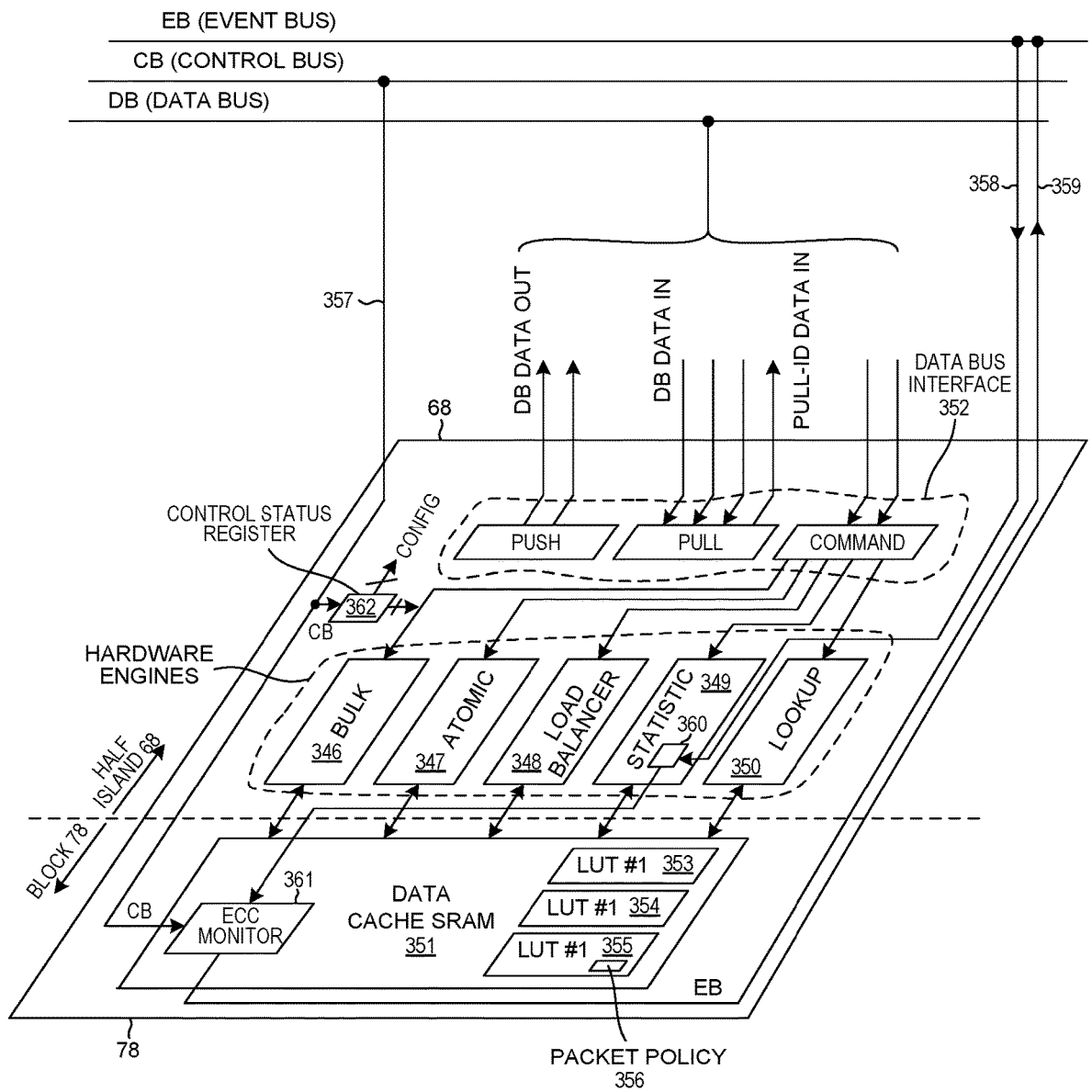
FIG. 52 is a diagram of MU half island 68 and associated SRAM block 78.

FIG. 52 is a diagram of MU half island 68 and SRAM block 78. MU half island 68 includes several hardware engines 350. In the operational example, packet payloads are DMA transferred directly from ingress NBI island 72 and across the configurable mesh data bus, through data bus interface 352 of half island 68, and into the data cache SRAM 351 block 78. The ingress NBI DMA engine 323 issues a bulk write command across the configurable mesh data bus to the bulk transfer engine 346. The destination is the MU island. The action is bulk write. The address where the data is to be written into the MU island is the address taken out of the appropriate buffer list. The bulk write command received at the MU is a bulk write, so the data bus interface 352 presents the command to the bulk engine. The bulk engine examines the command which is a write. In order to perform a write the bulk engine needs data, so the bulk engine issues a pull-id through the pull portion of interface 352, which in turn issues a pull-id back onto the configurable mesh data bus. The NBI DMA engine 323 receives the pull-id. Part of the pull-id is a data reference which indicates to the DMA engine which part of the packet is being requested as data. The DMA engine uses the data reference to read the requested part of the packet, and presents that across the data part of the data bus back to the bulk engine 346. The bulk engine 346 then has the write command and the packet data. The bulk engine 346 ties the two together, and it then writes the packet data into the SRAM 351 at the address given in the write command. In this way, packet payload portions pass from DMA engine in the ingress NBI island, across the configurable mesh data bus, through the data bus interface 352, through a bulk transfer engine 346, and into data cache SRAM 351.

In the present operational example, a microengine in the ME island 66 issues a lookup command across the configurable mesh data bus to have lookup hardware engine 350 examine tables in SRAM 351 for the presence of given data. The data to be looked for in this case is a particular MPLS label. The lookup command as received onto the MU island is a lookup command so the data base interface 352 presents the lookup command to the lookup engine. The lookup command includes a table descriptor of what part to memory to look in. The lookup command also contains a pull-id reference indicating what to look for (the MPLS label in this case). The data to look for is actually stored in transfer registers of the originating microengine. The lookup engine 350 therefore issues a pull-id out onto the configurable mesh data bus request back to the originating microengine. The microengine returns the requested data (the MPLS label to look for) corresponding to the reference id. The lookup engine now has the lookup command, the table descriptor, and the MPLS label that it is to look for. In the illustration there are three tables 353-355. A table description identifies one such table by indicating the starting address of the table in SRAM 351, and how large the table is. If the lookup operation is successful in that the lookup hardware engine 350 finds the MPLS label in the table identified by the table descriptor, then the lookup hardware engine 350 returns a predetermined value "Packet Policy" 356 back to the requesting microengine. A packet policy is a code that indicates: 1) a header modification to be done, and 2) a queueing strategy to use. Lookup engine 350 returns the packet policy 356 to the originating microengine by pushing the data (the packet policy) via the push interface of the configurable mesh data bus.

Various parts of the MU island are configurable by changing the contents of registers and memory via the control bus CB and connections 357 and control status registers 362. Errors detected on the MU island by circuits 360 and 361 are reported into a local event ring. Event packets from the local event ring are received via input connections 358 and the MU island outputs event packets to the local even ring via output connections 359. Various sub-circuits of the MU island are configurable.

Figure 53:
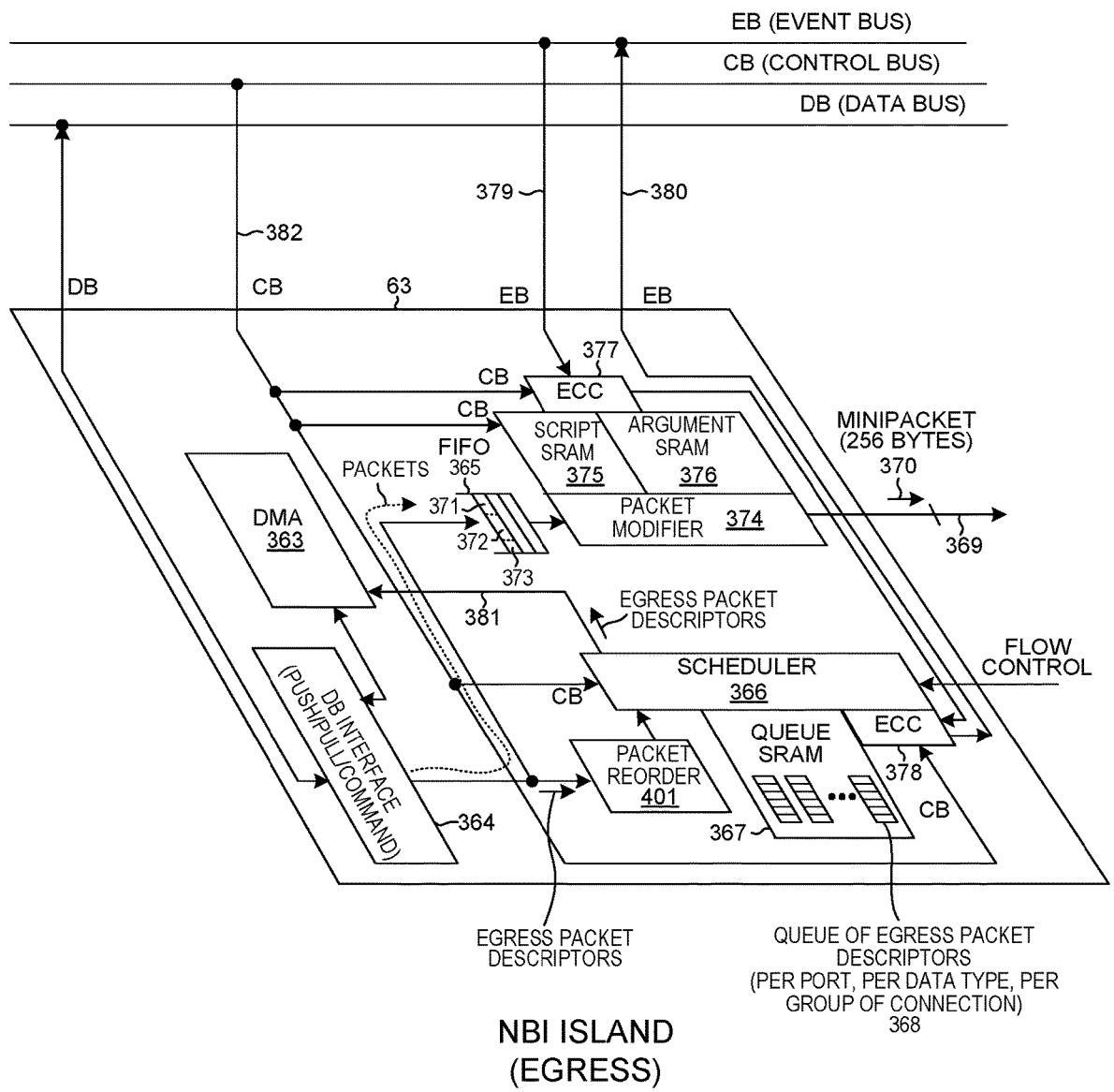
FIG. 53 is a diagram of egress NBI island 63.

FIG. 53 is a diagram of egress NBI island 63. In the operational example, ME island 66 instructs the egress NBI island 63 to transmit a packet by supplying the egress NBI island with an egress packet descriptor of the packet to be transmitted. The ME island supplies the egress packet descriptor to the egress NBI island by issuing a transmit packet command across the configurable mesh data bus and to the packet reorder block 401. The packet reorder block 401 responds by pulling the packet descriptor from the ME island across the configurable mesh data bus. In this way, multiple egress packet descriptors enter packet reorder block 401. These egress packet descriptors are reordered so that the descriptors for the packets of a flow are in proper sequence. The scheduler 366 receives the properly ordered egress packet descriptors and pushes them onto appropriate queues in queue SRAM 367. Each such queue of egress packet descriptors is per port, per data type, per group of connections. Reference numeral 368 identifies one such queue. Packets of a connection in this case share the same set of source and destination IP addresses and TCP ports. Scheduler 366 schedules packets to be transmitted by popping egress packet descriptors off the queues in appropriate orders and at appropriate times, and by supplying the popped egress packet descriptors via conductors 381 to the DMA engine 363.

DMA engine 363 receives such an egress packet descriptor, and based on the information in the descriptor, transfers the payload portion and the header portion of the packet across configurable mesh data bus and DB interface 364 and into FIFO 365. In the illustration of FIG. 47, each entry in FIFO 365 includes a complete packet having the header portion 371, the payload portion 372, and a script identifier portion 373. The script identifier portion 373 was added by the ME island. As a result of the lookup performed at the direction of the ME island, a packet policy was determined, and part of this packet policy is an indication of what of the packet header to change and how to change it before the packet is transmitted. An example of such a modification is to change the MAC source and destination addresses at the time the packet is output from the IB-NFP.

In a typical MPLS router, the MPLS labels of packets can remain the same as the packets flow into and through and out of the router. The MAC addresses of such a packet, however, should be changed on a hop by hop basis. The MAC hop on the ingress may be different from the MAC address on the egress. Accordingly, the packet exiting the MPLS router should have its source and destination MAC addresses changed to be appropriate for the next MAC hop into which the packet will be transmitted. The ME island supplies a script identifier portion for each packet for this purpose. The script identifier portion includes a code that identifies one of the scripts present in script SRAM 375. The identified script, when executed by packet modifier 374, causes the MAC addresses for the associated packet to be changed to values stored in an associated argument SRAM 376. Each resulting modified packet is then output from the egress NBI island 63 as a sequence of 256 byte minipackets across dedicated connections 369 to egress MAC island 64. Reference numeral 370 identifies one such minipacket.

Error conditions detected by ECC circuits 377 and 378 are injected into a local event ring in the form of event packets. Event packets from the local event ring are received onto the egress NBI island via connections 379, and event packets from the egress NBI island are supplied through the remainder of the local event ring via connections 380. Various parts of the egress NBI island are configurable. Configuration information for this purpose is received onto the egress NBI island from the control bus CB via connections 382.

Figure 54:
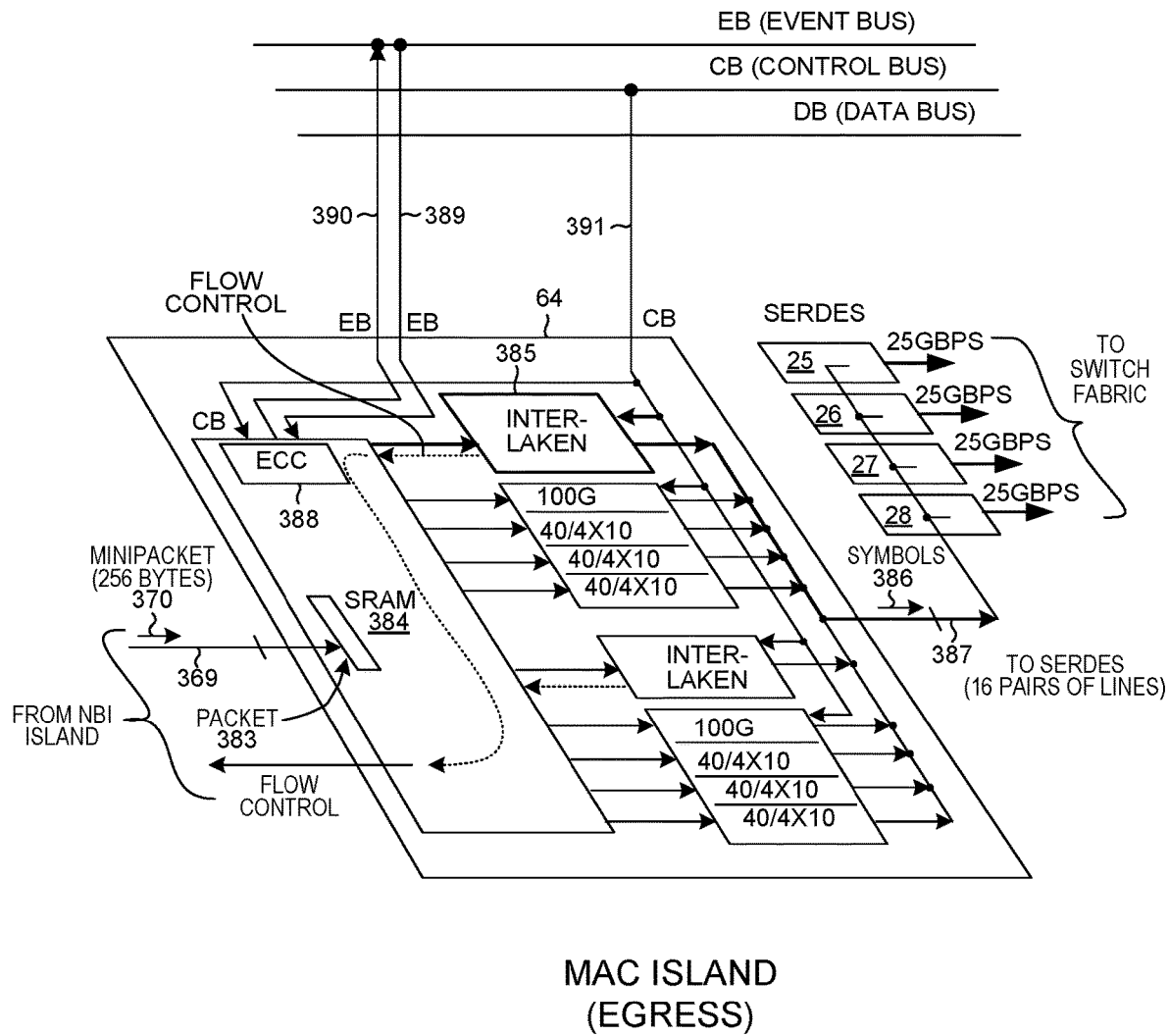
FIG. 54 is a diagram of egress MAC island 64 and SerDes blocks 25-28.

FIG. 54 is a diagram of egress MAC island 64. A packet 383 for transmission are received from egress NBI island 63 in the form of minipackets 370 via dedicated connections 369. The packets are buffered in SRAM 384. In the operational example, the packets to be output from the egress MAC island via are converted into symbols by Interlaken block 385. The resulting symbols 386 pass via dedicated connections 387 to the four SerDes I/O blocks 25-28. As described above in connection with FIG. 1, the four SerDes I/O blocks are coupled by SerDes connections 29 to switch fabric 9 of the MPLS router 1. ECC circuitry 388 of SRAM 384 is made a part of a local event ring via EB connections 389 and 390. Sub-circuits of MAC island are configurable. Configuration information for these sub-circuits is received from the control bus tree via connections 391.

Figure 55:
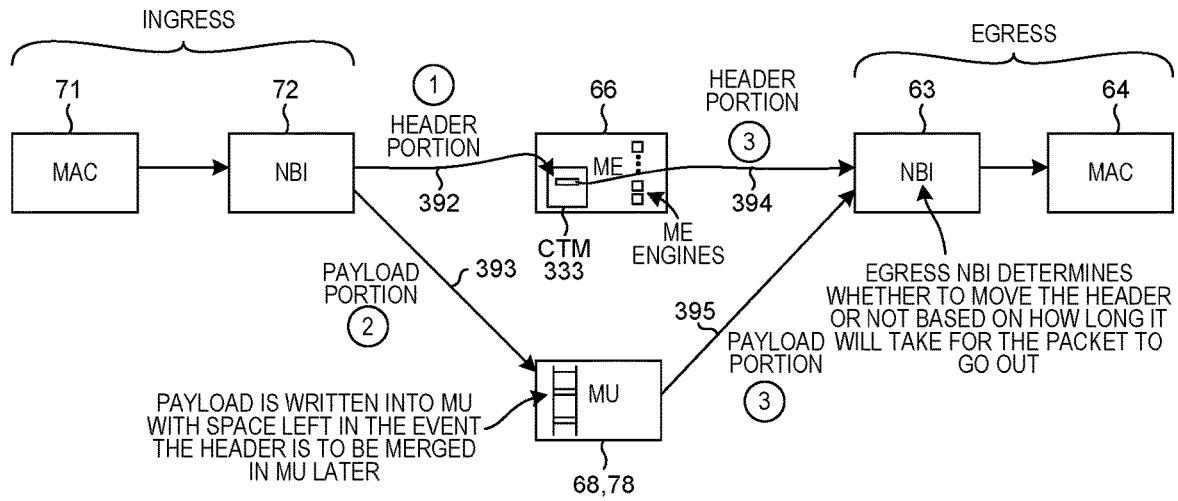
FIG. 55 is a diagram that illustrates a packet flow in the operational example when local memory resources in the CTM 333 of the ME island 66 are determined not to be scarce (for example, the processing resource is determined not to be below a predetermined threshold).

FIG. 55 is a diagram that illustrates a packet flow in the operational example when local memory resources in the CTM 333 of the ME island 66 are determined not to be scarce. An incoming packet passes through the ingress MAC island 71 and the ingress NBI island 72 as described above. Arrow 392 indicates that the header portion is then transferred (Step 1) across the configurable mesh data bus into CTM 333 of ME island 66, whereas arrow 393 indicates that the payload portion of the packet is transferred (Step 2) across the configurable mesh data bus into the MU island 68,78 without being stored in the ME island. The payload portion of each packet is stored in the MU island such that spare memory space is left at the beginning of where the payload is stored. That spare memory space is adequate to accommodate the header portion of the packet without overwriting other packet payloads. In the case of FIG. 55, however, the header portion is never written into the MU island. Microengines of the ME island and hardware engines of the MU island analyze and process the packet. Arrow 394 indicates that the header portion is then transferred (Step 3) from the ME island 66 and to the egress NBI island 63. Arrow 395 indicates that the payload portion is transferred (Step 3) from the MU island 68, 78 to the egress NBI island 63. The same step number is used because these transfers may occur simultaneously. The header portion and the payload portion are combined in the NBI island 63 and then pass through the egress MAC island 64 and the four SerDes I/O blocks and out of the IB-NFP integrated circuit.

Figure 56:
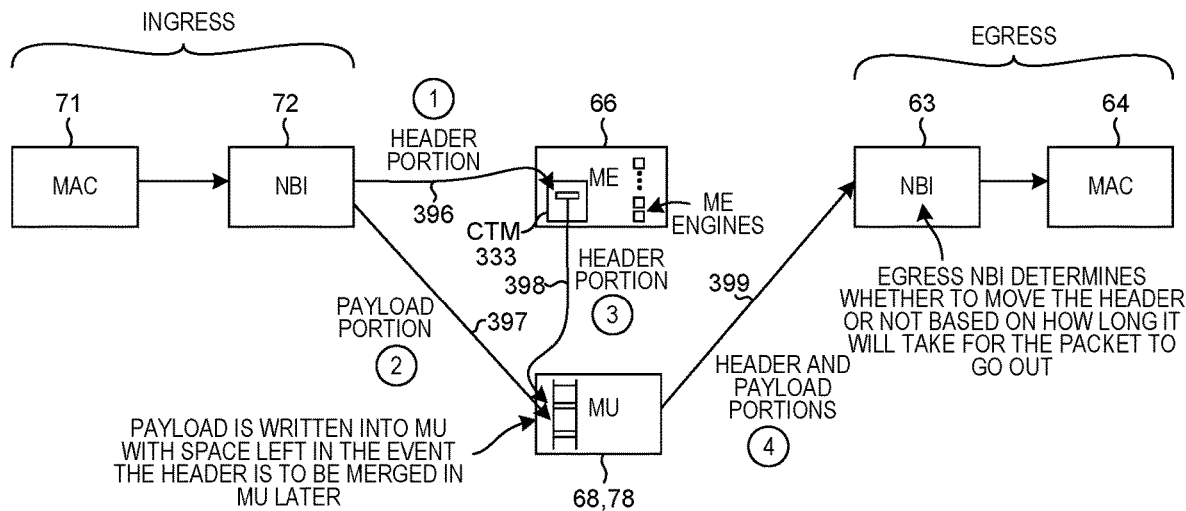
FIG. 56 is a diagram that illustrates a packet flow in the operational example when local memory resources in the CTM 333 of the ME island 66 are determined to be scarce (for example, the processing resource is determined to be below a predetermined threshold).

FIG. 56 is a diagram that illustrates a packet flow in the operational example when local memory resources in the CTM 333 of the ME island 66 are determined to be scarce. An incoming packet passes through the ingress MAC island 71 and the ingress NBI island 72 as described above. As indicated by arrow 396, the header portion is then transferred (Step 1) across the configurable mesh data bus into CTM 333 of ME island 66. Arrow 396 indicates that the payload portion of the packet is transferred (Step 2) across the configurable mesh data bus into the MU island 68, 78 without being stored in the ME island. As in the case described above in connection with FIG. 55, the payload portion of each packet is stored in the MU such that spare memory space exists at the beginning of where the payload is stored. The spare memory space is adequate to accommodate the header portion without overwriting other packet payloads. Based on how long it will take before the packet will be transmitted from the IB-NFP, the egress NBI island 63 determines that the header portion shall be moved from the ME island and to MU island in order to free up resources in the CTM 333 of the ME island. As indicated by arrow 398, the header portion is transferred (Step 3) from the ME island and is stored into the ME island into the spare memory space at the beginning of its associated payload portion. Microengines of the ME island and hardware engines of the MU island analyze and process the packet. The packet may be analyzed before the transfer 398, or after the transfer 398, or both. When the scheduler of the egress NBI island determines that the packet is to be transferred for transmission from the IB-NFP integrated circuit, then the header portion and the payload portion are DMA transferred (Step 4) together directly from the MU island and across the configurable mesh data bus and to the egress NBI island. Arrow 399 indicates this transfer of the packet header and the packet payload. The packet then passes across dedicated connections from the egress NBI island 63 to the egress MAC island 64, and through the four SerDes blocks, and out of the IB-NFP integrated circuit.

Figure 57:
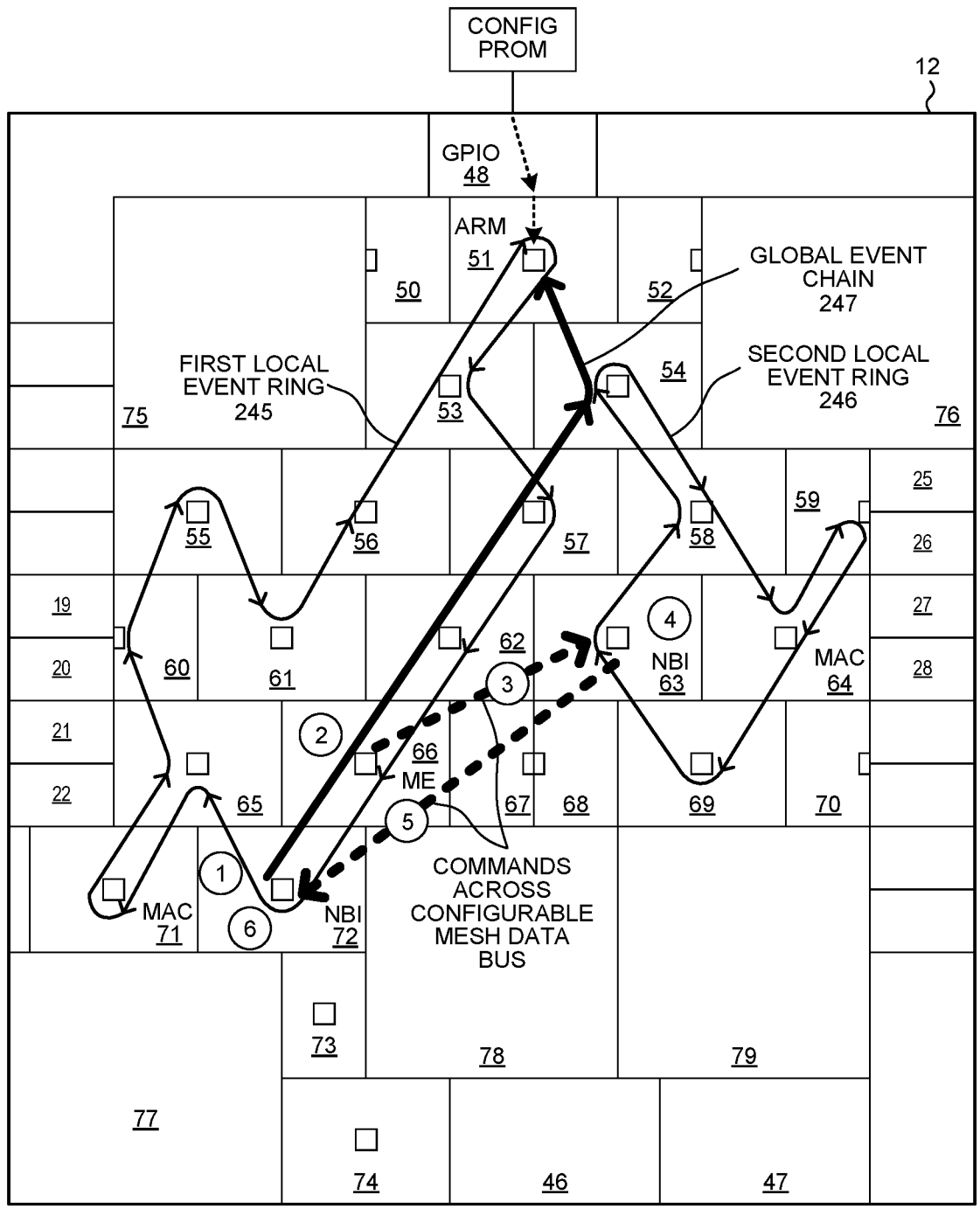
FIG. 57 is a diagram that illustrates the use of a local event ring and a configurable mesh data bus for flow control in the IB-NFP integrated circuit 12.

FIG. 57 is a configurable mesh event bus configured to take corrective action when system resources within an island are determined to be scarce. FIG. 57 shows the configurable mesh event bus of FIG. 39 configured to form a first 245 and a second 246 local event ring and a single global event chain 247. NBI island 72 corresponds to the NBI island 72 shown in FIG. 33 and FIG. 34. The first local event ring 245 flows through the ingress MAC island 71, ingress NBI island 72, ingress ME island 66, ARM island 51 and eight other islands (53, 57, 62, 65, 60, 55, 61, and 56). The second local event ring 246 flows through the egress NBI island 63, egress MAC island 64 and four other islands (54, 58, 59, and 69). The global event chain 247 begins on ingress NBI island 72, couples through island 66, island 62, island 57, island 54 and terminates on ARM island 51. Both local event rings are unidirectional, in that event packets travel in a single direction along the local event ring. The global event chain is unidirectional, in that global event packets travel in a single direction along the global event chain. While the global even chain has a single point of termination on ARM island 51, both local event rings have no fixed termination location. Rather, event packets are removed at different points along the local event ring depending upon where in the local event ring the event packet was inserted into the local event ring. Each local event ring operates as a source-release ring.

An exemplary request for additional system resources communicated across various islands is shown in FIG. 57. Ingress NBI island 72 determines (Step 1) that additional system resources are required. In response to the need for additional system resources, ingress NBI island 72 inserts an event packet into first local event ring 245. The event packet indicates the source of the event packet and the system resource requested. The event packet is communicated along the first local event ring 245 to ME island 66. Event ring circuit 248 within ME island 66 receives (Step 2) the event packet from ingress NBI island 72. In response to receiving the event packet requesting additional system resources, ME island 66 communicates a request for additional resources across the configurable mesh data bus to egress NBI island 63 (Step 3). In step 4, egress NBI island 63 determines what system resources are available and allocates the required system resources for use by ingress NBI 72. After allocating the required system resources, egress NBI island 63 communicates information regarding the allocated resources across the configurable mesh data bus to ingress NBI island 72 (Step 5). In step 6, ingress NBI island 72 receives the information regarding the allocated resources and begins utilization of the requested system resources. In an embodiment, a system resource is a processing resource. A processing resource may be an amount of buffer memory. A buffer memory may be used for storing incoming packet information. Additionally, information regarding the allocated resources may be a pointer address for the buffer memory being allocated.

Figure 58:
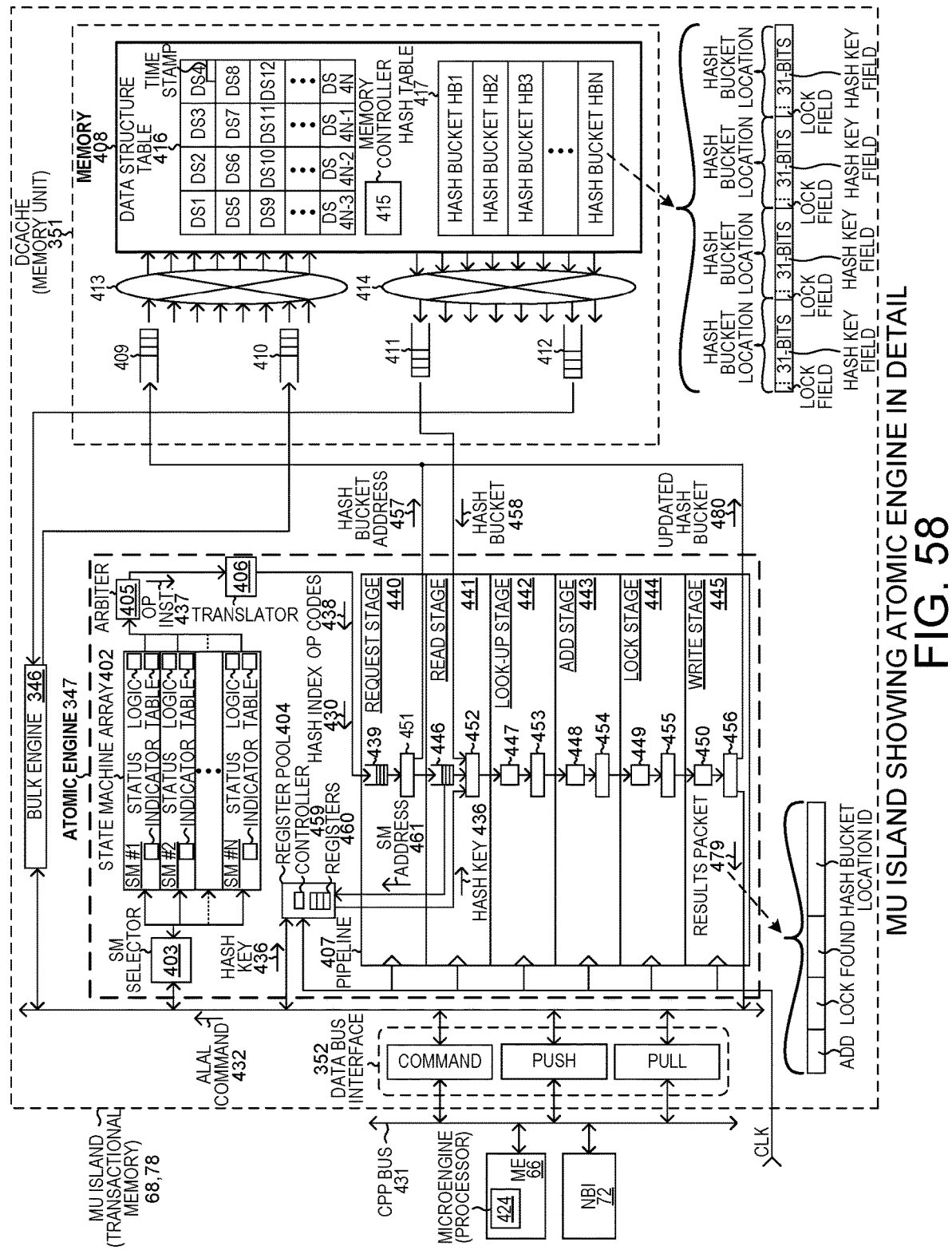
FIG. 58 is a diagram showing further detail of the atomic engine in the MU half island and block of FIG. 52.

FIG. 58 is a diagram showing the atomic engine 347 and data cache SRAM 351 of FIG. 52 in more detail. The MU island 68, 78 is a transactional memory. Atomic engine 347 includes a state machine array 402, a state machine selector 403, a register pool 404, an arbiter 405, a translator 406, and a pipeline 407. Dcache ("Memory Unit") 351 includes a memory 408, FIFOs 409-412, and two crossbar switches 413 and 414. Memory controller 415 manages reads from and writes to the memory. Memory 408 stores a data structure table 416 and a hash table 417. Data structure table 416 includes a plurality of data structures DS1-DSN. Hash table 417 includes a plurality of hash buckets HB1-HBN.

Figure 59:
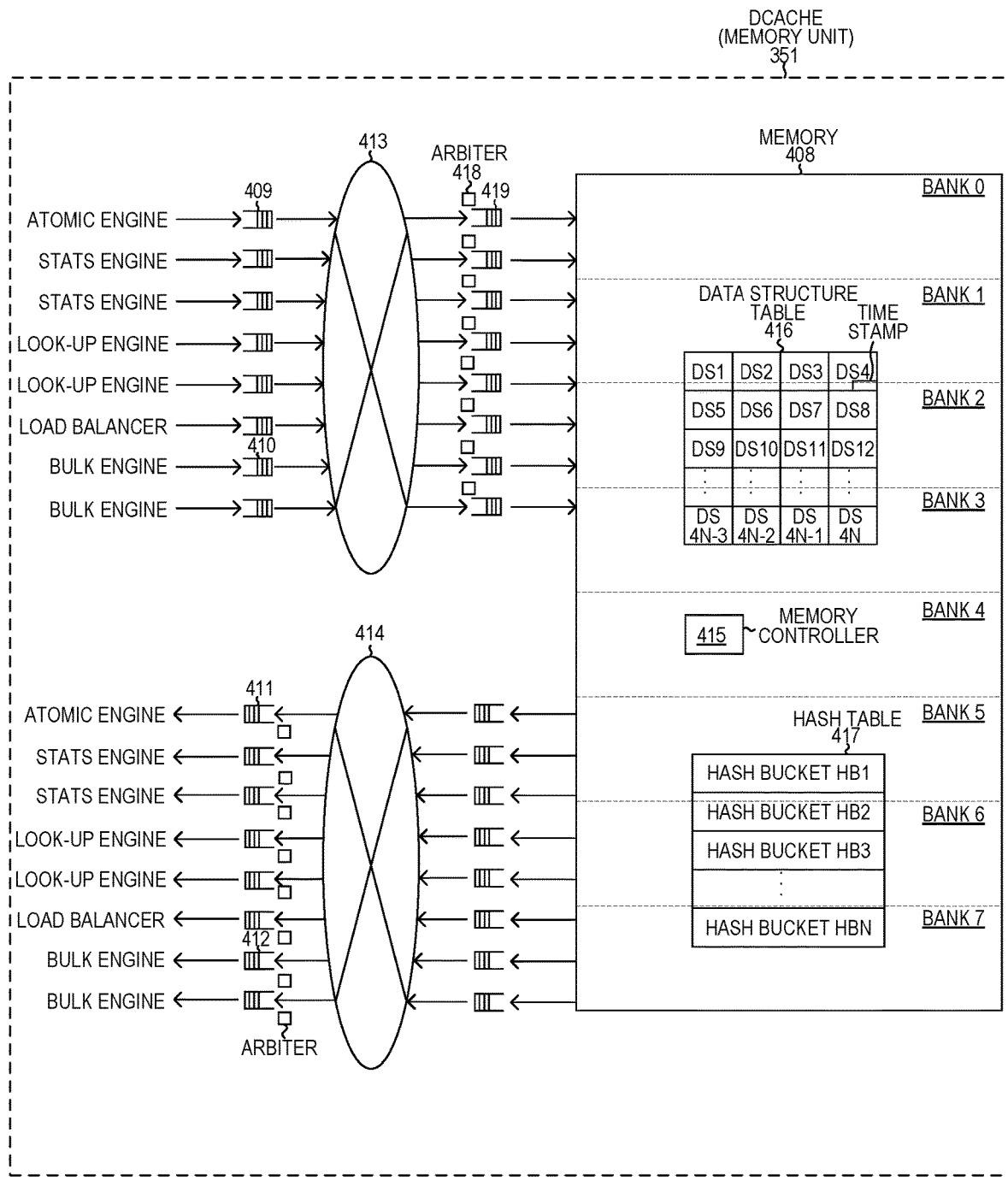
FIG. 59 is a diagram showing further detail of the Dcache (memory unit) in the MU half island and block of FIG. 52.

FIG. 59 is a more detailed diagram of Dcache ("Memory Unit") 351. Each incoming FIFO of a crossbar switch has an associated arbiter. For example, arbiter 418 is the arbiter for incoming FIFO 419. Each of the arbiters, such as arbiter 418, receives a separate request signal from each of the input FIFOs on the other side of IN crossbar 413.

Figure 60:
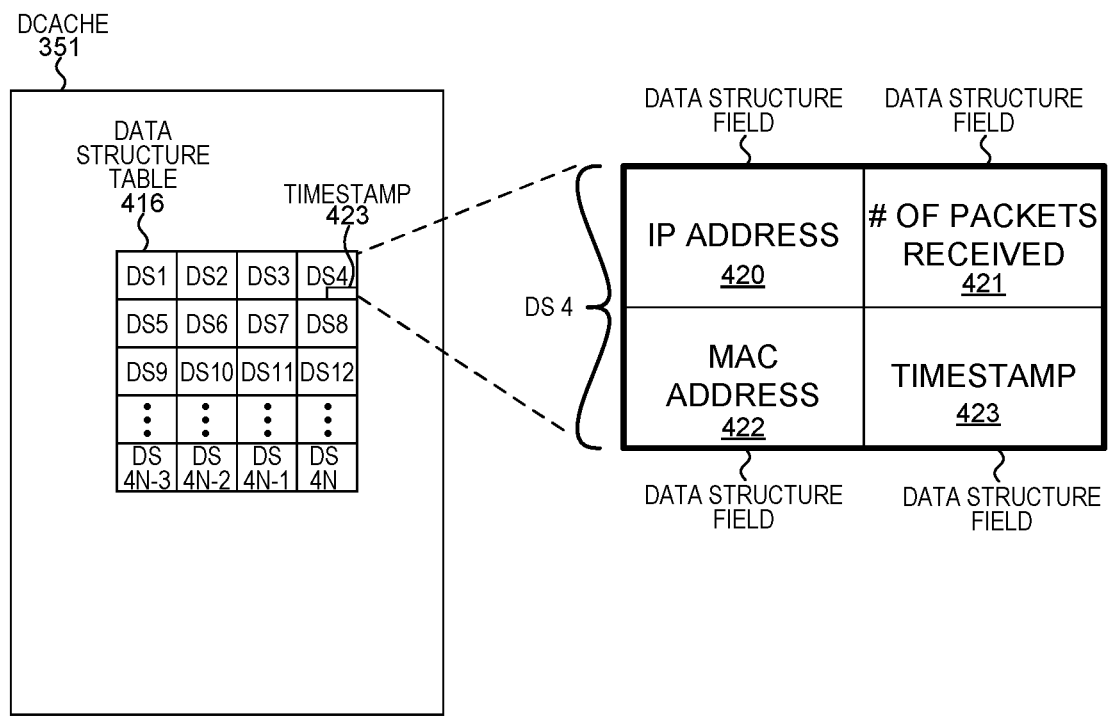
FIG. 60 is a diagram showing further detail of the data structure table stored in the Dcache 76 of FIG. 59.

FIG. 60 is a more detailed diagram of the data structure table 416 of FIG. 59. Each data structure includes four data structure fields: 1) an IP address field for storing an IP address, 2) a number of packets field for storing a number of packets received, 3) a MAC address field for storing a MAC address, and 4) a timestamp field for storing a timestamp. Data structure DS4 includes IP address field 420, number of packets received field 421, MAC address field 422 and timestamp field 423.

Figure 62:
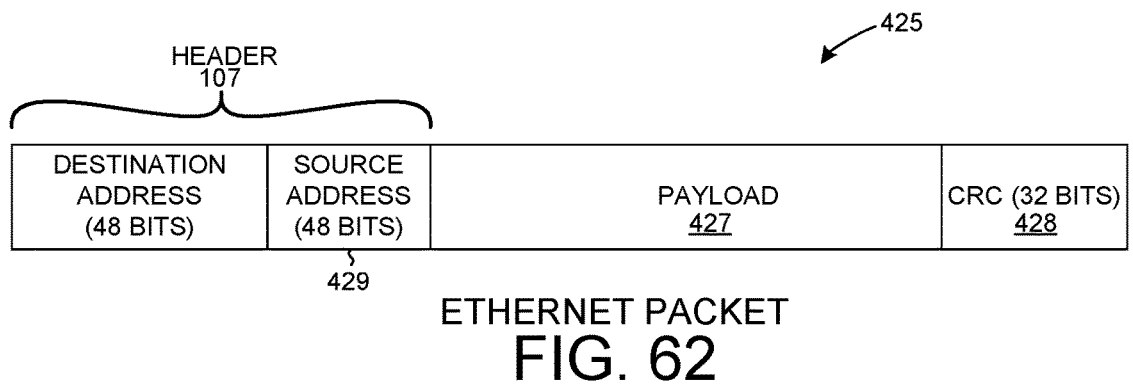
FIG. 62 is a diagram illustrating the contents of an ethernet packet.

In one example, one of the microengines 424 in ME island 66 receives an ethernet packet 425. The contents of ethernet packet 425 are illustrated in FIG. 62. Ethernet packet 425 includes a header 426, a payload 427, and a CRC 428. There is one data structure stored in memory 408 for each source address of incoming ethernet packets. Data structure DS4 in this example is the data structure for ethernet packets having the source address 429. A task to be performed is to use to source address 429 of the incoming ethernet packet to locate and access the data structure DS4, and then to update the timestamp field 423 in the data structure to log the time when the ethernet packet was received.

Figure 61:
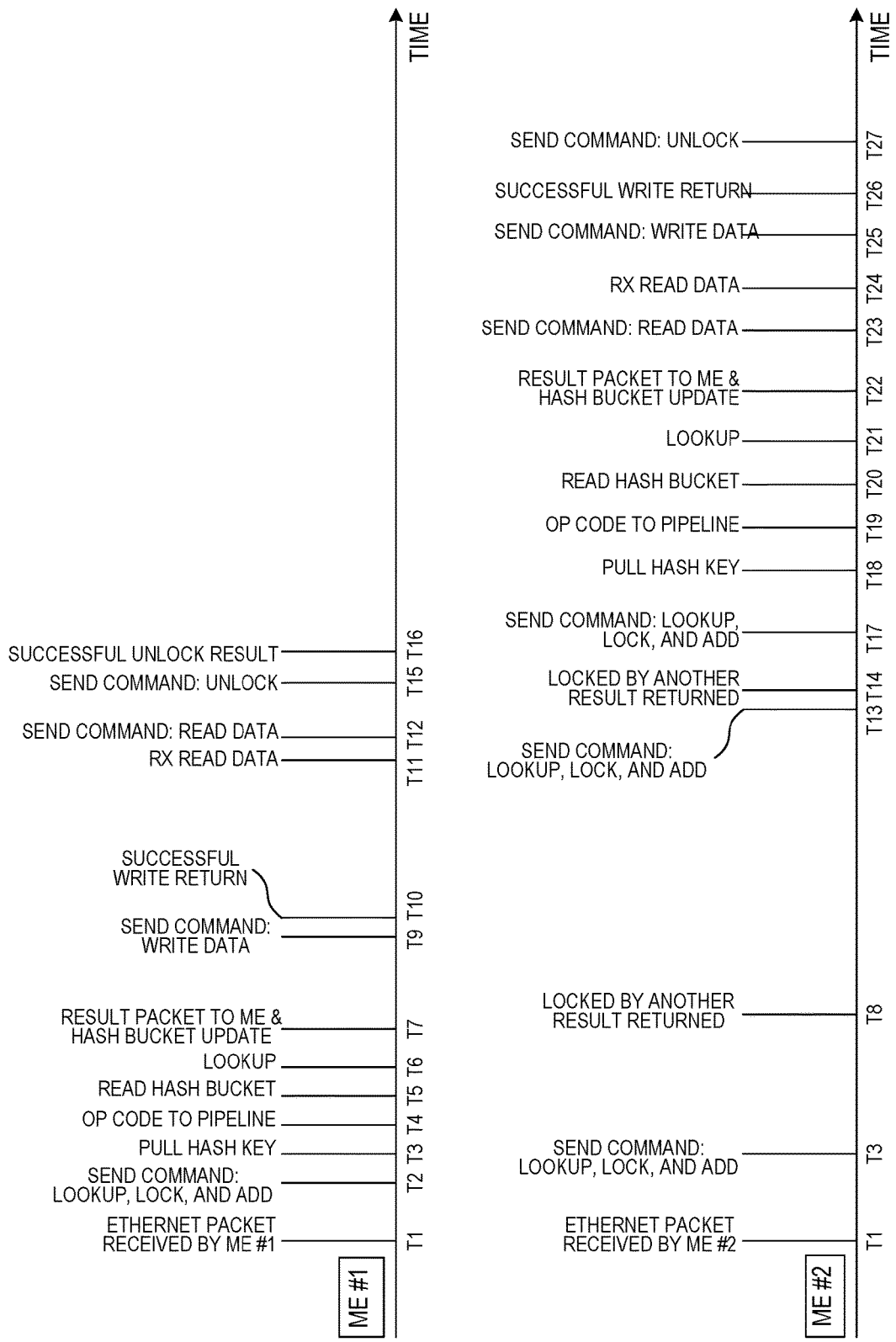
FIG. 61 is a timing diagram showing actions that occur during a carrying out of an Atomic Look-up, Add and Lock (ALAL) command.

FIG. 61 is a timeline. Events noted in the top line of FIG. 61 indicate actions pertaining to microengine 424 in ME island 66. Events noted in the bottom line indicate actions pertaining to another microengine in another ME island. The receiving of the ethernet packet 425 is indicated at time T1 in the timeline of FIG. 61. In response to receiving the packet, microengine 424 in ME island 66 uses a hash function to calculate a hash index 430. The hash index is related to the source address. In addition, microengine 424 sends an Atomic Lookup, Add and Lock (ALAL) command across the Command-Push-Pull (CPP) data bus 431 to the atomic engine 347 of MU island 68, 78. FIG. 61 shows the sending of the ALAL command to occur at time T2. Arrow 432 of FIG. 58 shows the incoming ALAL command. State machine selector 403 monitors the status indicator of each state machine and allocates the ALAL command 432 to an idle state machine.

Figure 63:
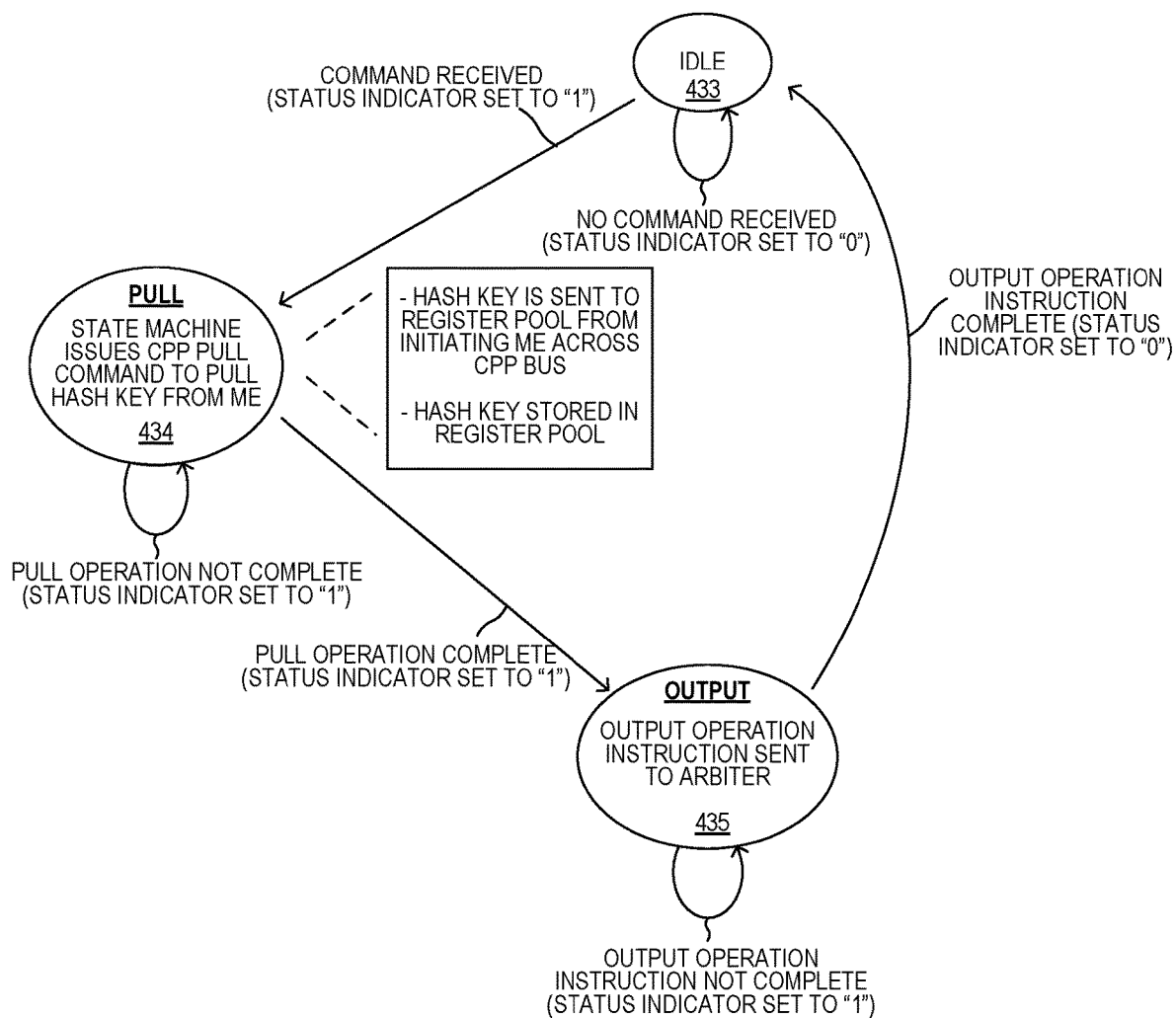
FIG. 63 is a state diagram illustrating the different states of one of the state machines within the atomic engine.

FIG. 63 is a state diagram for one of the state machines. Before receiving the ALAL command 432 from the state machine selector 403 the state machine is in the IDLE state 433. Receiving the ALAL command causes the state machine to transition from the IDLE state 433 to the PULL state 434. The state machine then causes a PULL bus transaction value to be sent via data bus interface 352 back to microengine 424 in ME island 66. This pull is an instruction to the microengine to write data (the data is a hash key) to the register pool 404 within MU island 68, 78. FIG. 61 shows the sending of the pull command to occur at time T3. Once the hash key 436 is received into the register pool, then the state machine transitions to the OUTPUT state 435. In state 435, the state machine outputs an operation instruction 437 to arbiter 405. The arbiter 405 arbitrates information flow to translator 406. Once the output operation is complete the state machine operations transitions from OUTPUT state 435 to IDLE state 433. Translator 406 converts the operation instruction 437 into a plurality of OP CODES 438. Part of the instruction is the hash index 430. Hash index 430 and the OP CODES 438 are supplied by the translator 406 to pipeline 407. FIG. 61 shows the sending of the OP CODES and the hash index to the pipeline occurring at time T4. The OP CODES 438 and hash index 430 are pushed into a FIFO 439 of request stage 440 of the pipeline. As indicated in FIG. 58, the pipeline includes stages 440-445. Each pipeline stage has an input register or FIFO, and an ALU. Reference numeral 446 identifies the input FIFO of the read stage 441 of the pipeline. Reference numerals 447-450 identify the incoming registers for pipeline stages 442-445, respectively. Reference numerals 451-456 identify the ALUs for pipeline stages 440-445, respectively.

Request stage 440 of the pipeline, in response to receiving the OP CODES 438 and hash index 430, outputs a hash bucket address 457. The hash bucket address 457 includes the hash index 430, as well as a hash base identifier. The hash base identifier indicates one of several possible hash tables. In the case that only one hash table is utilized, the hash base identifier is not necessary. FIG. 61 shows the outputting of hash bucket address 457 to read a hash bucket from hash table 417 at time T5. Request stage 440 generates a read request including hash bucket address 457. The hash bucket address passes through FIFO 409, and crossbar switch 413, to memory controller 415. The hash bucket address is an address that identifies one of the hash buckets. The identified hash bucket 458 is returned via crossbar switch 414 and FIFO 411 to the read stage 441 of the pipeline.

Figure 64:
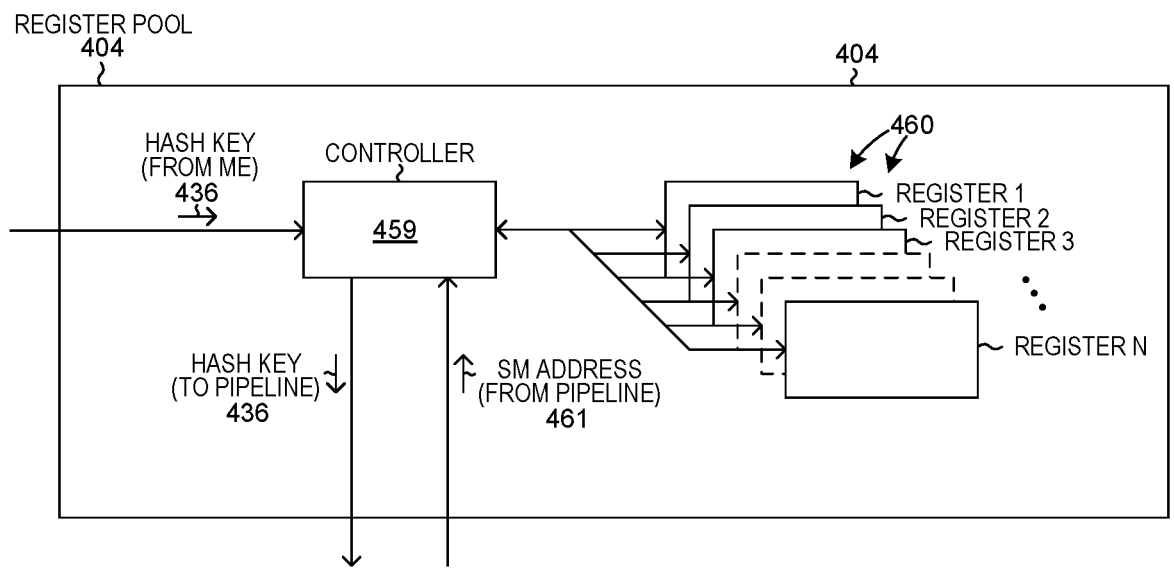
FIG. 64 is a simplified diagram of the register pool within the MU half island and block.

FIG. 64 is a more detailed diagram of register pool 404. Register pool 404 includes a controller 459 and a plurality of registers 460. There is one register in the register pool for each state machine. Controller 459 reads a state machine address 461 out of the last location of the FIFO 446 of the read stage 441 of the pipeline, and uses the state machine address 461 to identify the associated register. The associated register stores the hash key 436 that was pulled from the ME island. Controller 459 reads the hash key 436 from the appropriate register and supplies the hash key 436 to the read stage 441.

Figure 65:
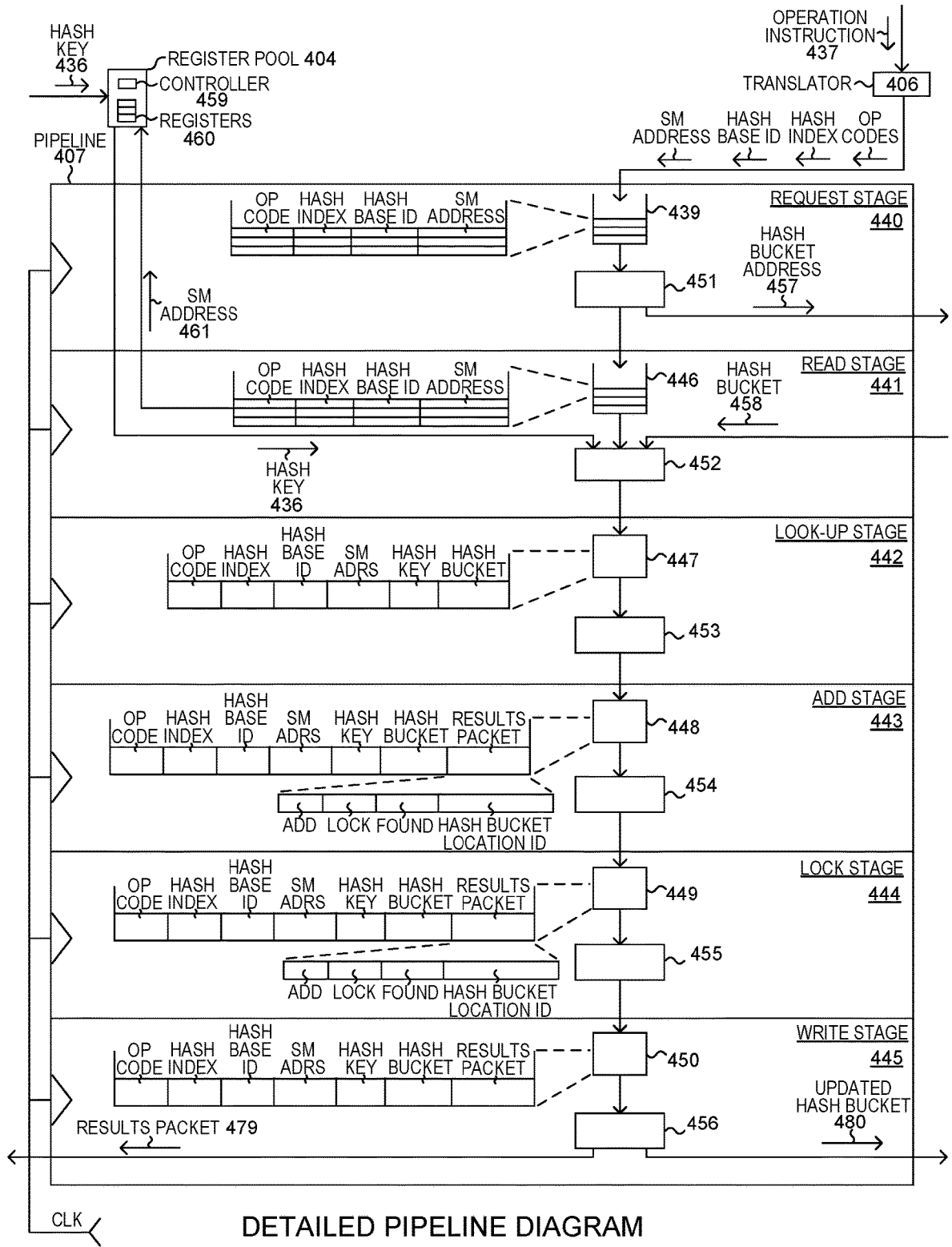
FIG. 65 is a more detailed diagram of the pipeline showing the contents of each FIFO and register within the atomic engine of the MU half island and block.

FIG. 65 is a more detailed diagram that shows the contents of the FIFOs and registers of the various stages of the pipeline. The hash key 436 and the hash bucket 458 pass through ALU 452 and are loaded into register of lookup stage 442.

Figure 66:
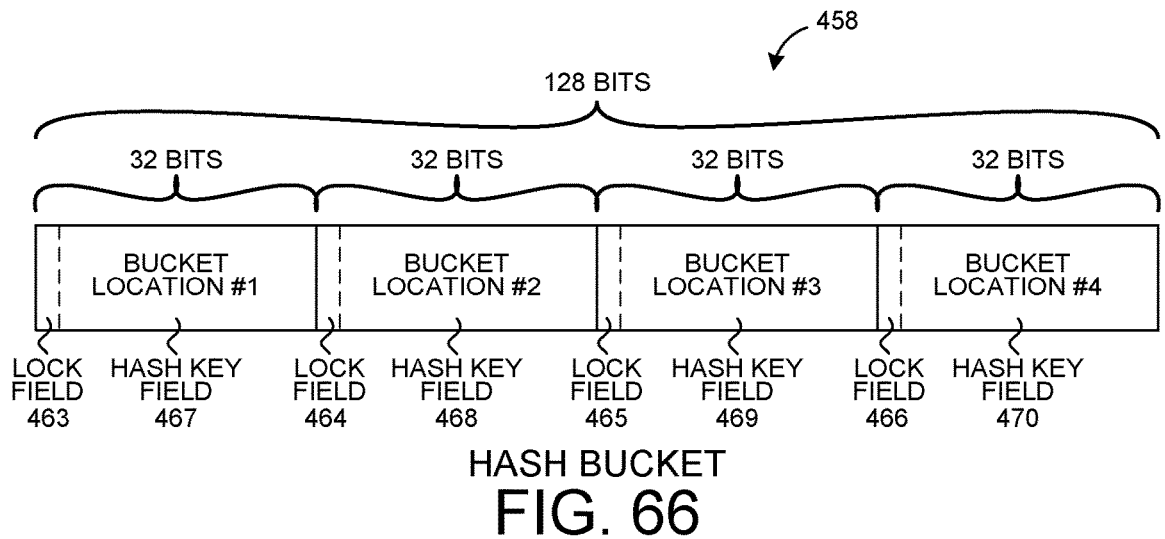
FIG. 66 is a diagram illustrating the contents of a hash bucket.

FIG. 66 is a more detailed diagram of hash bucket 458. Hash bucket 458 includes four 32-bit fields. Each 32-bit field includes a hash bucket location and an associated lock field. In one example, the hash bucket location is 31 bits and the associated lock field is 1 bit. The lock fields are indicated with reference numerals 463-466. The hash bucket locations are indicated with reference numerals 467-470. Each hash bucket has the identical structure. A hash bucket location may be occupied in that it stores a hash key, or may be vacant in that it does not store a hash key.

Figure 67:
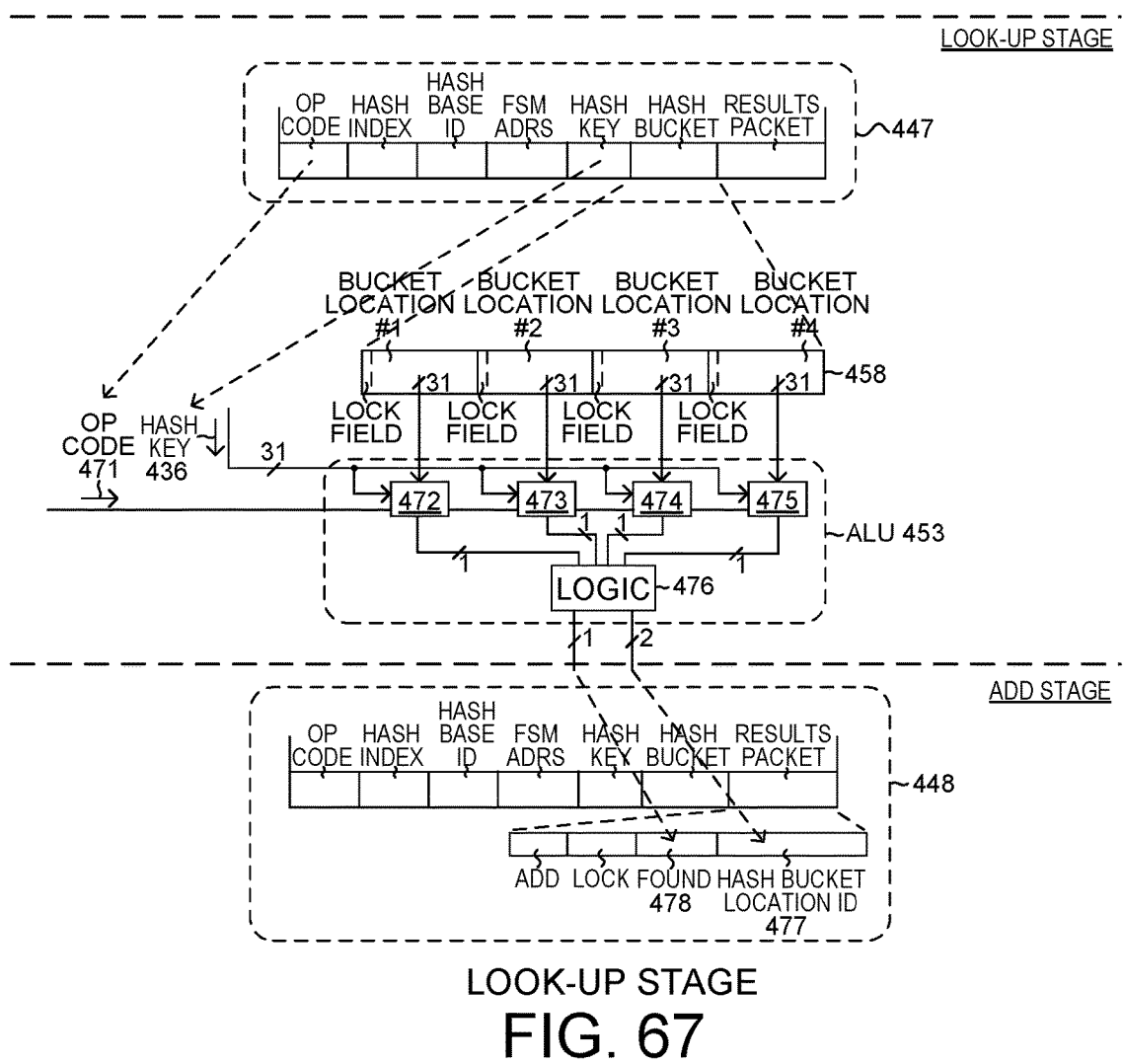
FIG. 67 is a more detailed diagram of the Look-Up stage within the pipeline of the atomic engine of the MU half island and block.

FIG. 67 is a diagram that illustrates operation of the lookup stage 442 of the pipeline. The OP CODES 438 shown in FIG. 58 include an OP CODE for each of the stages of the pipeline. The OP CODE 471 for the lookup stage is supplied to the ALU 453 to determine the combinatorial logic function performed by the ALU. In the present example, ALU 453 includes four comparators 472-475. Each comparator compares the contents of a corresponding hash key field of the hash bucket 458 with the hash key 436. As indicated in FIG. 67, the hash bucket 458, the OP CODE 471, and the hash key 436 are supplied to the ALU 453 by the register 447. Each one of the comparators 472-475 outputs a single digital bit value indicating whether the corresponding hash bucket entry matched the hash key 436. The resulting four digital bit values as output by the comparators are encoded by logic 476 into a two-bit hash bucket location ID value 477 and a one bit found value 478. The hash bucket location ID value 477 and the found bit value 478 are loaded into bit locations in the register 448 of the next stage of the pipeline. If the found bit 478 is set then an entry in a hash bucket location matched the hash key 436, whereas if the found bit 478 is not set then no hash bucket location matched the hash key 436. If there was a match, then the two-bit hash bucket location ID is a number that identifies one of the four hash bucket locations that had the matching entry. The information stored in the FIFOs and registers of the various stages is indicated in FIG. 65. Depending on the OP CODES, the various stages perform various operations and fill in information in a results packet 479. An example of the contents included in the results packet is illustrated in FIG. 68. FIG. 61 shows the lookup operation occurring at time T6.

In this example, the data structure associated with the source address of ethernet packet 425 was not found. As a result, the add stage 443 of the pipeline adds the missing hash key into a vacant hash bucket location within the hash bucket. Once the missing hash key has been added, the lock stage of the pipeline sets the lock field of the added hash bucket location, thereby locking the associated data structure. Next, the write stage 445 of the pipeline supplies the results packet 479 via data bus interface 352 across the CPP data bus to the initiating microengine 424 on the ME island 66. In addition, the write stage 445 of the pipeline generates and communicates a write command including the updated hash bucket 480 (that contains the added hash key 436) to memory controller 415 via FIFO 409. Memory controller 415 writes the updated hash bucket 480 into hash bucket HB1 of the hash table 417. FIG. 61 shows the supplying of the results packet 479 to the ME island 66 and the updating of the hash bucket HB1 to be occurring at time T7.

At this point in the process, the data structure DS4 for the source address of the received packet 425 has been locked and microengine 424 has received the results packet 479. From the hash bucket location ID value of the results packet 479, the microengine 424 determines the location of the data structure DS4. Microengine 424 then performs a write across the CPP data bus 431, through the bulk engine 346, and to the timestamp field 423 of data structure DS4. FIG. 61 shows this writing of the timestamp to be occurring at time T9 and communication of a successful write operation at time T10. Microengine 424 can read from, and write to, data structure DS4 as it wishes multiple times. In FIG. 61, such reads and writes are indicated to be occurring at times T11-T12. Once microengine 424 no longer needs access to DS4, then microengine 424 unlocks DS4 by issuing an atomic command to the atomic engine 347. The atomic command causes the pipeline to clear the lock field of the hash bucket location associated with DS4. FIG. 61 shows this clearing of the lock field occurring at time T15. After the clearing, the pipeline returns a results packet to the initiating microengine 424 indicating that the associated hash bucket location is unlocked. In FIG. 61, this returning of the results packet indicating that the hash bucket location is unlocked is indicated to occur at time T16.

The ALAL command provides protection against memory contention. This is illustrated in FIG. 61 where a second microengine ME#2 attempts to access the same data structure DS4 while the data structure DS4 is locked by microengine 424. In this example, the other microengine receives the same ethernet packet 425 at time T1, but when it issues its atomic ALAL command at time T3, the data structure DS4 has already been locked. The results packet for the atomic command from the other microengine indicates that the data structure DS4 is locked. In FIG. 61, this is indicated to occur at time T8. The second microengine is barred from access to DS4 and waits until time T13 to attempt another atomic ALAL command to access the same data structure. At time T13, the data structure is still locked, so at time T14 the returning results packet indicates that the data structure DS4 is still locked. At time T17 the other microengine issues its third atomic command to access DS4. This time, DS4 is unlocked due to the unlock command sent by microengine 424 at time T15. As a result of the atomic command, at times T18-21 the transactional memory locks DS4 and returns a results packet at time T22 indicating that DS4 is now locked for use by the other microengine. The operations performed at times T18-21 correspond to the operations performed at times T3-6. The other microengine can then read and write to the data structure (as indicated to occur at times T23-26). When the other microengine now longer needs access to DS4, the other microengine sends an atomic command to unlock DS4 at time T27.

Figure 69A:
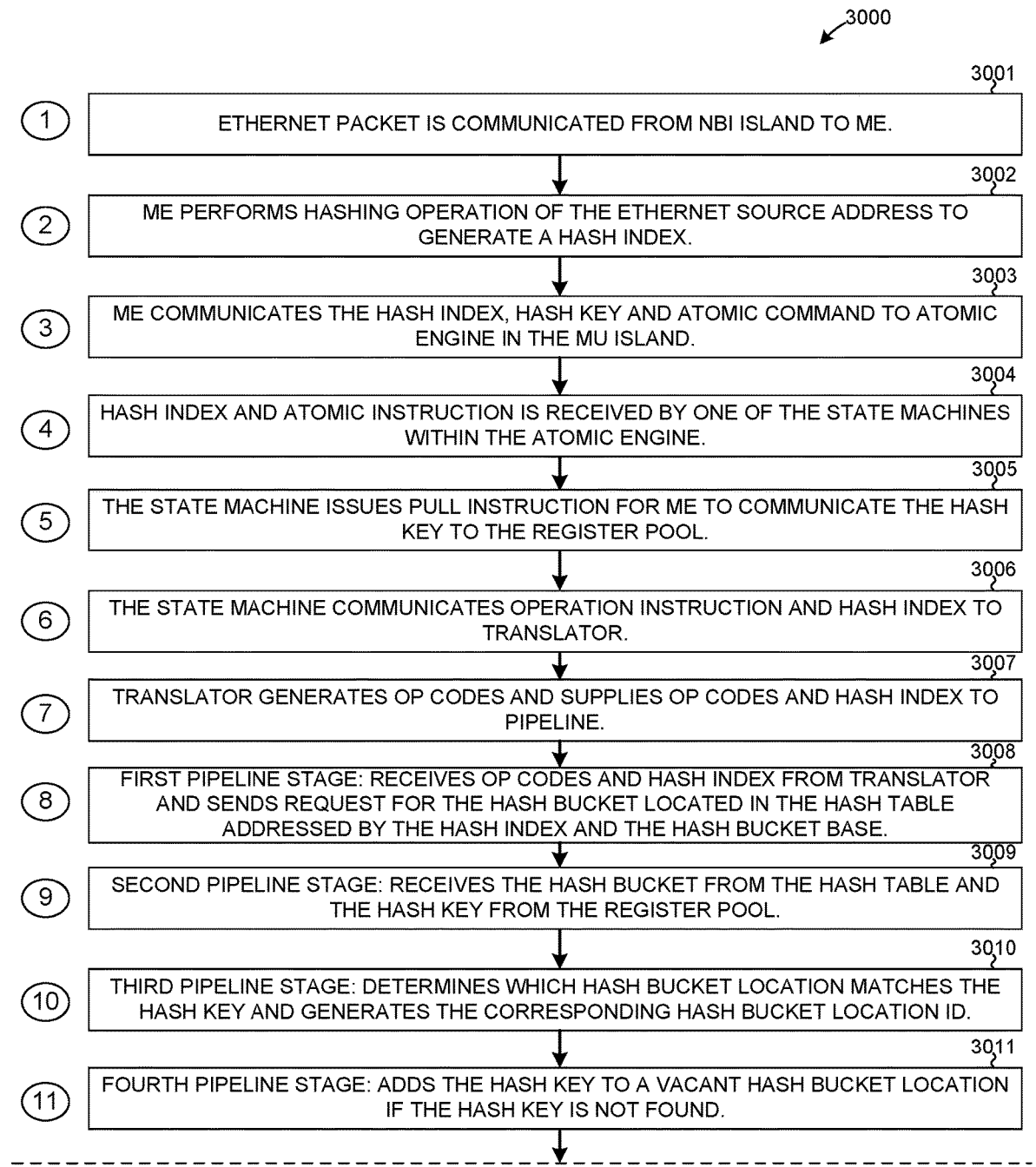
FIG. 69A is a first part of a flowchart that describes operation of a transactional memory in response to an Atomic Look-up, Add, and Lock command.
Figure 69B:
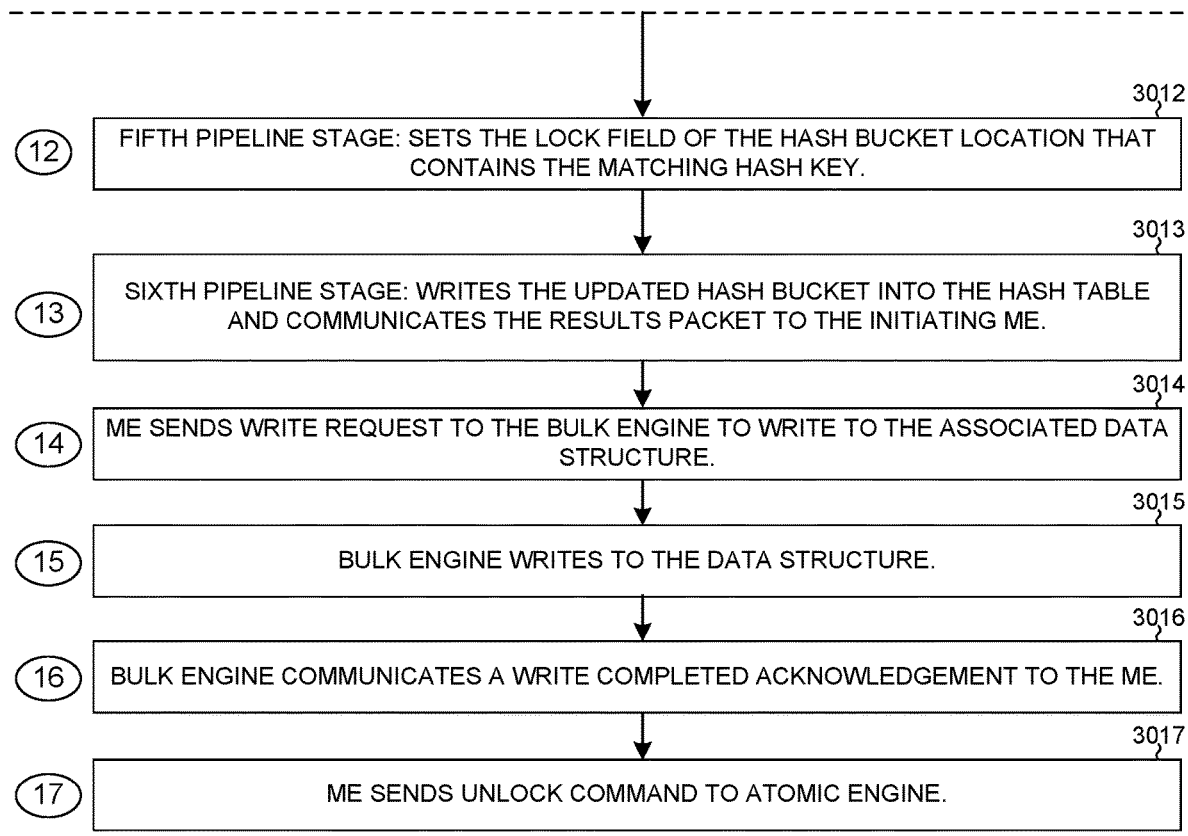
FIG. 69B is a second part of a flowchart that describes operation of a transactional memory in response to an Atomic Look-up, Add, and Lock command.

FIG. 69A and FIG. 69B together are a flowchart of a method 3000 in accordance with one novel aspect. The steps 3001-3017 of method 3000 are steps in the example described above.

Figure 70:
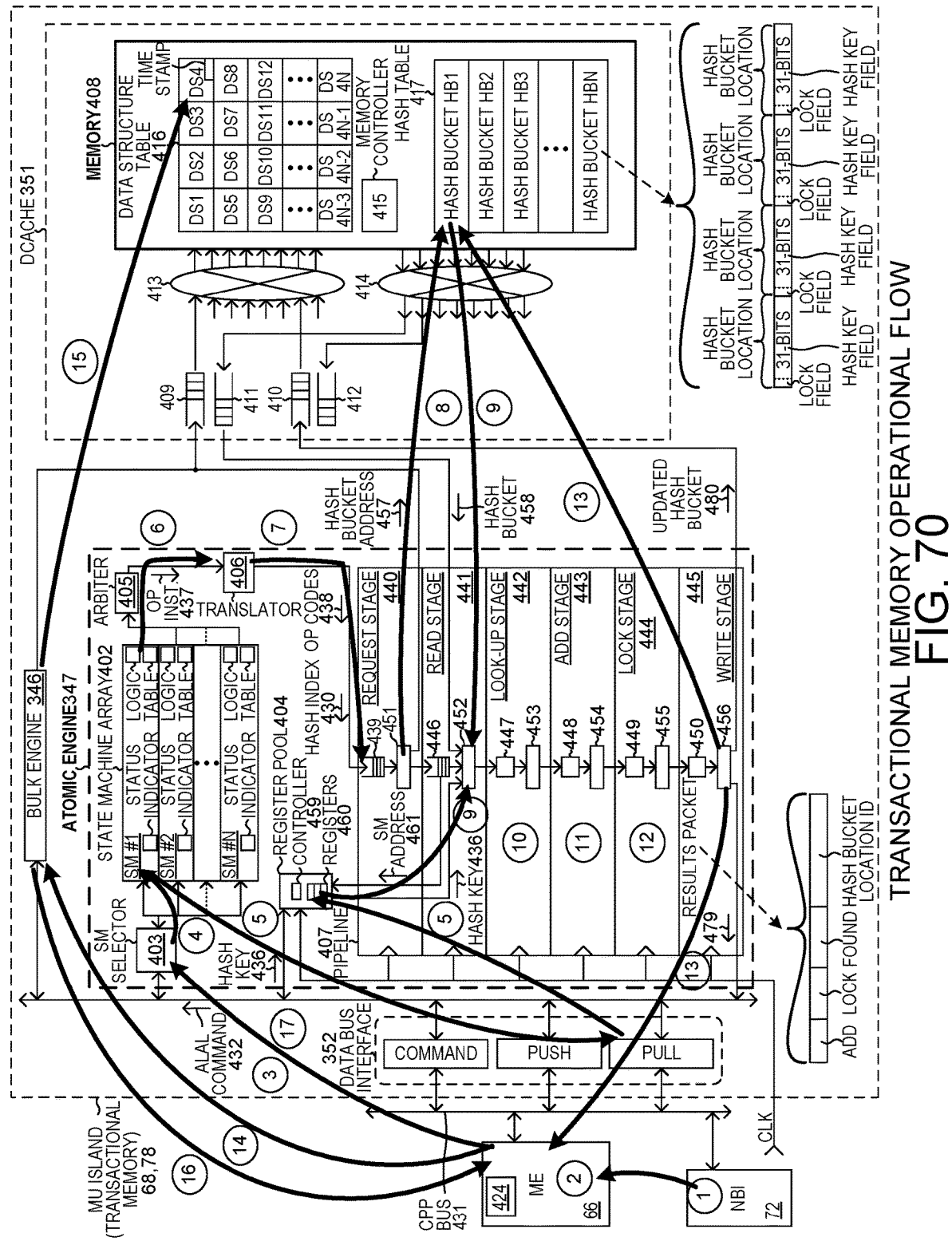
FIG. 70 is a diagram showing action arrows that correspond to each step described in the flowchart of FIG. 69A and FIG. 69B.

FIG. 70 is a diagram of ME island 66 and MU island (Transactional Memory) 68,78. In FIG. 70, an arrow labeled with a number in a circle corresponds to the step in method 3000 of FIG. 69A and FIG. 69B that is labeled with the same circled number.

Figure 71:
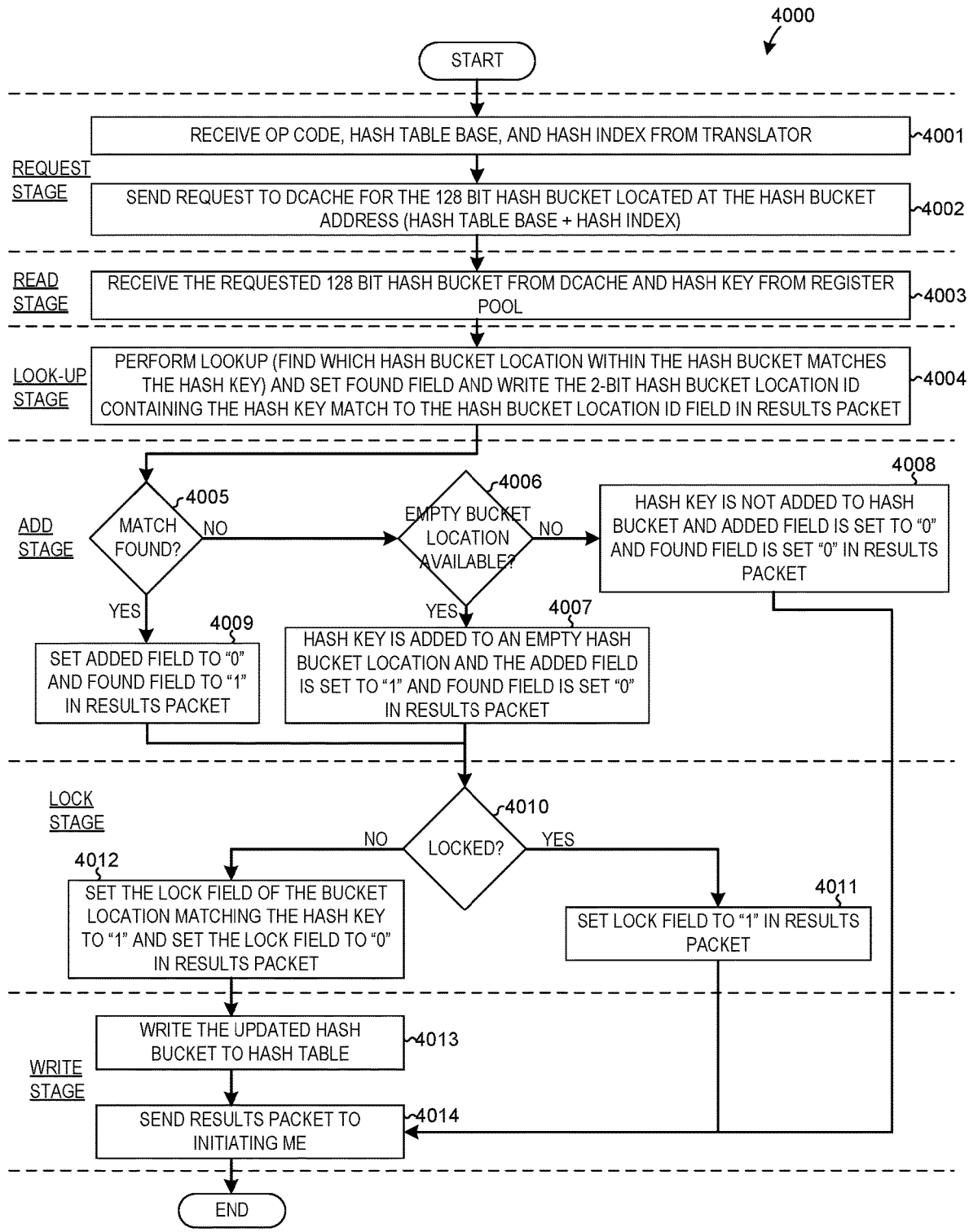
FIG. 71 is a detailed operational flowchart of the pipeline within the atomic engine of the MU half island and block 68,78 of the IB-NFP integrated circuit 12 of FIG. 1.

FIG. 71 is a simplified logic flowchart that illustrates functions pipeline 407 can perform. Steps 4001-4004 correspond to steps 3008-3010 of the flowchart of FIG. 69A and FIG. 69B. In the example described above in connection with FIG. 61, the scenario involved the hash key not being found and as a result the missing hash key was added to the hash bucket location. These operations are shown in FIG. 71 in blocks 4005-4007. If the hash key is not found, and there are no vacant hash bucket locations within the hash bucket location, then (step 4008) the results packet sent to the microengine indicates that the hash key was not found and that the hash key was not added to the hash bucket. In other scenarios, the hash key is found in the hash table. This corresponds to match found decision diamond 4005 being true and processor flow proceeding to block 4009. When the hash key is found in the hash table, there are two possibilities: the hash bucket location is locked or the hash bucket location is unlocked. The situation of the hash bucket location being locked corresponds to decision diamond 4010 being true and process flow proceeding to block 4011. The lock field in the results packet is set and the results packet is sent (step 4014) to the initiating microengine to inform the initiating microengine that the associated data structure is locked by another microengine. The situation of the hash bucket location being unlocked corresponds to locked decision diamond 4010 being false and process flow proceeding to block 4012. The lock field in the results packet is cleared to "0" indicating to the initiating microengine that the associated data structure is not locked. The updated hash bucket is written into the hash table (step 4013), and the results packet is sent to the initiating microengine (step 4014) indicating to the initiating microengine that the hash key was found and that the associated data structure is not locked by another microengine.

For additional information on the IB-NFP 12 of FIG. 1 including information about the transactional memory of FIG. 52 and its hardware engines, see: U.S. patent application Ser. No. 13/552,555 entitled "Recursive Lookup With A Hardware Trie Structure That Has No Sequential Logic Elements" filed on Jul. 18, 2012 (the entire subject matter of which is incorporated herein by reference).

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An Island-Based Network Flow Processor (IB-NFP) integrated circuit comprising:
a plurality of processor islands, wherein each of the processor islands is of identical rectangular shape, wherein each processor island comprises a processor;
a plurality of Multi-threaded Transactional Memory (MTM) islands, wherein each of the MTM islands is of identical rectangular shape, wherein each MTM island comprises an MTM;
a packet ingress island of a rectangular shape, wherein the packet ingress island comprises packet ingress circuitry;
a packet egress island of a rectangular shape, wherein the packet egress island comprises packet egress circuitry; and
a configurable mesh posted transaction data bus that is operatively coupled to each of the processor islands, to each of the MTM islands, to the packet ingress island and to the packet egress island, wherein the configurable mesh posted transaction data bus comprises a configurable command mesh and a configurable data mesh, wherein the configurable command mesh comprises a plurality of crossbar switches and an associated plurality of links that interconnect the crossbar switches, wherein each crossbar switch of the configurable command mesh is directly coupled to at least six links that radiate outwardly in two-dimensional space from the crossbar switch, wherein the configurable data mesh comprises a plurality of crossbar switches and an associated plurality of links that interconnect the crossbar switches, wherein each crossbar switch of the configurable data mesh is directly coupled to at least six links that radiate outwardly in two-dimensional space from the crossbar switch, wherein the configurable mesh posted transaction data bus is configurable such that a plurality of commands can be communicated simultaneously across different parts of the configurable mesh posted transaction data bus, wherein each processor of the plurality of processor islands can issue a command bus transaction value onto the configurable mesh posted transaction data bus, and wherein each MTM of the plurality of MTM islands can issue a command bus transaction value onto the configurable mesh posted transaction data bus.

2. An integrated circuit comprising:
a plurality of processors;
a plurality of Multi-threaded Transactional Memories (MTMs), wherein each MTM of the plurality of MTMs includes an engine and a memory; and
a configurable mesh posted transaction data bus, wherein the configurable mesh posted transaction data bus comprises a configurable command mesh and a configurable data mesh, wherein the configurable command mesh comprises a plurality of crossbar switches and an associated plurality of links that interconnect the crossbar switches, wherein the configurable data mesh comprises a plurality of crossbar switches and an associated plurality of links that interconnect the crossbar switches, wherein the configurable mesh posted transaction data bus is configurable such that a plurality of commands can be communicated simultaneously across different parts of the configurable mesh posted transaction data bus, wherein a command bus transaction value issued by one of the processors of the plurality of processors can pass across the configurable command mesh and to an MTM of the plurality of MTMs, wherein the command bus transaction value includes a reference value, wherein the MTM uses the reference value to initiate a pull of data across the configurable data mesh and to the MTM, wherein the MTM uses the data to perform an operation, wherein each processor of the plurality of processors can issue a command bus transaction value onto the configurable mesh posted transaction data bus, and wherein each MTM of the plurality of MTMs can issue a command bus transaction value onto the configurable mesh posted transaction data bus.

3. The integrated circuit of claim 2, wherein the processor that issued the command bus transaction value uses the reference value received back from the MTM as a pull-id flag to identify a processor operation that initiated the issuing of the command bus transaction value.

4. The integrated circuit of claim 2, wherein each link comprises a first link portion for communicating data in a first direction across the link and further comprises a second link portion for communicating data in a second direction opposite the first direction across the link, and wherein each link portion comprises a distributed credit First-In-First-Out (FIFO) structure that receives push signals from a first circuit at a first end of the distributed credit FIFO structure and receives taken signals from a second circuit at a second end of the distributed credit FIFO structure.

5. The integrated circuit of claim 2, wherein each link comprises a first link portion and a second link portion, wherein the first link portion includes a chain of sequential logic elements for communicating data in a first direction across the link, and wherein the second link portion includes a chain of sequential logic elements for communicating data in a second direction opposite the first direction across the link, wherein all the sequential logic elements of the chain of a link portion are clocked by a common clock signal.

6. The integrated circuit of claim 2, wherein each crossbar switch of the configurable command mesh stores configuration information, wherein the configuration information determines how the crossbar switch routes command bus transaction values passing through the crossbar switch, wherein each command bus transaction value carries information that is used by the crossbar switches through which the command bus transaction value passes to route the command bus transaction value.

7. The integrated circuit of claim 2, wherein a command bus transaction value travels across a first link portion of a first link L1 of the configurable command mesh from a first crossbar switch CB1 to a second crossbar switch CB2, wherein the first crossbar switch CB1 is a part of a first rectangular island I1 of the integrated circuit, wherein the second crossbar switch CB2 is a part of a second rectangular island I2 of the integrated circuit, wherein the command bus transaction value includes a final destination portion, wherein a Look Up Table (LUT) circuit in the second crossbar switch CB2 receives the final destination portion and outputs a corresponding lookup value, wherein the corresponding lookup value determines another link portion to which CB2 couples the first link portion such that the command bus transaction value travels out of the second rectangular island I2 across the another link portion.

8. The integrated circuit of claim 2, wherein some of the links of the configurable command mesh are oriented to be collinear with respect to one another and to extend in a first direction, wherein others of the links of the configurable command mesh are oriented to be collinear with respect to one another and to extend in a second direction, wherein the first and second directions are not perpendicular to one another, and wherein the first and second directions are not parallel to one another.

9. The integrated circuit of claim 2, wherein the engine is a lookup engine, wherein the operation performed by the MTM is a lookup operation, wherein the MTM uses the data to generate a data result, and wherein the MTM completes the lookup operation by pushing the data result from the MTM across the configurable data mesh.

10. The integrated circuit of claim 2, wherein each crossbar switch of the configurable command mesh is directly coupled to at least six links that radiate outwardly in two-dimensional space from the crossbar switch.

11. The integrated circuit of claim 2, wherein none of the MTMs includes any processor that fetches instructions from a memory, decodes the instructions, and executes the instructions.

12. The integrated circuit of claim 2, wherein the integrated circuit comprises a plurality of functional circuits, wherein the configurable mesh posted transaction data bus is configurable such that a first command bus transaction value can pass from a first functional circuit to a second functional circuit through a first path of the configurable mesh posted transaction data bus and such that a second command bus transaction value can pass from a third functional circuit to a fourth functional circuit through a second path of the configurable mesh posted transaction data bus, and wherein the first command bus transaction value can travel through the first path at the same time that the second command bus transaction value travels through the second path.

13. The integrated circuit of claim 12, wherein the first functional circuit includes a first processor of the plurality of processors, wherein the second functional circuit includes a first MTM of the plurality of MTMs, wherein the third functional circuit includes a second processor of the plurality of processors, wherein the fourth functional circuit includes a second MTM of the plurality of MTMs.

14. The integrated circuit of claim 2, wherein each crossbar switch of the configurable command mesh is coupled to a corresponding functional circuit of the integrated circuit, wherein each functional circuit is part of a corresponding one of a plurality of rectangular islands, wherein some of the rectangular islands that include a functional circuit coupled to a crossbar switch are disposed in a first row, wherein others of the rectangular islands that include a functional circuit coupled to a crossbar switch are disposed in a second row, and wherein others of the rectangular islands that include a functional circuit coupled to a crossbar switch are disposed in a third row.

15. The integrated circuit of claim 2, wherein at least two of the MTMs of the plurality of MTMs are substantially structurally identical, wherein the engine of one of the at least two MTMs comprises a state machine selector circuit, a plurality of state machines, and a pipeline, wherein a command is received onto the MTM from the configurable mesh posted transaction data bus, and wherein the state machine selector circuit then allocates execution of the command to a selected one of the plurality of state machines such that the selected state machine then interacts with the pipeline to carry out the command.

16. An integrated circuit comprising:
a plurality of processor islands, wherein each of the processor islands is of identical rectangular shape, wherein each processor island comprises a processor;
a plurality of Multi-threaded Transactional Memory (MTM) islands, wherein each of the MTM islands is of identical rectangular shape, wherein each MTM island comprises an MTM; and
a configurable mesh posted transaction data bus, wherein the configurable mesh posted transaction data bus comprises a configurable command mesh and a configurable data mesh, wherein the configurable command mesh comprises a plurality of crossbar switches and an associated plurality of links that interconnect the crossbar switches, wherein the configurable data mesh comprises a plurality of crossbar switches and an associated plurality of links that interconnect the crossbar switches, wherein the configurable mesh posted transaction data bus is configurable such that a plurality of commands can be communicated simultaneously across different parts of the configurable mesh posted transaction data bus, wherein each processor of the plurality of processor islands can issue a command bus transaction value onto the configurable mesh posted transaction data bus, and wherein each MTM of the plurality of MTM islands can issue a command bus transaction value onto the configurable mesh posted transaction data bus.

17. The integrated circuit of claim 16, wherein each link comprises a first link portion and a second link portion, wherein the first link portion includes a chain of sequential logic elements for communicating data in a first direction across the link, and wherein the second link portion includes a chain of sequential logic elements for communicating data in a second direction opposite the first direction across the link, and wherein all the sequential logic elements of the chain of a link portion are clocked by a common clock signal.

18. The integrated circuit of claim 16, wherein each link comprises a first link portion for communicating data in a first direction across the link and further comprises a second link portion for communicating data in a second direction opposite the first direction across the link, and wherein each link portion comprises a distributed credit First-In-First-Out (FIFO) structure that receives push signals from a first circuit at a first end of the distributed credit FIFO structure and receives taken signals from a second circuit at a second end of the distributed credit FIFO structure.

19. The integrated circuit of claim 16, wherein each of the links of the configurable command mesh extends in a substantially straight line, wherein some of the links of the configurable command mesh are oriented to be collinear with respect to one another and to extend in a first direction, wherein others of the links of the configurable command mesh are oriented to be collinear with respect to one another and to extend in a second direction, wherein the first and second directions are not perpendicular to one another, and wherein the first and second directions are not parallel to one another.

20. The integrated circuit of claim 16, wherein a command bus transaction value travels across a first link portion of a first link L1 of the configurable command mesh from a first crossbar switch CB1 to a second crossbar switch CB2, wherein the first crossbar switch CB1 is a part of a first island I1, wherein the second crossbar switch CB2 is a part of a second island I2, wherein the command bus transaction value includes a final destination portion, wherein a Look Up Table (LUT) circuit in the second crossbar switch CB2 receives the final destination portion and outputs a corresponding lookup value, wherein the corresponding lookup value determines another link portion to which CB2 couples the first link portion such that the command bus transaction value travels out of the second island I2 across the another link portion.

* * * * *